(12) United States Patent
Kawamonzen

(10) Patent No.: US 6,183,934 B1
(45) Date of Patent: Feb. 6, 2001

(54) NEGATIVE PHOTOSENSITIVE RESIN COMPOSITION, METHOD OF FORMING A PATTERN AND ELECTRONIC PARTS

(75) Inventor: Yoshiaki Kawamonzen, Kawasaki (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/108,178

(22) Filed: Jul. 1, 1998

(30) Foreign Application Priority Data

Jul. 1, 1997 (JP) .................................... 9-175821
Jun. 29, 1998 (JP) ................................... 10-182961

(51) Int. Cl.$^7$ .................................... G03F 7/004
(52) U.S. Cl. ..................... 430/270.1; 430/916; 430/919; 430/920; 430/325
(58) Field of Search ............................. 430/270.1, 916, 430/919, 920, 325

(56) References Cited

U.S. PATENT DOCUMENTS

| | | | |
|---|---|---|---|
| 4,451,551 | * 5/1984 | Kataoka et al. | 430/920 |
| 5,585,217 | 12/1996 | Oba | 430/191 |
| 5,756,650 | * 5/1998 | Kawamonzen et al. | 430/192 |
| 6,001,517 | * 12/1999 | Kawamonzen et al. | 430/18 |

FOREIGN PATENT DOCUMENTS 0 475 086   3/1992   (EP) .
2-50161     2/1990   (JP) .

OTHER PUBLICATIONS

Oba, "Effect of Curing Accelerators on Thermal Imidization of Polyamic Acids at Low Temperature," Journal of Polymer Science: Part A: Polymer Chemistry, vol. 34, (1996), pp. 651–658.

Oba, "Effect of Cure Accelerator on Imidization of Polyamic Acid at Low Temperature," Polymer Preprints, Japan, vol. 43, No. 7, (1994), pp. 2087–2088.

Kawamonzen, et al., Effect of Curing Accelerators on Thermal Imidization of Polyamic Acids at Low Temperature, Preprints of 6$^{th}$ SPSJ International Polymer Conference, (22PG5–078b), (1997), p. 306.

Oba, et al., "Synthensis and Evaluation of Positive–Acting Photosensitive Polyimides with Phenol Moiety," Journal of Applied Polymer Science, vol. 58, (1995), pp. 1535–1542.

Oba, "Synthesis and Characterization of Positive Working Photosensitive Polyimide," Polymer Preprints, Japan, vol. 42, No. 7, (1993), pp. 2691–2693.

* cited by examiner

Primary Examiner—John S. Chu
(74) Attorney, Agent, or Firm—Oblon, Spivak, McClelland, Maier & Neustadt, P.C.

(57) ABSTRACT

A negative photosensitive resin composition, which comprises a thermosetting polymer precursor which can be cured through cyclodehydration upon heating, and a photosensitive heat cure accelerator. This photosensitive heat cure accelerator may be, a compound having a protective substituent group which can be eliminated upon irradiation of light, an N-oxide compound which is capable of exhibiting a heat cure accelerating property through a transition of an oxide group thereof upon irradiation of light, or a compound which is capable of exhibiting a heat cure accelerating property through generation of an acid upon irradiation of light. Further, this photosensitive heat cure accelerator may be formed of a combination of a latent heat cure accelerator which is capable of changing into a compound exhibiting a heat cure accelerating property through a reaction with an acid and a photo-acid generating agent which is capable of generating an acid upon irradiation of light.

15 Claims, 1 Drawing Sheet

NEGATIVE PHOTOSENSITIVE RESIN COMPOSITION, METHOD OF FORMING A PATTERN AND ELECTRONIC PARTS

BACKGROUND OF THE INVENTION

This invention relates to a negative photosensitive resin composition which is suited for use in the formation of pattern of insulation film, passivation film, α-ray shielding film, optical waveguide and the like, which are employed in various electronic parts. This invention relates also to a method of forming a pattern by making use of the aforementioned negative photosensitive resin composition, and to electronic parts provided with an insulation member or protective film member comprising a patterned polymer resin film.

In the ordinary semiconductor device comprising a semiconductor substrate, the surface of the semiconductor substrate bearing semiconductor elements is generally covered with a protective film called a passivation film for the purpose of improving the reliability of the semiconductor device by protecting the semiconductor elements from any influence by the outer environment. As a material for this passivation film, polyimide resin is extensively employed in view of its excellent properties such as electric properties, e.g. insulating characteristics, radiation resistance, environmental stability and heat resistance. Furthermore, this polyimide is widely employed in a semiconductor device as an α-ray shielding film, or as an interlayer insulating film for a multilayered wiring structure or for a multilayered element structure (a multichip module).

This polyimide can be easily formed into a film from polyamic acid which is a precursor for the polyimide. Namely, a varnish of polyamic acid is coated on the surface of a predetermined substrate and then the coated layer is heated to form a film of polyamic acid, which is then heat-treated at a high temperature thereby to cause a cyclo-dehydration reaction of the polyamic acid to take place, thus curing the polyamic acid film and forming a polyimide film. It is possible, with the employment of this method, to easily form a film of polyimide in spite of the fact that polyimide can be hardly worked since it is not or hardly soluble to most of organic solvents and is high in softening point. Therefore, the aforementioned method has been widely adopted in the formation of polyimide film.

Meanwhile, in the manufacture of a semiconductor device, various workings, for example, for forming a through-hole in a multilayered wiring structure or for forming a pad for effecting an electric connection with an external lead are required. In order to carry out these workings, a polyimide film formed as a protective film (passivation film) or an interlayer insulating film as explained above is required to be patterned thereby to form holes or grooves of predetermined patterns. Generally, the patterning of polyimide film is performed by making use of PEP (photo-engraving process) using a photoresist. Namely, after a polyimide film is formed on the surface of a semiconductor substrate bearing a semiconductor element thereon by the aforementioned method, a photoresist film is formed on the surface of the polyimide film and then subjected to a light exposure process followed by a development process thereby forming a resist pattern. Then, the underlying polyimide film is selectively etched by making use of this resist pattern as an etching mask thereby to form a polyimide protective film or interlayer insulating film having a prescribed pattern.

However, the aforementioned method of forming a polyimide pattern requires two independent steps, i.e. a step of forming a polyimide film and a step of the PEP, making the method troublesome to carry out.

With a view to solve the aforementioned drawback in carrying out the method, a method of patterning a polyimide film without employing the PEP has been demanded. In response to such a demand, a resin composition comprising a polyimide precursor has been proposed.

For example, Japanese Patent Unexamined Publication S/49-115541 discloses a polyamic ester which can be obtained through a reaction between a diamino compound and tetra-carboxylic diester dichloride. Namely, according to this prior art, instead of using tetra-carboxylic dianhydride which is commonly employed in the synthesis of polyamic acid or a polyimide precursor, tetra-carboxylic diester dichloride wherein a photopolymerizable group is introduced through an ester linkage is employed. This polyamic ester exhibits a photosensitivity of negative type so that an exposed portion irradiated with light is insolubilized against a developing solution. Therefore, it is possible to carry out a patterning in the course of forming a polyimide film without requiring the conventional step of PEP whereby to obtain a patterned polyimide film.

However, not only the process of synthesizing tetra-carboxylic diester dichloride having a photopolymerizable group, which is a raw material for the polyamic ester, but also the process of synthesizing the polyamic ester are very complicated. Moreover, the end resin product to be obtained contains unavoidably chlorine ions as an impurity. Additionally, since an organic solvent is employed as a developing solution in the process of developing a polyamic ester film, a large amount of organic solvent is required in the manufacturing line, which is undesirable in viewpoints of safety, sanitation and environment. Furthermore, the polyimide film pattern to be obtained may be accompanied with a swelling of pattern due to the development with an organic solvent, thereby deteriorating the resolution of pattern.

Further, Japanese Patent Publication S/59-52822 discloses, as a photosensitive resin composition of negative type as in the case of aforementioned prior art, a heat resistant photosensitive material containing a compound having a carbon-carbon double bond which is dimerizable or polymerizable by an actinic radiation and an amino group. However, this photosensitive material is defective in that, when it is employed as a passivation film for a resin-encapsulated semiconductor device, the adhesivity thereof to a semiconductor substrate, to a passivation film formed of an inorganic material for protecting the surface of substrate, or to a sealing resin is insufficient. Therefore, the employment of this photosensitive material may invite a problem that the reliability of semiconductor device thus obtained would be deteriorated. Additionally, this photosensitive material requires the employment of an organic solvent as a developing solution as in the case of the aforementioned polyamic ester, which is undesirable in viewpoint of safety.

On the other hand, Japanese Patent Unexamined Publication S/60-6365 discloses a photosensitive resin composition wherein the carboxylic group of polyamic acid is attached with a methacrylic acid (N,N-dialkylamine) alkyl ester as a salt. However, this photosensitive resin composition is defective in that the solubility thereof to a solvent to be used is poor.

Any of these photosensitive resin compositions are featured in that the light exposure portion of polyamic acid is crosslinked via the photo-polymerizable group thereof thereby turning it insoluble to a developing solution. This crosslinking however accompanies a volumetric shrinkage of the resultant film so that the film will be markedly thinned as a result of the light exposure and development process, and hence it has been difficult to form a polyimide film pattern with a high precision.

As mentioned above, a method of forming a polyimide film pattern without any employment of a photoresist has been recently tried with a view to simplifying the manufacturing process, and as a result, a photosensitive composition exhibiting a photosensitivity through the attachment of a photopolymerizable group in the form of ester or salt to the carboxylic group of polyamic acid has been developed. However, these conventional photosensitive compositions are accompanied with problems that, due to a structural restriction of polyamic acid, the synthesis thereof is difficult or the adhesivity thereof to a substrate for example is more likely deteriorated, and that, since the polyimide film to be obtained will be markedly thinned as a result of the light exposure and development process, it is difficult to form a polyimide film pattern with a high precision.

BRIEF SUMMARY OF THE INVENTION

This invention has been accomplished in view of the aforementioned problems, and therefore the object of this invention is to solve the drawbacks of the prior art and to provide a negative photosensitive resin composition which enables to form a polyimide film pattern without requiring the employment of a photoresist. Other objects of this invention are to provide a method of forming a pattern with the employment of the aforementioned negative photosensitive resin composition and to provide electronic parts provided with a patterned polymer film formed from the aforementioned negative photosensitive resin composition.

According to this invention, there is provided a negative photosensitive resin composition, which comprises a thermosetting polymer precursor which can be cured through cyclodehydration upon heating, and a photosensitive heat cure accelerator comprising a compound having a protective substituent group which can be eliminated upon irradiation of light.

According to this invention, there is further provided a negative photosensitive resin composition, which comprises a thermosetting polymer precursor which can be cured through cyclodehydration upon heating, and a photosensitive heat cure accelerator comprising an N-oxide compound which is capable of exhibiting a heat cure accelerating property through a transition of an oxide group thereof upon irradiation of light.

According to this invention, there is further provided a negative photosensitive resin composition, which comprises a thermosetting polymer precursor which can be cured through cyclodehydration upon heating, and a photosensitive heat cure accelerator comprising a compound which is capable of exhibiting a heat cure accelerating property through generation of an acid upon irradiation of light.

According to this invention, there is further provided a negative photosensitive resin composition, which comprises a thermosetting polymer precursor which can be cured through cyclodehydration upon heating, a latent heat cure accelerator which is capable of changing into a compound exhibiting a heat cure accelerating property through a reaction with an acid, and a photo-acid generating agent which is capable of generating an acid upon irradiation of light.

According to this invention, there is further provided a method of forming a pattern, which comprises the steps of; coating the aforementioned negative photosensitive resin composition on a surface of a substrate; forming a resin layer by heat-drying the coated photosensitive resin composition at a temperature of not more than 180° C.; irradiating light onto a predetermined region of the resin layer; heat-treating the resin layer during or after the light-irradiating step at a temperature ranging from 50 to 200° C.; and developing the heat-treated resin layer by dissolving and removing portions of the resin layer which are not subjected to the light-irradiation by making use of a developing solution.

According to this invention, there is further provided electronic parts, which is provided with a polymer film functioning as an insulating film, a passivation film, an optical film or a liquid crystal orienting film, the polymer film being formed through a patterning of a layer containing the aforementioned negative photosensitive resin composition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
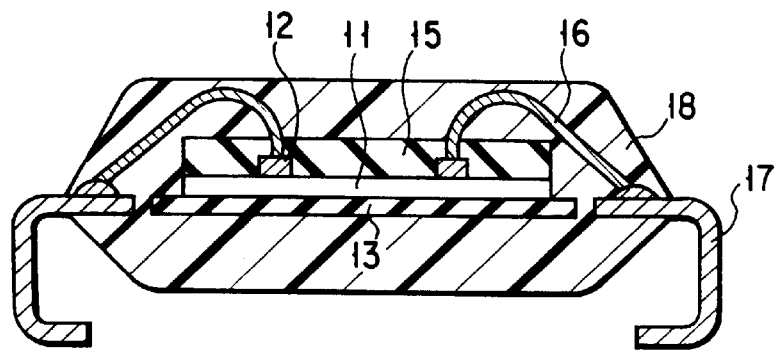
FIG. 1 is a cross-sectional view of a semiconductor element provided with a passivation film which has been obtained by patterning a film formed of a photosensitive resin composition according to this invention.

This invention will be further explained as follows.

As for the examples of the thermosetting polymer precursor which can be cured through cyclodehydration upon heating and which can be employed in a negative photosensitive resin composition of this invention, a polyimide precursor, polybenzoxazole precursor, polybenzothiazole precursor or polybenzimidazole precursor, polybenzoquinazolinedione precursor and polybenzoxadiazole precursor are useful. Particularly preferable examples among these thermosetting polymer precursors are polyimide precursors (polyamic acid) having a repeating unit represented by the following general formula (16).

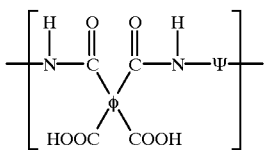

(16)

wherein φ is a quadrivalent organic group; and Ψ is a bivalent organic group.

The polyamic acid represented by the aforementioned general formula (16) can be synthesized through a reaction in an organic solvent between a tetracarboxylic dianhydride represented by the following general formula (17) and a diamine compound represented by the following general formula (18).

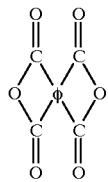

(17)

wherein φ is a quadrivalent organic group.

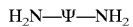

(18)

wherein Ψ is a bivalent organic group.

The quadrivalent organic group φ in the tetracarboxylic dianhydride represented by the general formula (17) may be selected from the group consisting of an aliphatic hydrocarbon group, an alicyclic hydrocarbon group, an aromatic hydrocarbon group, a heterocyclic group each having 1 to 30 carbon atoms and a polycyclic compound group wherein an aliphatic hydrocarbon group, an alicyclic hydrocarbon group, an aromatic hydrocarbon group or a heterocyclic group is mutually linked to each other directly or via a crosslinking group.

Examples of tetracarboxylic dianhydride represented by the general formula (17) are pyromellitic dianhydride, 3-fluoropyromellitic dianhydride, 3,6-difluoropyromellitic dianhydride, 3-(trifluoromethyl)pyromellitic dianhydride, 3,6-bis(trifluoromethyl)pyromellitic dianhydride, 1,2,3,4-benzenetetracarboxylic dianhydride, 3,3',4,4'-benzophenonetetracarboxylic dianhydride, 2,2',3,3'-benzophenonetetracarboxylic dianhydride, 3,3',4,4'-biphenyltetracarboxylic dianhydride, 3,3",4,4"-terphenyltetracarboxylic dianhydride, 3,3"',4,4"'-quaterphenyltetracarboxylic dianhydride, 3,3"",4,4""-quinquephenyltetracarboxylic dianhydride, 2,2',3,3'-biphenyltetracarboxylic dianhydride, methylene-4,4'-diphthalic dianhydride, 1,1-ethylidene-4,4'-diphthalic dianhydride, 2,2-propylidene-4,4'-diphthalic dianhydride, 1,2-ethylene-4,4'-diphthalic dianhydride, 1,3-trimethylene-4,4'-diphthalic dianhydride, 1,4-tetramethylene-4,4'-diphthalic dianhydride, 1,5-pentamethylene-4,4'-diphthalic dianhydride, 1,1,1,3,3,3-hexafluoro-2,2-propylidene-4,4'-diphthalic dianhydride, difluoromethylene-4,4'-diphthalic dianhydride, 1,1,2,2-tetrafluoro-1,2-ethylene-4,4'-diphthalic dianhydride, 1,1,2,2,3,3-hexafluoro-1,3-trimethylene-4,4'-diphthalic dianhydride, 1,1,2,2,3,3,4,4-octafluoro-1,4-tetramethylene-4,4'-diphthalic dianhydride, 1,1,2,2,3,3,4,4,5,5-decafluoro-1,5-pentamethylene-4,4'-diphthalic dianhydride, oxy-4,4'-diphthalic dianhydride, thio-4,4'-diphthalic dianhydride, sulfonyl-4,4'-diphthalic dianhydride, 1,3-bis(3,4-dicarboxyphenyl)benzene dianhydride, 1,3-bis(3,4-dicarboxyphenoxy)benzene dianhydride, 1,4-bis(3,4-dicarboxyphenoxy)benzene dianhydride, 1,3-bis[2-(3,4-dicarboxyphenyl)-2-propyl] benzene dianhydride, 1,4-bis[2-(3,4-dicarboxyphenyl)-2-propyl]benzene dianhydride, bis[3-(3,4-dicarboxyphenoxy)phenyl]methane dianhydride, bis[4-(3,4-dicarboxyphenoxy)phenyl]methane dianhydride, 2,2-bis[3-(3,4-dicarboxyphenoxy)phenyl]propane dianhydride, 2,2-bis[4-(3,4-dicarboxyphenoxy)phenyl]propane dianhydride, 2,2-bis[3-(3,4-dicarboxyphenoxy)phenyl]-1,1,1,3,3,3-hexafluoropropane dianhydride, 2,2-bis[4-(3,4-dicarboxyphenoxy)phenyl]-1,1,1,3,3,3-hexafluoropropane dianhydride, bis(3,4-dicarboxyphenoxy)dimethylsilane dianhydride, 1,3-bis(3,4-dicarboxyphenyl)-1,1,3,3-tetramethyldisiloxane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, ethylenetetracarboxylic dianhydride, 1,2,3,4-butane tetracarboxylic dianhydride, 1,2,3,4-cyclobutanetetracarboxylic dianhydride, cyclopentanetetracarboxylic dianhydride, cyclohexane-1,2,3,4-tetracarboxylic dianhydride, cyclohexane-1,2,4,5-tetracarboxylic dianhydride, 3,3',4,4'-bicyclohexyltetracarboxylic dianhydride, carbonyl-4,4'-bis(cyclohexane-1,2-dicarboxylic)dianhydride, methylene-4,4'-bis(cyclohexane-1,2-dicarboxylic)dianhydride, 1,2-ethylene-4,4'-bis(cyclohexane-1,2-dicarboxylic)dianhydride, 1,1-ethylidene-4,4'-bis(cyclohexane-1,2-dicarboxylic)dianhydride, 2,2-propylidene-4,4'-bis(cyclohexane-1,2-dicarboxylic)dianhydride, 1,1,1,3,3,3-hexafluoro-2,2-propylidene-4,4'-bis(cyclohexane-1,2-dicarboxylic)dianhydride, oxy-4,4'-bis(cyclohexane-1,2-dicarboxylic)dianhydride, thio-4,4'-bis(cyclohexane-1,2-dicarboxylic)dianhydride, sulfonyl-4,4'-bis(cyclohexane-1,2-dicarboxylic)dianhydride, 2,2'-difluoro-3,3',4,4'-biphenyltetracarboxylic dianhydride, 5,5'-difluoro-3,3',4,4'-biphenyltetracarboxylic dianhydride, 6,6'-difluoro-3,3',4,4'-biphenyltetracarboxylic dianhydride, 2,2',5,5',6,6'-hexafluoro-3,3',4,4'-biphenyltetracarboxylic dianhydride, 2,2'-bis(trifluoromethyl)-3,3',4,4'-biphenyltetracarboxylic dianhydride, 5,5'-bis(trifluoromethyl)-3,3',4,4'-biphenyltetracarboxylic dianhydride, 6,6'-bis(trifluoromethyl)-3,3',4,4'-biphenyltetracarboxylic dianhydride, 2,2',5,5'-tetrakis(trifluoromethyl)-3,3',4,4'-biphenyltetracarboxylic dianhydride, 2,2',6,6'-tetrakis(trifluoromethyl)-3,3',4,4'-biphenyltetracarboxylic dianhydride, 5,5',6,6'-tetrakis(trifluoromethyl)-3,3',4,4'-biphenyltetracarboxylic dianhydride, 2,2',5,5',6,6'-hexakis(trifluoromethyl)-3,3',4,4'-biphenyltetracarboxylic dianhydride, oxy-4,4'-bis(3-fluorophthalic)dianhydride, oxy-4,4'-bis(5-fluorophthalic)dianhydride, oxy-4,4'-bis(6-fluorophthalic)dianhydride, oxy-4,4'-bis(3,5,6-trifluorophthalic)dianhydride, oxy-4,4'-bis[3-(trifluoromethyl)phthalic]dianhydride, oxy-4,4'-bis[5-(trifluoromethyl)phthalic]dianhydride, oxy-4,4'-bis[6-(trifluoromethyl)phthalic]dianhydride, oxy-4,4'-bis[3,5-bis(trifluoromethyl)phthalic]dianhydride, oxy-4,4'-bis[3,6-bis(trifluoromethyl)phthalic]dianhydride, oxy-4,4'-bis[5,6-bis(trifluoromethyl)phthalic]dianhydride, oxy-4,4'-bis[3,5,6-tris(trifluoromethyl)phthalic]dianhydride, sulfonyl-4,4'-bis(3-fluorophthalic)dianhydride, sulfonyl-4,4'-bis(5- fluorophthalic)dianhydride, sulfonyl-4,4'-bis(6-fluorophthalic)dianhydride, sulfonyl-4,4'-bis(3,5,6-trifluorophthalic)dianhydride, sulfonyl-4,4'-bis[3-(trifluoromethyl)phthalic]dianhydride, sulfonyl-4,4'-bis [5-(trifluoromethyl)phthalic]dianhydride, sulfonyl-4,4'-bis[6-(trifluoromethyl)phthalic]dianhydride, sulfonyl-4,4'-bis[3,5-bis(trifluoromethyl)phthalic]dianhydride, sulfonyl-4,4'-bis [3,6-bis(trifluoromethyl)phthalic]dianhydride, sulfonyl-4,4'-bis[5,6-bis(trifluoromethyl)phthalic]dianhydride, sulfonyl-4,4'-bis[3,5,6-tris(trifluoromethyl)phthalic]dianhydride, 1,1,1,3,3,3-hexafluoro-2,2-propylidene-4,4'-bis(3-fluorophthalic)dianhydride, 1,1,1,3,3,3-hexafluoro-2,2-propylidene-4,4'-bis(5-fluorophthalic)dianhydride, 1,1,1,3,3,3-hexafluoro-2,2-propylidene-4,4'-bis(6-fluorophthalic) dianhydride, 1,1,1,3,3,3-hexafluoro-2,2-propylidene-4,4'-bis(3,5,6-trifluorophthalic)dianhydride, 1,1,1,3,3,3-hexafluoro-2,2-propylidene-4,4'-bis[3-(trifluoromethyl) phthalic]dianhydride, 1,1,1,3,3,3-hexafluoro-2,2-propylidene-4,4'-bis[5-(trifluoromethyl)phthalic] dianhydride, 1,1,1,3,3,3-hexafluoro-2,2-propylidene-4,4'-bis[6-(trifluoromethyl)phthalic]dianhydride, 1,1,1,3,3,3-hexafluoro-2,2-propylidene-4,4'-bis[3,5-bis (trifluoromethyl)phthalic]dianhydride, 1,1,1,3,3,3-hexafluoro-2,2-propylidene-4,4'-bis[3,6-bis (trifluoromethyl)phthalic]dianhydride, 1,1,1,3,3,3-hexafluoro-2,2-propylidene-4,4'-bis[5,6-bis (trifluoromethyl)phthalic]dianhydride, 1,1,1,3,3,3-hexafluoro-2,2-propylidene-4,4'-bis[3,5,6-tris (trifluoromethyl)phthalic]dianhydride, 9-phenyl-9-(trifluoromethyl)xanthene-2,3,6,7-tetracarboxylic dianhydride, 9,9-bis(trifluoromethyl)xanthene-2,3,6,7-tetracarboxylic dianhydride, and bicyclo[2,2,2]oct-7-ene-2,3,5,6-tetracarboxylic dianhydride.

These tetracarboxylic dianhydrides may be used singly or in combination of two or more kinds. The content of tetracarboxylic dianhydride should be preferably 0.8 molar equivalent or more, more preferably 0.9 molar equivalent (molar fraction) or more based on the total acid anhydride components. The reason for this is that if the content of tetracarboxylic dianhydride is less than this lower limit, the heat resistance of the polyimide resin to be obtained would be deteriorated.

The bivalent organic group Ψ in the diamine compound represented by the general formula (18) may be selected from the group consisting of an aliphatic hydrocarbon group, an alicyclic hydrocarbon group, an aromatic hydrocarbon group, a heterocyclic group each having 1 to 30 carbon atoms and a polycyclic compound group wherein an aliphatic hydrocarbon group, an alicyclic hydrocarbon group, an aromatic hydrocarbon group or a heterocyclic group is mutually linked to each other directly or via a crosslinking group.

Examples of diamine compound represented by the general formula (18) are 1,2-phenylenediamine, 1,3-phenylenediamine, 1,4-phenylenediamine, 3,3'-diaminobiphenyl, 3,4'-diaminobiphenyl, 4,4'-diaminobiphenyl, 3,3"-diaminoterphenyl, 4,4"-diaminoterphenyl, 3,3'''-diaminoquaterphenyl, 4,4'''-diaminoquaterphenyl, 3,3''''-diaminoquinquephenyl, 4,4''''-diaminoquinquephenyl, oxy-3,3'-dianiline, oxy-4,4'-dianiline, thio-3,3'-dianiline, thio-4,4'-dianiline, sulfonyl-3,3'-dianiline, sulfonyl-4,4'-dianiline, methylene-3,3'-dianiline, methylene-4,4'-dianiline, 1,2-ethylene-3,3'-dianiline, 1,2-ethylene-4,4'-dianiline, 1,1-ethylidene-3,3'-dianiline, 1,1-ethylidene-4,4'-dianiline, 1,3-propylene-3,3'-dianiline, 1,3-propylene-4,4'-dianiline, 2,2-propylidene-3,3'-dianiline, 2,2-propylidene-4,4'-dianiline, difluoromethylene-3,3'-dianiline, difluoromethylene-4,4'-dianiline, 1,1,2,2-tetrafluoro-1,2-ethylene-3,3'-dianiline, 1,1,2,2-tetrafluoro-1,2-ethylene-4,4'-dianiline, 2,2,2-trifluoro-1,1-ethylidene-3,3'-dianiline, 2,2,2-trifluoro-1,1-ethylidene-4,4'-dianiline, 1,1,1,3,3,3-hexafluoro-2,2-propylidene-3,3'-dianiline, 1,1,1,3,3,3-hexafluoro-2,2-propylidene-4,4'-dianiline, 1,1,2,2,3,3-hexafluoro-1,3-propylene-3,3'-dianiline, 1,1,2,2,3,3-hexafluoro-1,3-propylene-4,4'-dianiline, 1,3-bis(3-aminophenoxy)benzene, 1,3-bis(4-aminophenoxy)benzene, 1,3-bis(3-aminophenylthio)benzene, 1,3-bis(4-aminophenylthio) benzene, 1,3-bis(3-aminophenylsulfonyl)benzene, 1,3-bis (4-aminophenylsulfonyl)benzene, 1,3-bis[2-(3-aminophenyl)-2-propyl]benzene, 1,3-bis[2-(4-aminophenyl)-2-propyl]benzene, 1,3-bis[2-(3-aminophenyl)-1,1,1,3,3,3-hexafluoro-2-propyl]benzene, 1,3-bis[2-(4-aminophenyl)-1,1,1,3,3,3-hexafluoro-2-propyl] benzene, 1,4-bis(3-aminophenoxy)benzene, 1,4-bis(4-aminophenoxy)benzene, 1,4-bis(3-aminophenylthio) benzene, 1,4-bis(4-aminophenylthio)benzene, 1,4-bis(4-amophenylsulfonyl)benzene, 1,4-bis(4-aminophenylsulfonyl)benzene, 1,4-bis[2-(3-aminophenyl)-2-propyl]benzene, 1,4-bis[2-(4-aminophenyl)-2-propyl] benzene, 1,4-bis[2-(3-aminophenyl)-1,1,1,3,3,3-hexafluoro-2-propyl]benzene, 1,4-bis[2-(4-aminophenyl)-1,1,1,3,3,3-hexafluoro-2-propyl]benzene, 4,4'-bis(3-aminophenoxy) biphenyl, 4,4'-bis(4-aminophenoxy)biphenyl, bis[4-(3-aminophenoxy)phenyl]ether, bis[4-(4-aminophenoxy) phenyl]ether, bis[4-(3-aminophenoxy)phenyl]sulfone, bis [4-(4-aminophenoxy)phenyl]sulfone, 2,2-bis[4-(3-aminophenoxy)phenyl]propane, 2,2-bis[4-(4-aminophenoxy)phenyl]propane, 2,2-bis[4-(3-aminophenoxy)phenyl-1,1,1,3,3,3-hexafluoropropane, 2,2-bis[4-(4-aminophenoxy)phenyl-1,1,1,3,3,3-hexafluoropropane, 5-fluoro-1,3-phenylenediamine, 2-fluoro-1,4-phenylenediamine, 2,5-difluoro-1,4-phenylenediamine, 2,4,5,6-hexafluoro-1,3-phenylenediamine, 2,3,5,6-hexafluoro-1,4-phenylenediamine, 3,3'-diamino-5,5'-difluorobiphenyl, 4,4'-diamino-3,3'-difluorobiphenyl, 4,4'-diamino-3,3'-difluorobiphenyl, 3,3'-diamino-2,2',4,4',5,5',6,6'-octafluorobiphenyl, 4,4'-diamino-2,2',3,3',5,5',6,6'-octafluorobiphenyl, oxy-5,5'-bis(3-fluoroaniline), oxy-4,4'-bis(2-fluoroaniline), oxy-4,4'-bis(3-fluoroaniline), sulfonyl-5,5'-bis(3-fluoroaniline), sulfonyl-4,4'-bis(2-fluoroaniline), sulfonyl-4,4'-bis(3-fluoroaniline), 1,3-bis(3-aminophenoxy)-5-fluorobenzen, 1,3-bis(3-amino-5-fluorophenoxy)benzen, 1,3-bis(3-amino-5-fluorophenoxy)-5-fluorobenzen, 5-trifluoromethyl-1,3-phenylenediamine, 2-trifluoromethyl-1,4-phenylenediamine, 2,5-bis (trifluoromethyl)-1,4-phenylenediamine, 2,2'-bis (trifluoromethyl)-4,4'-diaminobiphenyl, 3,3'-bis (trifluoromethyl)-4,4'-diaminobiphenyl, oxy-5,5'-bis[3-(trifluoromethyl)aniline], oxy-4,4'-bis[2-(trifluoromethyl) aniline], oxy-4,4'-bis[3-(trifluoromethyl)aniline], sulfonyl-5,5'-bis[3-(trifluoromethyl)aniline], sulfonyl-4,4'-bis[2-(trifluoromethyl)aniline], sulfonyl-4,4'-bis[3-(trifluoromethyl)aniline], 1,3-bis(3-aminophenoxy)-5-(trifluoromethyl)benzene, 1,3-bis[3-amino-5-(trifluoromethyl)phenoxy]benzene, 1,3-bis[3-amino-5-(trifluoromethyl)phenoxy-5-(trifluoromethyl)benzene, 3,3'-bis(trifluoromethyl)-5,5'-diaminobiphenyl, bis(3-aminophenoxy)dimethylsilane, bis(4-aminophenoxy) dimethylsilane, 1,3-bis(3-aminophenyl)-1,1,3,3-tetramethyldisiloxane, 1,3-bis(4-aminophenyl)-1,1,3,3-tetramethyldisiloxane, methanediamine, 1,2-ethanediamine, 1,3-propanediamine, 1,4-butanediamine, 1,5- pentanediamine, 1,6-hexanediamine, 1,7-heptanediamine, 1,8-octanediamine, 1,9-nonanediamine, 1,10-decanediamine, 1,2-bis(3-aminopropoxy)ethane, 1,3-diaminocyclohexane, 1,4-diaminocyclohexane, bis(3-aminocyclohexyl)methane, bis(4-aminocyclohexyl) methane, 1,2-bis(3-aminocyclohexyl)ethane, 1,2-bis(4-aminocyclohexyl)ethane, 2,2-bis(3-aminocyclohexyl) propane, 2,2-bis(4-aminocyclohexyl)propane, bis(3-aminocyclohexyl)ether, bis(4-aminocyclohexyl)ether, bis(3-aminocyclohexyl)sulfone, bis(4-aminocyclohexyl)sulfone, 2,2-bis(3-aminocyclohexyl)-1,1,1,3,3,3-hexafluoropropane, 2,2-bis(4-aminocyclohexyl)-1,1,1,3,3,3-hexafluoropropane, 1,3-xylylenediamine, 1,4-xylylenediamine, 1,8-diaminonaphthalene, 2,7-diaminonaphthalene, 2,6-diaminonaphthalene, 2,5-diaminopyridine, 2,6-diaminopyridine, 2,5-diaminopyrazine, 2,4-diamino-s-triazine, 1,3-bis(aminomethyl)cyclohexane, 1,4-bis(aminomethyl)cyclohexane, 1,4-bis(3-aminopropyldimethylsilyl)benzene, and 1,3-bis(3-aminopropyl)-1,1,3,3-tetraphenyl disiloxane.

These diamine compounds may be used singly or in combination of two or more kinds. The content of diamine compound should be preferably 0.8 molar equivalent or more, more preferably 0.9 molar equivalent or more based on the total amine compound components. The reason for this is that if the content of diamine compound is less than this lower limit, the heat resistance of the polyimide resin to be obtained would be deteriorated.

The photosensitive resin composition of this invention may contain, in addition to a diamine compound represented by the aforementioned general formula (18), a diamine compound represented by the following general formula (19), i.e. a bis(aminoalkyl)peralkylpolysiloxane compound.

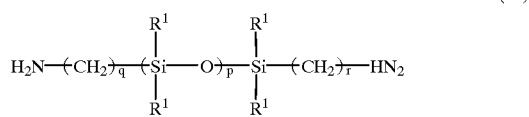

(19)

wherein $R^1$s may be the same or different and are individually alkyl group having 1 to 5 carbon atoms; q and r are integers ranging from 1 to 10; and p is a positive integer.

Examples of a bis(aminoalkyl)peralkyl polysiloxane compound represented by the aforementioned general formula (19) are 1,3-bis(aminomethyl)-1,1,3,3-tetramethyldisiloxane, 1,3-bis(2-aminoethyl)-1,1,3,3-tetramethyldisiloxane, 1,3-bis(3-aminopropyl)-1,1,3,3-tetramethyldisiloxane, 1,3-bis(4-aminobutyl)-1,1,3,3-tetramethyldisiloxane, 1,3-bis(5-aminopentyl)-1,1,3,3-tetramethyldisiloxane, 1,3-bis(6-aminohexyl)-1,1,3,3-tetramethyldisiloxane, 1,3-bis(7-aminoheptyl)-1,1,3,3-tetramethyldisiloxane, 1,3-bis(8-aminooctyl)-1,1,3,3-tetramethyldisiloxane, 1,3-bis(10-aminodecyl)-1,1,3,3-tetramethyldisiloxane, 1,5-bis(3-aminopropyl)-1,1,3,3,5,5-hexamethyltrisiloxane, 1,7-bis(3-aminopropyl)-1,1,3,3,5,5,7,7-octamethyltetrasiloxane, 1,11-bis(3-aminopropyl)-1,1,3,3,5,5,7,7,9,9,11,11-dodecamethylhexasiloxane, 1,15-bis(3-aminopropyl)-1,1,3,3,5,5,7,7,9,9,11,11,13,13,15,15-hexadecamethyloctasiloxane, and 1,19-bis(3-aminopropyl)-1,1,3,3,5,5,7,7,9,9,11,11,13,13,15,15,17,17,19,19-eicosamethyldecasiloxane.

The addition of this bis(aminoalkyl)peralkyl polysiloxane compound represented by the aforementioned general formula (19) is advantageous in improving the adhesion or bonding properties of polyimide resin to a glass substrate or a semiconductor substrate such as a silicon substrate.

However, if the content of the bis(aminoalkyl) peralkylpolysiloxane compound is excessive, the heat resistance of polyimide resin may be deteriorated. Therefore, the content of the bis(aminoalkyl)peralkylpolysiloxane compound should preferably be in the range of 0.02 to 0.2 molar equivalent, more preferably be in the range of 0.05 to 0.15 molar equivalent based on the total of diamine components.

The photosensitive resin composition of this invention may also contain, for the purpose of controlling the polymerization degree of polyamide acid, a dicarboxylic anhydride or a monoamine compound each functioning as a polymerization regulator.

Examples of such a dicarboxylic anhydride are maleic anhydride, citraconic anhydride, dimethylmaleic anhydride, ethylmaleic anhydride, diethylmaleic anhydride, propylmaleic anhydride, butylmaleic anhydride, chloromaleic anhydride, dichloromaleic anhydride, bromomaleic anhydride, dibromomaleic anhydride, fluoromaleic anhydride, difluoromaleic anhydride, trifluoromethylmaleic anhydride, bis(trifluoromethyl)maleic anhydride, cyclobutanedicarboxylic anhydride, cyclopentanedicarboxylic anhydride, cyclohexanedicarboxylic anhydride, tetrahydrophthalic anhydride, endomethylenetetrahydrophthalic anhydride, methyltetrahydrophthalic anhydride, methylendomethylenetetrahydrophthalic anhydride, phthalic anhydride, methylphthalic anhydride, ethylphthalic anhydride, dimethylphthalic anhydride, fluorophthalic anhydride, difluorophthalic anhydride, chlorophthalic anhydride, dichlorophthalic anhydride, bromophthalic anhydride, dibromophthalic anhydride, nitrophthalic anhydride, 2,3-benzophenonedicarboxylic anhydride, 3,4-benzophenonedicarboxylic anhydride, 3-phenoxyphthalic anhydride, 4-phenoxyphthalic anhydride, 3-(phenylsulfonyl)phthalic anhydride, 4-(phenylsulfonyl) phthalic anhydride, 2,3-biphenyldicarboxylic anhydride, 3,4-biphenyldicarboxylic anhydride, 1,2-naphthalenedicarboxylic anhydride, 2,3-naphthalenedicarboxylic anhydride, 1,8-naphthalenedicarboxylic anhydride, 1,2-anthracenedicarboxylic anhydride, 2,3-anthracenedicarboxylic anhydride, 1,9-anthracenedicarboxylic anhydride, 2,3-pyridinedicarboxylic anhydride, 3,4-pyridinedicarboxylic anhydride, succinic anhydride, and nadic anhydride.

Examples of the monoamine compound are methylamine, ethylamine, propylamine, butylamine, pentylamine, hexylamine, heptylamine, octylamine, 1-(3-aminopropyl)-1,1,3,3,3-pentamethyldisiloxane, vinylamine, allylamine, glycine, alanine, aminobutyric acid, valine, norvaline, isovaline, leucine, norleucine, isoleucine, glutamine, glutamic acid, tryptophan, aminocrotonic acid, aminoacetnitrile, aminopropionitrile, aminocrotononitrile, cyclopropylamine, cyclobutylamine, cyclopentylamine, cyclohexylamine, cycloheptylamine, cyclooctylamine, aminoadamantane, aminobenzocyclobutane, aminocaprolactam, aniline, chloroaniline, dichloroaniline, bromoaniline, dibromoaniline, fluoroaniline, difluoroaniline, nitroaniline, dinitroaniline, toluidine, xylidine, ethylaniline, anisidine, phenetidine, aminoacetanilide, aminoacetophenone, aminobenzoic acid, aminobenzaldehyde, aminobenzonitrile, aminophthalonitrile, aminobenzotrifluoride, aminostyrene, aminostilbene, aminoazobenzene, aminodiphenyl ether, aminodiphenyl sulfone, aminobenzamide, aminobenzensulfonamide, aminophenylmaleimide, aminophenylphthalimide, aminobiphenyl, aminoterphenyl, aminonaphthalene, aminoanthracene, aminoanthraquinone, aminofluorene, aminofluorenone, aminopyrrolidine, aminopiperazine, aminopiperidine, aminohomopiperidine, aminomorpholine, aminobenzodioxole, aminobenzodioxane, aminopyridine, aminopyridazine, aminopyrimidine, aminopyrazine, aminoquinoline, aminocinnoline, aminophthalazine, aminoquinazoline, aminoquinoxaline, aminopyrrole, aminoimidazole, aminopyrazole, aminotriazole, aminooxazol, aminoisoxazole, aminothiazole, aminoisothiazole, aminoindole, aminobenzimidazole, aminoindazole, aminobenzoxazole, aminobenzothiazole, benzylamine, phenethylamine, phenylpropylamine, phenylbutylamine, benzhydrylamine, aminoethyl-1,3-dioxolane, aminoethylpyrrolidine, aminoethylpiperazine, aminoethylpiperidine, aminoethylmorpholine, aminopropylimidazole, aminopropylcyclohexane, aminophenol, and 2-(4-aminophenyl)-2-(4-hydroxyphenyl) propane.

The mixing ratios of these dicarboxylic anhydride and monoamine compound may be optionally selected taking the end-use and viscosity into consideration. For example, these dicarboxylic anhydride and monoamine compound may be added preferably at a ratio of 0.02 to 0.4 molar equivalent based on tetracarboxylic dianhydride and diamine compounds, respectively.

As for the method of synthesizing the polyamic acid represented by the aforementioned general formula (16), there is not any particular restriction. However, it may be preferable to carry out the polymerization thereof in an organic polar solvent which is free from water and in an inert gas atmosphere.

Examples of such an organic polar solvent which may be employed in this polymerization reaction are N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphosphoric triamide, N-methyl-ε-caprolactam, N-acetyl-ε-caprolactam, 1,2-dimethoxyethane, 1,2-diethoxyethane, bis(2-methoxyethyl)ether, bis(2-ethoxyethyl)ether, 1,2-bis(2-methoxyethoxy)ethane, bis[2-(2-methoxyethoxy)ethyl]ether, 1-acetoxy-2-methoxyethane, 1-acetoxy-2-ethoxyethane, (2-acetoxyethyl)(2-methoxyethyl)ether, (2-acetoxyethyl)(2-ethoxyethyl)ether, methyl 3-methoxypropionate, tetrahydrofuran, 1,3-dioxane, 1,3-dioxolane, 1,4-dioxane, pyrroline, pyridine, picoline, dimethylsulfoxide, sulfolane, γ-butyrolactone, propylene carbonate, phenol, cresol, acetone, methylethyl ketone, methylisobutyl ketone; cyclohexanone and acetonylacetone. These organic solvents may be employed singly or in combination of two or more kinds.

The temperature of this polymerization reaction may be generally in the range of −20 to 100° C., preferably in the range of −5 to 30° C. There is any particular limitation with respect to the reaction pressure, and hence the reaction can be performed satisfactorily under the normal pressure. The reaction time depends on the kinds of tetracarboxylic dianhydride and also on the kinds of the solvent to be employed in the reaction. Generally, a time period of 1 to 24 hours may be sufficient for the reaction. The polyamic acid constituting a component of the photosensitive resin composition according to this invention can be easily synthesized without accompanying any troublesome process and without being contaminated with impurities during the manufacturing process.

The polyamic acid to be obtained in this case should preferably be 0.3 (dL/g) or more, more preferably in the range of 0.3 (dL/g) to 3.0 (dL/g) in inherent viscosity of 0.5 wt % solution of the polyamic acid in N-methyl-2-pyrrolidinone at a temperature of 30° C. The reason for this is that if the inherent viscosity of the polyamic acid is too low, i.e. if the polymerization degree of the polyamic acid is too low, it is difficult to obtain a polyimide resin having a sufficient heat resistance, whereas if the inherent viscosity of the polyamic acid is too high, i.e. if the polymerization degree of the polyamic acid is too high, the handling of it becomes difficult.

The polyamic acid to be synthesized as mentioned above may be used in the form of a solution. Alternatively, a solution of the polyamic acid may be poured into a poor solvent, such as water, methanol, ethanol, isopropyl alcohol or acetone, whereby allowing the polyamic acid to be precipitated, the polymer thus precipitated being subsequently washed and dried to obtain a solid polymer for use.

A first negative photosensitive resin composition according to this invention comprises a thermosetting polymer precursor which can be cured through cyclodehydration upon heating as mentioned above, and a photosensitive heat cure accelerator comprising a compound having a protective substituent group which can be eliminated upon irradiation of light.

Next, the photosensitive heat cure accelerator which is to be incorporated into the first negative photosensitive resin composition and is provided with the aforementioned protective substituent group will be referred to as Group A herein. Followings are explanations on this Group A.

The photosensitive heat cure accelerator of Group A can be classified into four kinds as explained below.

A first kind (aa1) of the photosensitive heat cure accelerator of Group A is a compound represented by the following general formula (1).

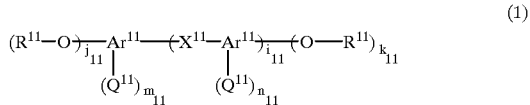

wherein $Ar^{11}$s may be the same or different and are individually a substituted or unsubstituted aromatic hydrocarbon group or a substituted or unsubstituted aromatic hetrocyclic group; $X^{11}$s may be the same or different and are individually a bivalent organic group or a single bond; $Q^{11}$ is hydroxyl group, carboxyl group, carboxyalkyl group, sulfo group, sulfoalkyl group, substituted or unsubstituted amino group, substituted or unsubstituted aminoalkyl group or mercapto group; $R^{11}$s may be the same or different and are individually a protective substituent group which can be eliminated upon irradiation of light; $i_{11}$ is an integer of 0 to 4; $j_{11}$ is an integer of 1 to 5; $k_{11}$ is an integer of 0 to 5; $m_{11}$ and $n_{11}$ are respectively an integer of 0 to 4; and a total of $j_{11}$, $k_{11}$, $m_{11}$ and $n_{11}$ is 2 or more.

Specific examples of the unsubstituted aromatic hydrocarbon group to be introduced into the aforementioned general formula (1) as the $Ar^{11}$ are benzene ring, naphthalene ring, anthracene ring, phenanthrene ring, tetralin ring, azulene ring, biphenylene ring, acenaphthylene ring, acenaphthene ring, fluorene ring, triphenylene ring, pyrene ring, chrysene ring, picene ring, perylene ring, benzopyrene ring, rubicene ring, coronene ring, ovalene ring, indene ring, pentalene ring, heptalene ring, indacene ring, phenalene ring, fluoranthene ring, acephenanthrylene ring, aceanthrylene ring, naphthacene ring, pleiadene ring, pentaphene ring, pentacene ring, tetraphenylene ring, hexaphene ring, hexacene ring, trinaphthylene ring, heptaphene ring, heptacene ring and pyranthrene ring.

Examples of a substituent group to be introduced into these aromatic hydrocarbon group so as to form a substituted aromatic hydrocarbon group are ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; oxime group (hydroxyiminomethyl, methoxyiminomethyl, ethoxyiminomethyl, hydroxyiminoethyl and hydroxyiminopropyl group); alkoxyalkyl group (hydroxymethyl, hydroxyethyl and hydroxypropyl group); cyano group; cyanato group; thiocyanato group; nitro group; nitroso group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; and organosilicic group (silyl, disilanyl, trimethylsilyl and triphenylsilyl group).

Specific examples of the unsubstituted aromatic heterocyclic group to be introduced into the aforementioned general formula (1) as the $Ar^{11}$ are pyrrole ring, indole ring, isoindole ring, carbazole ring, furan ring, coumarone ring, isobenzofuran ring, thiophene ring, benzothiophene ring, dibenzothiophene ring, oxazine ring, benzoxazine ring, phenoxazine ring, thiazine ring, benzothiazine ring, phenothiazine ring, oxadiazine ring, thiadiazine ring, benzodioxole ring, benzodioxane ring, pyrane ring, chromene ring, xanthene ring, chroman ring, isochroman ring, etc. These aromatic heterocyclic rings may be substituted by various kinds of the aforementioned characteristic group.

Specific examples of the bivalent organic group to be introduced as the $X^{11}$ into the aforementioned general formula (1) are bivalent oxy group, thio group, sulfinyl group, sufonyl group, carbonyl group, carbonyloxy group, oxycarbonyloxy group, peralkylpolysiloxanediyl group (such as 1,1,3,3-tetramethyldisiloxane-1,3-diyl, 1,1,3,3,5,5-hexamethyltrisiloxane-1,5-diyl, 1,1,3,3,5,5,7,7-octamethyltetrasiloxane-1,7-diyl, etc.), substituted or unsubstituted imino group (such as imino, methylimino, ethylimino, propylimino, phenylimino, etc.), substituted or unsubstituted aliphatic hydrocarbon group (such as methylene, ethylene, propylene, butylene, pentylene, ethylidene, propylidene, butylidene, pentylidene, vinylene, difluoromethylene, tetrafluoroethylene, hexafluoropropylene, octafluorobutylene, decafluoropentylene, trifluoroethylidene, tetrafluoroethylidene, hexafluoropropylidene, octafluorobutylidene, decafluoropentylidene, etc.), substituted or unsubstituted alkylenedioxy group (such as methylenedioxy, ethylenedioxy, propylenedioxy, butylenedioxy, pentylenedioxy, ethylidenedioxy, propylidenedioxy, butylidenedioxy, pentylidenedioxy, etc.), azo group, azoxy group and azomethine group.

Specific examples of the substituent group to be introduced as the $Q^{11}$ into the aforementioned general formula (1) are hydroxyl group, carboxyl group, carboxyalkyl group (such as carboxymethyl, carboxyethyl, carboxypropyl, etc.), sulfo group, sufoalkyl group (such as sulfomethyl, sulfoethyl, sulfopropyl, etc.), substituted or unsubstituted amino group (such as amino, methylamino, ethylamino, dimethylamino, diethylamino, acetylamino, mesylamino, hydroxyamino, etc.), substituted or unsubstituted aminoalkyl group (such as aminomethyl, aminoethyl, aminopropyl, dimethylaminomethyl, dimethylaminoethyl, dimethylaminopropyl, etc.), and mercapto group.

Specific examples of the protective substituent group which is to be introduced as the $R^{11}$ into the aforementioned general formula (1) and can be eliminated by the irradiation of light are nitro-substituted benzyl group (2-nitrobenzyl, 4-nitrobenzyl, 2,4-dinitrobenzyl group, etc.); acyl group (such as formyl, acetyl, benzoyl, nitrobenzoyl, pyridinecarbonyl, trifluoroacetyl group, etc.); acylmethyl group (such as acetonyl, phenacyl, nitrophenacyl, pyridinecarbonylmethyl, etc.); substituted or unsubstituted alkoxycarbonyl group (such as benzyloxycarbonyl, 2-phenylisopropoxycarbonyl, 2-nitrobenzyloxycarbonyl, 4-nitrobenzyloxycarbonyl, 2,4-dinitrobenzyloxycarbonyl, 2-cyanomethylisopropoxycarbonyl, 2-methylsulfonylisopropoxycarbonyl group, etc.); sulfonyl group (such as mesyl, phenylsulfonyl, tosyl, pyridylsulfonyl, trifluoromethylsulfonyl, diazophenolsulfonyl, diazonaphtholsulfonyl group, etc.); and sulfonylmethyl group (such as phenylsulfonylmethyl, tosylmethyl, pyridylsulfonylmethyl, trifluoromethylsulfonylmethyl group, etc.).

A second kind (aa2) of the photosensitive heat cure accelerator of Group A is consisted of a nitrogen-containing hetrocyclic ketone compound having a protective substituent group which can be eliminated upon irradiation of light and substitutes for at least one cyclic imino group (>N—H). Specific examples of such a compound whose at least one cyclic imino group (>N—H) is protected by a protecting group are substituted or unsubstituted, or ring-fused or unfused imidazolone, imidazolinedion, pyrazolone, pyrazolinedione, thiazolone, thiazolinedione, pyridone, pyridazinone, pyridazinedione, pyrimidinone, pyrimidinedione, pyrazinone and pyrazinedione.

Examples of unsubstituted nitrogen-containing hetrocyclic ketone compound are 2-imidazolone, 5-imidazolone, 2-benzimidazolone, 2,4-imidazolinedion, 3-pyrazolone, 5-pyrazolone, 3,5-pyrazolinedione, 3-indazolone, 2-thiazolone, 2-benzothiazolone, 2-pyridone, 4-pyridone, 2-quinolone, 4-quinolone, 1-isoquinolone, 3-isoquinolone, 9-acridinone, 6-phenanthridinone, 3-pyridazinone, 4-pyridazinone, 3,6-pyridazinedione, 3-cinnolinone, 4-cinnolinone, 1-phthaladinone, 1,4-phthaladinedione, 2-pyrimidinone, 4-pyrimidinone, uracil, barbituric acid, 2-quinazolinone, 4-quinazolinone, 2,4-quinazolinedione, 2-pyrazinone, 2,4-pyrazinedione, 2-quinoxalinone and 2,3-quinoxalinedione.

As for the characteristic group that is to be introduced into these unsubstituted nitrogen-containing heterocyclic ketone compounds thereby to form a substituted nitrogen-containing heterocyclic ketone compound, it is possible to employ the following groups, i.e. di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anicidino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pyrazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; hydroxyamino group; ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; oxime group (hydroxyiminomethyl, methoxyiminomethyl, ethoxyiminomethyl, hydroxyiminoethyl, hydroxyiminopropyl group, etc.); hydroxyl group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); alkoxyalkyl group (hydroxymethyl, hydroxyethyl and hydroxypropyl group); cyano group; cyanato group; thiocyanato group; nitro group; nitroso group; mercapto group; halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfino group and the salts thereof; sulfo group and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; organosilicic group (silyl, disilanyl, trimethylsilyl and triphenylsilyl group).

As for the protective substituent group which can be eliminated upon irradiation of light and is capable of substituting at least one cyclic imino group (>N—H) of the aforementioned substituted or unsubstituted nitrogen-containing heterocyclic ketone compound, it is possible to employ nitro-substituted benzyl group (2-nitrobenzyl, 4-nitrobenzyl, 2,4-dinitrobenzyl group, etc.); acyl group (such as formyl, acetyl, benzoyl, nitrobenzoyl, pyridinecarbonyl, trifluoroacetyl group, etc.); acylmethyl group (such as acetonyl, phenacyl, nitrophenacyl, pyridinecarbonylmethyl, etc.); substituted or unsubstituted alkoxycarbonyl group (such as benzyloxycarbonyl, 2-phenylisopropoxycarbonyl, 2-nitrobenzyloxycarbonyl, 4-nitrobenzyloxycarbonyl, 2,4-dinitrobenzyloxycarbonyl, 2-cyanomethylisopropoxycarbonyl, 2-methylsulfonylisopropoxycarbonyl group, etc.); sulfonyl group (such as mesyl, phenylsulfonyl, tosyl, pyridylsulfonyl, trifluoromethylsulfonyl, diazophenolsulfonyl, diazonaphtholsulfonyl group, etc.); and sulfonylmethyl group (such as phenylsulfonylmethyl, tosylmethyl, pyridylsulfonylmethyl, trifluoromethylsulfonylmethyl group, etc.).

A third kind (aa3) of the photosensitive heat cure accelerator of Group A is a compound represented by the following general formula (2).

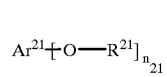

(2)

wherein $Ar^{21}$ is a substituted or unsubstituted nitrogen-containing aromatic heterocyclic group having a pyridine type nucleus nitrogen atom; $R^{21}$s may be the same or different and are individually a protective substituent group which can be eliminated upon irradiation of light; $n_{21}$ is an integer of 1 to 5.

Specific examples of the unsubstituted nitrogen-containing aromatic heterocyclic group to be introduced into the aforementioned general formula (2) as the $Ar^{21}$ are pyridine ring, quinoline ring, isoquinoline ring, phenanthridine ring, benzoquinoline ring, pyridazine ring, phthalazine ring, cinnoline ring, pyrimidine ring, quinazoline ring, pyrazine ring, quinoxaline ring, 1,3,5-triazine ring, 1,2,4,5-tetrazine ring, imidazole ring, benzimidazole ring, naphthimidazole ring, pyrazole ring, indazole ring, oxazole ring, benzoxazole ring, naphthoxazole ring, isoxazole ring, benzisoxazole ring, thiazole ring, benzothiazole ring, naphthothiazole ring, selenazole ring, benzoselenazole ring, tetrazole ring, benzotetrazole ring, 1,2,3-triazole ring, 1,2,4-triazole ring, 1,2,3,5-tetrazole ring and naphthylidine ring.

As for the characteristic group that is to be introduced into these unsubstituted nitrogen-containing aromatic heterocyclic compound thereby to form a substituted nitrogen-containing aromatic heterocyclic compound, it is possible to employ the same kinds of characteristic group that can be introduced into the unsubstituted nitrogen-containing heterocyclic ketone compounds in the aforementioned (aa2).

As for the protective substituent group which can be eliminated upon irradiation of light and is to be introduced as the $R^{21}$ into the aforementioned general formula (2), it is possible to employ nitro-substituted benzyl group (2-nitrobenzyl, 4-nitrobenzyl, 2,4-dinitrobenzyl group, etc.); acyl group (such as formyl, acetyl, benzoyl, nitrobenzoyl, pyridinecarbonyl, trifluoroacetyl group, etc.); acylmethyl group (such as acetonyl, phenacyl, nitrophenacyl, pyridinecarbonylmethyl, etc.); substituted or unsubstituted alkoxycarbonyl group (such as benzyloxycarbonyl, 2-phenylisopropoxycarbonyl, 2-nitrobenzyloxycarbonyl, 4-nitrobenzyloxycarbonyl, 2,4-dinitrobenzyloxycarbonyl, 2-cyanomethylisopropoxycarbonyl, 2-methylsulfonylisopropoxycarbonyl group, etc.); sulfonyl group (such as mesyl, phenylsulfonyl, tosyl, pyridylsulfonyl, trifluoromethylsulfonyl, diazophenolsulfonyl, diazonaphtholsulfonyl group, etc.); and sulfonylmethyl group (such as phenylsulfonylmethyl, tosylmethyl, pyridylsulfonylmethyl, trifluoromethylsulfonylmethyl group, etc.).

A fourth kind (aa4) of the photosensitive heat cure accelerator of Group A is consisted of a nitrogen-containing hetrocyclic compound having a protective substituent group which can be eliminated upon irradiation of light and substitutes for at least one N-hydroxyl group (>N—OH) of an N-hydroxyl nitrogen-containing heterocyclic ketone compound. The N-hydroxyl nitrogen-containing heterocyclic ketone compound to be employed herein may be a substituted or unsubstituted, or ring-fused or unfused compound. For example, it is possible to employ N-hydroxypyridone, N-hydroxypyridazinone, N-hydroxypyridazinedione, N,N'-dihydroxypyridazinedione, N-hydroxypyrimidinone, N-hydroxypyrimidinedione, N,N'-dihydroxypyrimidinedione, N-hydroxypyrazinone, N-hydroxypyrazinedione, N,N'-dihydroxypyrazinedione, N-hydroxymaleimide, N-hydroxysuccinimide, N-hydroxynadicimide, etc.

As for the unsubstituted nitrogen-containing heterocyclic compound, it is possible to employ, for example, N-hydroxy-2-pyridone, N-hydroxy-4-pyridone, N-hydroxy-2-quinolone, N-hydroxy-4-quinolone, N-hydroxy-1-isoquinolone, N-hydroxy-3-isoquinolone, N-hydroxy-9-acridinone, N-hydroxy-6-phenanthridinone, N-hydroxy-3-pyridazinone, N-hydroxy-4-pyridazinone, N-hydroxy-3,6-pyridazinedione, N,N'-dihydroxy-3,6-pyridazinedione, N-hydroxy-3-cinnolinone, N-hydroxy-4-cinnolinone, N-hydroxy-1-phthaladinone, N-hydroxy-1,4-phthaladinedione, N,N'-dihydroxy-1,4-phthaladinedione, N-hydroxy-2-pyrimidinone, N-hydroxy-4-pyrimidinone, N-hydroxy-2,4-pyrimidinedione, N,N'-dihydroxy-2,4-pyrimidinedione, N-hydroxy-2-quinazolinone, N-hydroxy-4-quinazolinone, N-hydroxy-2,4-quinazolinedione, N,N'-dihydroxy-2,4-quinazolinedione, N-hydroxy-2-pyrazinone, N-hydroxy-2,4-pyrazinedione, N,N'-dihydroxy-2,4-pyrazinedione, N-hydroxy-2-quinoxalineone N-hydroxy-2,3-quinoxalinedione, N,N'-dihydroxy-2,3-quinoxalinedione, N-hydroxymaleimide, N-hydroxysuccinimide, N-hydroxynadicimide, N-hydroxyphthalimide, N-hydroxynaphthalene-1,2-dicarboxyimide, N-hydroxynaphthalene-2,3-dicarboxyimide, N,N'-dihydroxy pyromellitic diimide, N,3-dihydroxyphthalimide, N,4-dihydroxyphthalimide, N,N'-dihydroxybiphenyl-3,3',4,4'-tetracarboxydiimide, oxy-4,4'-bis(N-hydroxyphthalimide), sulfonyl-4,4'-bis(N-hydroxyphthalimide), carbonyl-4,4'-bis(N-hydroxyphthalimide), methylene-4,4'-bis(N-hydroxyphthalimide), 2,2-propylidene-4,4'-bis(N-hydroxyphthalimide), 1,1,1,3,3,3-hexafluoro-2,2-propylidene-4,4'-bis(N-hydroxyphthalimide), N-hydroxycyclohexane-1,2-dicarboxyimide, N,N'-dihydroxycyclohexane-1,2,4,5-tetracarboxydiimide, N-hydroxyendomethylene tetrahydrophthalimide, and N,N'-dihydroxybicyclo[2,2,2]oct-7-en-2,3,5,6-tetracarboxydiimide.

As for the characteristic group that is to be introduced into these unsubstituted N-hydroxy nitrogen-containing heterocyclic ketone compounds thereby to form a substituted nitrogen-containing N-hydroxy nitrogen-containing heterocyclic ketone compound, it is possible to employ the same kinds of characteristic group that can be introduced into the unsubstituted nitrogen-containing heterocyclic ketone compounds in the aforementioned (aa2).

As for the protective substituent group which can be eliminated upon irradiation of light and is capable of protecting at least one N-hydroxyl group (>N—OH) of an N-hydroxyl nitrogen-containing heterocyclic ketone compound, it is possible to employ nitro-substituted benzyl group (2-nitrobenzyl, 4-nitrobenzyl, 2,4-dinitrobenzyl group, etc.); acyl group (such as formyl, acetyl, benzoyl, nitrobenzoyl, pyridinecarbonyl, trifluoroacetyl group, etc.); acylmethyl group (such as acetonyl, phenacyl, nitrophenacyl, pyridinecarbonylmethyl, etc.); substituted or unsubstituted alkoxycarbonyl group (such as benzyloxycarbonyl, 2-phenylisopropoxycarbonyl, 2-nitrobenzyloxycarbonyl, 4-nitrobenzyloxycarbonyl, 2,4-dinitrobenzyloxycarbonyl, 2-cyanomethylisopropoxycarbonyl, 2-methylsulfonylisopropoxycarbonyl group, etc.); sulfonyl group (such as mesyl, phenylsulfonyl, tosyl, pyridylsulfonyl, trifluoromethylsulfonyl, diazophenolsulfonyl, diazonaphtholsulfonyl group, etc.); and sulfonylmethyl group (such as phenylsulfonylmethyl, tosylmethyl, pyridylsulfonylmethyl, trifluoromethylsulfonylmethyl group, etc.).

In the case of the compounds constituting the photosensitive heat cure accelerating agent of Group A, since the hydroxyl group or imino group thereof is blocked by a protective substituent group which can be eliminated upon irradiation of light, it is substantially not provided with heat cure accelerating property (cyclodehydration reaction-accelerating property). However, this photosensitive heat cure accelerating agent is designed such that when it is irradiated with light, the protective substituent group is eliminated whereby exhibiting a heat cure accelerating property (cyclodehydration reaction-accelerating property).

These photosensitive heat cure accelerating agents are designed to be added to a solution of a thermosetting polymer precursor such as a polyimide precursor (polyamic acid), which is designed to be heat cured through a cyclodehydration, whereby obtaining a negative photosensitive resin composition which is capable of forming a fine pattern through a sequence of process comprising coating, exposure, PEB (post exposure bake) and developing steps.

These photosensitive heat cure accelerators may be employed singly or in combination of two or more kinds at a mixing ratio falling within the range of not less than 0.1 molar equivalent, more preferably in the range of 0.1 to 4.0 molar equivalent, and most preferably in the range of 0.1 to 2 molar equivalent per molar equivalent of repeating unit of a thermosetting polymer. The reason for limiting the range of mixing ratio of the photosensitive heat cure accelerator is as follows. Namely, if the mixing ratio of this heat cure accelerator is less than the lower limit, the photo-sensitivity of a layer of the resultant resin may be insufficient, thereby failing to obtain a sufficient resolution, whereas if the mixing ratio of this heat cure accelerator exceeds over the upper limit, a prominent thinning of the film may be resulted so that it would be difficult to form a clear thin film.

A second negative photosensitive resin composition according to this invention comprises a thermosetting polymer precursor which can be cured through cyclodehydration upon heating as mentioned above, and a photosensitive heat cure accelerator comprising an N-oxide compound which is capable of exhibiting a heat cure accelerating property through a transition of an oxide group thereof upon irradiation of light.

Next, the photosensitive heat cure accelerator which is formed of an N-oxide compound capable of exhibiting a heat cure accelerating property through a transition of an oxide group thereof upon irradiation of light and is to be incorporated into the second negative photosensitive resin composition will be referred to as Group B herein. Followings are explanations on this Group B.

The photosensitive heat cure accelerator of Group B can be classified into two kinds as explained below.

A first kind (PS1) of the photosensitive heat cure accelerator of Group B is an N-oxide compound of a substituted or unsubstituted nitrogen-containing aromatic heterocyclic compound having a pyridine type nucleus nitrogen atom (=N—) shown below.

Specific examples of the N-oxide compound of the unsubstituted nitrogen-containing aromatic heterocyclic compound are pyridine-N-oxide, quinoline-N-oxide, isoquinoline-N-oxide, dipyridyl-N-oxide, dipyridyl-N,N'-dioxide, diquinolyl-N-oxide, diquinolyl-N,N'-dioxide, diisoquinolyl-N-oxide, diisoquinolyl-N,N'-dioxide, phenanthridine-N-oxide, acridine-N-oxide, benzoquinoline-N-oxide, phenanthroline-N-oxide, phenanthroline-N,N'-dioxide, pyridazine-N-oxide, pyridazine-N,N'-dioxide, pyrimidine-N-oxide, pyrimidine-N,N'-dioxide, pyrazine-N-oxide, pyrazine-N,N'-dioxide, phthalazine-N-oxide, phthalazine-N,N'-dioxide, cinnoline-N-oxide, cinnoline-N,N'-dioxide, quinazoline-N-oxide, quinazoline-N,N'-dioxide, quinoxaline-N-oxide, quinoxaline-N,N'-dioxide, naphthylidine-N-oxide, naphthylidine-N,N'-dioxide, phenazine-N-oxide, phenazine-N,N'-dioxide, oxazole-N-oxide, benzoxazole-N-oxide, thiazole-N-oxide, benzothiazole-N-oxide, imidazole-N-oxide, imidazole-N,N'-dioxide, benzimidazole-N-oxide, benzimidazole-N,N'-dioxide, pyrazole-N-oxide, pyrazole-N,N'-dioxide, indazole-N-oxide and indazole-N,N'-dioxide.

As for the characteristic group that is to be introduced into the N-oxide compound of the unsubstituted nitrogen-containing aromatic heterocyclic compound thereby to form the N-oxide compound of the substituted nitrogen-containing aromatic heterocyclic compound, it is possible to employ the same kinds of characteristic group that can be introduced into the unsubstituted nitrogen-containing heterocyclic ketone compounds in the aforementioned (aa2).

In the case of the N-oxide compounds of the aforementioned (PS1), since the nucleus nitrogen atom is blocked by the oxido group, it is substantially not provided with heat cure accelerating property (cyclodehydration reaction-accelerating property) under a non-exposure condition. However, this photosensitive heat cure accelerating agent is designed such that when it is irradiated with light, the N-oxido group thereof is transferred to the neighboring nucleus carbon atom whereby it is changed into a nitrogen-containing aromatic heterocyclic compound having a hydroxyl group, thus exhibiting a heat cure accelerating property (cyclodehydration reaction-accelerating property). For example, quinoline-N-oxide is changed into 2-hydroxyquinoline as it is irradiated with light, thus exhibiting a heat cure accelerating property.

A second kind (PS2) of the photosensitive heat cure accelerator of Group B is a compound represented by the following general formula (3).

(3)

wherein $Ar^{31}$ is a cyclic group selected from the group consisting of pyridine ring, quinoline ring, isoquinoline ring, pyridazine ring, phthalazine ring, cinnoline ring, pyrimidine ring, quinazoline ring, pyrazine ring, quinoxaline ring, 1,3,5-triazine ring, 1,2,4,5-tetrazine ring, pyrazole ring, indazole ring, oxazole ring, benzoxazole ring, thiazole ring, benzothiazole ring, 1,2,3-triazole ring, 1,2,4-triazole ring, benzotriazole ring, 1,2,3,5-tetrazole ring and julolidine ring; or a group which is substituted by at least one group selected from hydroxyl, mercapto, substituted or unsubstituted amino, and substituted or unsubstituted aminoalkyl, said group being selected from the group consisting of benzene ring, naphthalene ring, anthracene ring, phenanthrene ring, biphenyl ring, pyrrole ring, indole ring, isoindole ring, carbazole ring, furan ring, coumarone ring, isobenzofuran ring, thiophene ring, benzothiophene ring, dibenzothiophene ring, oxazine ring, benzoxazine ring, phenoxazine ring, thiazine ring, benzothiazine ring, phenothiazine ring, oxadiazine ring, thiadiazine ring, benzodioxole ring, benzodioxane ring, pyrane ring, chromene ring, xanthene ring, chroman ring and isochroman ring; and $R^{31}$ is a aliphatic hydrocarbond group, an alicyclic hydrocarbon group, an aromatic hydrocarbon group or a heterocyclic group, each being substituted or unsubstituted group and having 1 to 30 carbon atoms.

Specific examples of these substituted or unsubstituted aliphatic hydrocarbond group, alicyclic hydrocarbon group, aromatic hydrocarbon group and heterocyclic group to be introduced as the $R^{31}$ in the aforementioned general formula (3) are methyl, ethyl, propyl, isopropyl, butyl, isobutyl, sec-butyl, tert-butyl, pentyl, tert-pentyl, isopentyl, neopentyl, hexyl, vinyl, allyl, isopropenyl, propenyl, methallyl, crotyl, butenyl, pentenyl, butadienyl, ethynyl, propynyl, butynyl, pentynyl, cyclopropyl, cyclobutyl, cyclopentyl, cyclohexyl, cycloheptyl, cyclooctyl, cyclopentenyl, cyclohexenyl, cycloheptenyl, cyclooctenyl, cyclopentadienyl, cyclohexadienyl, benzene ring, naphthalene ring, anthracene ring, phenanthrene ring, biphenyl ring, pyrrole ring, indole ring, isoindole ring, carbazole ring, furan ring, coumarone ring, isobenzofuran ring, thiophene ring, benzothiophene ring, dibenzothiophene ring, oxazine ring, benzoxazine ring, phenoxazine ring, thiazine ring, benzothiazine ring, phenothiazine ring, oxadiazine ring, thiadiazine ring, benzodioxole ring, benzodioxane ring, pyrane ring, chromene ring, xanthene ring, chroman ring, isochroman ring, pyrrolidine ring, imidazolidine ring, oxazolidine ring, thiazolidine ring, piperazine ring, piperidine ring and morpholine ring.

Specific examples of unsubstituted N-oxide compound that can be represented by the aforementioned general formula (3) are α-(pyridyl)-N-methylnitrone, α-(pyridyl)-N-(tert.-butyl)nitrone, α-(pyridyl)-N-phenylnitrone, α-(pyridazinyl)-N-methylnitrone, α-(pyridazinyl)-N-(tert.-butyl)nitrone, α-(pyridazinyl)-N-phenylnitrone, α-(pyrimidinyl)-N-methylnitrone, α-(pyrimidinyl)-N-(tert.-butyl)nitrone, α-(pyrimidinyl)-N-phenylnitrone, α-(pyrazinyl)-N-methylnitrone, α-(pyrazinyl)-N-(tert.-butyl)nitrone, α-(pyrazinyl)-N-phenylnitrone, α-(quinolyl)-N-methylnitrone, α-(quinolyl)-N-(tert.-butyl)nitrone, α-(quinolyl)-N-phenylnitrone, α-(thiazolyl)-N-methylnitrone, α-(thiazolyl)-N-(tert.-butyl)nitrone, α-(thiazolyl)-N-phenylnitrone, α-(benzothiazolyl)-N-methylnitrone, α-(benzothiazolyl)-N-(tert.-butyl)nitrone, α-(benzothiazolyl)-N-phenylnitrone, α-(julolidinyl)-N-methylnitrone, α-(julolidinyl)-N-(tert.-butyl)nitrone, α-(julolidinyl)-N-phenylnitrone, α-(hydroxyphenyl)-N-methylnitrone, α-(hydroxyphenyl)-N-(tert.-butyl)nitrone, α-(hydroxyphenyl)-N-phenylnitrone, α-(dihydroxyphenyl)-N-methylnitrone, α-(dihydroxyphenyl)-N-(tert.-butyl)nitrone, α-(dihydroxyphenyl)-N-phenylnitrone, α-(hydroxymethoxyphenyl)-N-methylnitrone, α-(hydroxymethoxyphenyl)-N-(tert.-butyl)nitrone, α-(hydroxymethoxyphenyl)-N-phenylnitrone, α-[(dimethylamino)phenyl]-N-methylnitrone, α-[(dimethylamino)phenyl]-N-(tert.-butyl)nitrone, α-[(dimethylamino)phenyl]-N-phenylnitrone, α-(hydroxynaphthyl)-N-methylnitrone, α-(hydroxynaphthyl)-N-(tert.-butyl)nitrone, α-(hydroxynaphthyl)-N-phenylnitrone, α-(hydroxythienyl)-N-methylnitrone, α-(hydroxythienyl)-N-(tert.-butyl)nitrone and α-(hydroxythienyl)-N-phenylnitrone. These N-oxide compounds may be substituted by various kinds of characteristic group. For example, those that can be introduced into the N-oxide compound of the nitrogen-containing aromatic heterocyclic compound of the aforementioned (PS1) can be employed as a characteristic group.

In the case of the N-oxide compounds of the aforementioned (PS2), these compounds are substantially not provided with heat cure accelerating property (cyclodehydration reaction-accelerating property). However, this photosensitive heat cure accelerating agent is designed such that when it is irradiated with light, the N-oxide group of the nitrone skeleton [—CH=N(O)—] is transferred to the neighboring methine carbon atom whereby it is changed into an amide skeleton [—CO—NH—], thus exhibiting a heat cure accelerating property (cyclodehydration reaction-accelerating property). For example, α-(3-pyridyl)-N-phenylnitrone is changed into N-phenylnicotinamide as it is irradiated with light, thus exhibiting a heat cure accelerating property.

These photosensitive heat cure accelerating agents of (PS1) and (PS2) are designed to be added to a solution of a thermosetting polymer precursor such as a polyimide precursor (polyamic acid), which is designed to be heat cured through a cyclodehydration, whereby obtaining a negative photosensitive resin composition which is capable of forming a fine pattern through a sequence of process comprising coating, exposure, PEB (post exposure bake) and developing steps.

These photosensitive heat cure accelerators may be employed singly or in combination of two or more kinds at a mixing ratio falling within the range of not less than 0.1 molar equivalent, more preferably in the range of 0.1 to 4.0 molar equivalent, and most preferably in the range of 0.1 to 2 molar equivalent per molar equivalent of repeating unit of a termosetting polymer. The reason for limiting the range of mixing ratio of the photosensitive heat cure accelerator is as follows. Namely, if the mixing ratio of this heat cure accelerator is less than the lower limit, the photo-sensitivity of a layer of the resultant resin may be insufficient, thereby failing to obtain a sufficient resolution, whereas if the mixing ratio of this heat cure accelerator exceeds over the upper limit, a prominent thinning of the film may be resulted so that it would be difficult to form a clear thin film.

A third negative photosensitive resin composition according to this invention comprises a thermosetting polymer precursor which can be cured through cyclodehydration upon heating as mentioned above, and a photosensitive heat cure accelerator comprising a compound which is capable of exhibiting a heat cure accelerating property through generation of an acid upon irradiation of light.

Next, the photosensitive heat cure accelerator which is capable of exhibiting a heat cure accelerating property through generation of an acid upon irradiation of light and is to be incorporated into the third negative photosensitive resin composition will be referred to as Group C herein. Followings are explanations on this Group C.

The photosensitive heat cure accelerator according to this Group C is formed of at least one kind of compound selected from the group consisting of a diazonium salt represented by the following general formula (4), an iodonium salt represented by the following general formula (5), a sulfonium salt represented by the following general formula (6), a phosphonium salt represented by the following general formula (7), a selenonium salt represented by the following general formula (8), a sulfonic ester represented by the following general formula (9), a sulfone compound represented by the following general formula (10) and an organic halogen compound represented by the following general formula (11).

(4)

$$Ar^{41}-N_2^+ \cdot X^{41-}$$

(5)

$$Ar^{42}-I^+ \cdot X^{42-}$$
$$\phantom{Ar^{42}-}|$$
$$\phantom{Ar^{42}-}R^{41}$$

(6)

$$\phantom{Ar^{43}-}R^{42}$$
$$\phantom{Ar^{43}-}|$$
$$Ar^{43}-S^+ \cdot X^{43-}$$
$$\phantom{Ar^{43}-}|$$
$$\phantom{Ar^{43}-}R^{43}$$

(7)

$$\phantom{Ar^{44}-}R^{44}$$
$$\phantom{Ar^{44}-}|$$
$$Ar^{44}-P^+ \cdot X^{44-}$$
$$\phantom{Ar^{44}-}/\backslash$$
$$\phantom{Ar^{44}-}R^{45}\ R^{46}$$

(8)

$$\phantom{Ar^{45}-}R^{47}$$
$$\phantom{Ar^{45}-}|$$
$$Ar^{45}-Se^+ \cdot X^{45-}$$
$$\phantom{Ar^{45}-}|$$
$$\phantom{Ar^{45}-}R^{48}$$

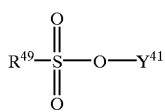

(9)

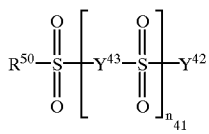

(10)

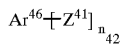

(11)

wherein $R^{41}$ to $R^{50}$ represent individually an aliphatic hydrocarbon group, an alicyclic hydrocarbon group, an aromatic hydrocarbon group, a heterocyclic ring group, or a compound group wherein an aliphatic hydrocarbon group, an alicyclic hydrocarbon group, an aromatic hydrocarbon group or a heterocyclic group is mutually linked to each other directly or via a crosslinking group, each group being substituted or unsubstituted group;

$Ar^{41}$ to $Ar^{46}$ represent individually an aromatic hydrocarbon group, a heterocyclic ring group, or a compound group wherein an aromatic hydrocarbon group or a heterocyclic group is mutually linked to each other directly or via a crosslinking group, each group being substituted or unsubstituted group;

$X^{41-}$ to $X^{45-}$ represent individually Lewis acid counter anion;

$Y^{41}$ and $Y^{42}$ represent individually an aliphatic hydrocarbon group, an alicyclic hydrocarbon group, an aromatic hydrocarbon group, a heterocyclic ring group, imino group or a compound group wherein an aliphatic hydrocarbon group, an alicyclic hydrocarbon group, an aromatic hydrocarbon group or a heterocyclic group is mutually linked to each other directly or via a crosslinking group, each group being substituted or unsubstituted group;

$Y^{43}$ is methylene group, ethylidene group, propylidene group, diazomethylene group, and a single bond;

$Z^{41}$ is polychloroalkyl group or polybromoalkyl group; and $n_{41}$ is 0 or 1

$n_{42}$ is an integer of 1 to 10.

Specific examples of the unsubstituted aliphatic hydrocarbon group to be introduced as the $R^{41}$ to $R^{50}$ in the aforementioned general formulas are methyl, ethyl, propyl, isopropyl, butyl, isobutyl, sec-butyl, tert-butyl, pentyl, tert-pentyl, isopentyl, neopentyl, hexyl, isohexyl, heptyl, octyl, nonyl, decyl, vinyl, allyl, isopropenyl, propenyl, methallyl, crotyl, butenyl, pentenyl, butadienyl, ethynyl, propynyl, butynyl and pentynyl.

As for the substituent group that is to be introduced into these unsubstituted aliphatic hydrocarbon group thereby to form a substituted aliphatic hydrocarbon group, it is possible to employ the following groups, i.e. di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anicidino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pyrazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; oxyamino group (methoxyamino, ethoxyamino, phenoxyamino and pyridyloxyamino group), hydroxyamino group; ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; oxime group (hydroxyiminomethyl, methoxyiminomethyl, ethoxyiminomethyl, hydroxyiminoethyl, hydroxyiminopropyl group, etc.); hydroxyl group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); alkoxyalkyl group (hydroxymethyl, hydroxyethyl and hydroxypropyl group); cyano group; cyanato group; thiocyanato group; nitro group; nitroso group; mercapto group; halogen group (fluoro, chloro, bromo and iodo group); carboxyl group and the salts thereof; oxycarbonyl group (methoxycarbonyl, ethoxycarbonyl phenoxycarbonyl and pyridyloxycarbonyl group); aminocarbonyl group (carbamoyl, methylcarbamoyl, phenylcarbamoyl, pyridylcarbamoyl, carbozoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfinio group and the salts thereof; sulfo group and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; organosilicic group (silyl, disilanyl, trimethylsilyl and triphenylsilyl group).

Specific examples of the unsubstituted alicyclic hydrocarbon group to be introduced as the $R^{41}$ to $R^{50}$ in the aforementioned general formulas are cyclopropyl, cyclobutyl, cyclopentyl, cyclohexyl, cycloheptyl, cyclooctyl, cyclopentenyl, cyclohexenyl, cycloheptenyl, cyclooctenyl, cyclopentadienyl, cyclohexadienyl, menthanyl, menthenyl, menthadienyl, norbornanyl, norbornenyl and camphoryl.

As for the characteristic group that is to be introduced into these unsubstituted aliphatic hydrocarbon group thereby to form a substituted aliphatic hydrocarbon group, it is possible to employ those that can be introduced into the aforementioned unsubstituted aliphatic hydrocarbon group.

Specific examples of the unsubstituted aromatic hydrocarbon group to be introduced into the aforementioned general formula as the $R^{41}$ to $R^{50}$ are benzene ring, naphthalene ring, anthracene ring, phenanthrene ring, tetralin ring, azulene ring, biphenylene ring, acenaphthylene ring, acenaphthene ring, fluorene ring, triphenylene ring, pyrene ring, chrysene ring, picene ring, perylene ring, benzopyrene ring, rubicene ring, coronene ring, ovalene ring, indene ring, pentalene ring, heptalene ring, indacene ring, phenalene ring, fluoranthene ring, acephenanthrylene ring, aceanthrylene ring, naphthacene ring, pleiadene ring, pentaphene ring, pentacene ring, tetraphenylene ring, hexaphene ring, hexacene ring, trinaphthylene ring, heptaphene ring, heptacene ring and pyranthrene ring.

As for the characteristic group that is to be introduced into these unsubstituted aromatic hydrocarbon group thereby to form a substituted aromatic hydrocarbon group, it is possible to employ those that can be introduced into the aforementioned unsubstituted aliphatic hydrocarbon group.

Specific examples of the unsubstituted heterocyclic group to be introduced into the aforementioned general formula as the $R^{41}$ to $R^{50}$ are pyrrole ring, pyrroline ring, pyrrolidine ring, indole ring, isoindole ring, indoline ring, isoindoline ring, indolizine ring, carbazole ring, carboline ring, furan ring, oxolane ring, coumarone ring, coumaran ring, isobenzofuran ring, phthalan ring, dibenzofuran ring, thiophene ring, thiolane ring, benzothiophene ring, dibenzothiophene ring, pyrazole ring, pyrazoline ring, indazole ring, imidazole ring, imidazoline ring, imidazolidine ring, benzimidazole ring, benzimidazoline ring, naphthimidazole ring, oxazole ring, oxazoline ring, oxazolidine ring, benzoxazole ring, benzoxazoline ring, naphthoxazole ring, isoxazole ring, benzisoxazole ring, thiazole ring, thiazoline ring, thiazolidine ring, benzothiazole ring, benzothiazoline ring, naphthothiazole ring, isothiazole ring, benzisothiazole ring, triazole ring, benzotriazole ring, oxadiazole ring, thiadiazole ring, benzoxadiazole ring, benzothiadiazole ring, tetrazole ring, purine ring, pyridine ring, piperidine ring, quinoline ring, isoquinoline ring, acridine ring, phenanthridine ring, benzoquinoline ring, naphthoquinoline ring, naphthylidine ring, phenanthroline ring, pyridazine ring, pyrimidine ring, pyrazine ring, piperazine ring, phthalazine ring, quinoxaline ring, quinazoline ring, cinnoline ring, phenazine ring, perimidine ring, triazine ring, tetrazine ring, pteridine ring, oxazine ring, benzoxazine ring, phenoxazine ring, thiazine ring, benzothiazine ring, phenothiazine ring, oxadiazine ring, thiadiazine ring, dioxolane ring, benzodioxole ring, dioxane ring, benzodioxane ring, dithiolane ring, benzodithiol ring, dithiane ring, benzodithiane ring, pyrane ring, chromene ring, xanthene ring, oxane ring, chroman ring, isochroman ring, trioxane ring, thaine ring, trithaine ring, morpholine ring, quinuclidine ring, selenazole ring, benzoselenazole ring, naphthoselenazole ring, tellurazole ring and benzotellurazole ring.

As for the characteristic group that is to be introduced into these unsubstituted heterocyclic group thereby to form a substituted heterocyclic group, it is possible to employ those that can be introduced into the aforementioned unsubstituted aliphatic hydrocarbon group.

As for the cross-linking group which is to be introduced as the $R^{41}$ to $R^{50}$ into the aforementioned general formula and functions to mutually linking the aliphatic hydrocarbon group, alicyclic hydrocarbon group, aromatic hydrocarbon group, or heterocyclic ring group, it is possible to employ bivalent oxy group, thio group, sulfinyl group, sufonyl group, carbonyl group, carbonyloxy group, oxycarbonyloxy group, peralkylpolysiloxanediyl group (such as 1,1,3,3-tetramethyldisiloxane-1,3-diyl, 1,1,3,3,5,5-hexamethyltrisiloxane-1,5-diyl, 1,1,3,3,5,5,7,7-octamethyltetrasiloxane-1,7-diyl, etc.), substituted or unsubstituted imino group (such as imino, methylimino, ethylimino, propylimino, phenylimino, etc.), substituted or unsubstituted aliphatic hydrocarbon group (such as methylene, ethylene, propylene, butylene, pentylene, ethylidene, propylidene, butylidene, pentylidene, vinylene, difluoromethylene, tetrafluoroethylene, hexafluoropropylene, octafluorobutylene, decafluoropentylene, trifluoroethylidene, tetrafluoroethylidene, hexafluoropropylidene, octafluorobutylidene, decafluoropentylidene, etc.), substituted or unsubstituted alkylenedioxy group (such as methylenedioxy, ethylenedioxy, propylenedioxy, butylenedioxy, pentylenedioxy, ethylidenedioxy, propylidenedioxy, butylidenedioxy, pentylidenedioxy, etc.), azo group, azoxy group and azomethine group.

As for the substituted or unsubstituted aromatic hydrocarbon group, heterocyclic ring group or the compound group formed through a linking, directly or via a crosslinking group, of the aromatic hydrocarbon group or the heterocyclic ring group to each other, these groups being adapted to be introduced as the $Ar^{41}$ to $Ar^{46}$ into the aforementioned general formula, it is possible to employ the same kinds of groups which are to introduced into the aforementioned general formulas $R^{41}$ to $R^{50}$, i.e. the substituted or unsubstituted aromatic hydrocarbon group, the substituted or unsubstituted heterocyclic ring group or the compound group formed through a linking, directly or via a crosslinking group, of these aromatic hydrocarbon group and heterocyclic ring group. As for the cross-linking group, the same kinds of group as exemplified for the $R^{41}$ to $R^{50}$ can be employed.

As for the Lewis acid counter anion to be introduced as $X^{41-}$ to $X^{45-}$, it is possible to employ hexafluorophosphate, hexafluoroarsenate, hexafluoroantimonate, tetrafluoroborate, hexachloroantimonate, perchlorate, benzenesulfonate, p-toluenesulfonate, methanesulfonate, ethanesulfonate, propanesulfonate, butanesulfonate, pentanesulfonate, hexanesulfonate, trifluoromethanesulfonate, pentanefluoroethanesulfonate, heptanefluoropropanesulfonate, nonafluorobutanesulfonate, camphor sulfonate, naphthalenesulfonate, phenathrenesulfonate, anthracenesulfonate, dimethoxyanthracenesulfonate, anthraquinonesulfonate, cyclohexanesulfonate, fluorosulfonate, difluorophosphate, chrolide, bromide, fluoride, nitrate and sulfate.

As for the substituted or unsubstituted aromatic hydrocarbon group, heterocyclic ring group or the compound group formed through a linking, directly or via a crosslinking group, of the aromatic hydrocarbon group or the heterocyclic ring group to each other, these groups being adapted to be introduced as the $Y^{41}$ and $Y^{42}$ into the aforementioned general formula, it is possible to employ the same kinds of groups which are to introduced into the aforementioned general formulas $R^{41}$ to $R^{50}$, i.e. the substituted or unsubstituted aromatic hydrocarbon group, the substituted or unsubstituted heterocyclic ring group or the compound group formed through a linking, directly or via a crosslinking group, of these aromatic hydrocarbon group and heterocyclic ring group. As for the cross-linking group, the same kinds of group as exemplified for the $R^{41}$ to $R^{50}$ can be employed.

As for the imino group to be introduced as the $Y^{41}$ and $Y^{42}$ into the aforementioned general formula, it is possible to employ the substituted or unsubstituted groups, i.e. N-ethylideneamino group, N-propylideneamino group, N-butylideneamino group, N-benzylideneamino group, N-(naphthylmethylene)amino group, N-(phenanthrylmethylene)amino group, N-(anthrylmethylene)amino group, N-(pyridylmethylene)amino group, N-(quinolylmethylene)amino group, N-(furylmethylene)amino group, N-(thienylmethylene) amino group, N-(α-cyanobenzylidene)amino group, N-(phenylethylidene)amino group, N-(diphenylmethylene) amino group, succinimido group, glutarimido group, maleimido group, crotonimido group, phthalimido group, naphthalimido group, naphthalene-2,3-dicarboxyimido group, cyclohexanedicarboxyimido group, cyclohexenedicarboxyimido group, 5-norbornene-2,3-dicarboxyimido group, and pyridine-2,3-dicarboxyimido group.

As for the polychloroalkyl group to be introduced as the $Z^{41}$ into the aforementioned general formula, it is possible to employ for example trichloromethyl, pentachloroethy, heptachloropropyl, trichloroethyl, trichloropropyl or pentachloropropyl group. As for the polybromoalkyl group to be introduced as the $Z^{41}$ into the aforementioned general formula, it is possible to employ for example tribromomethyl, pentabromoethy, heptabromopropyl, tribromoethyl, tribromopropyl or pentabromopropyl group.

As for the photosensitive heat cure accelerator which is to be employed in the third negative photosensitive resin composition and is capable of generating an acid upon irradiation of light, a compound which is capable of generating a sulfonic acid compound upon irradiation of light is preferable for use. In particular, compounds having a sulfonate ion (for example, introduced as $X^{41-}$ to $X^{43-}$) in a diazonium salt represented by the aforementioned general formula (4), an iodonium salt represented by the aforementioned general formula (5), and a sulfonium salt represented by the aforementioned general formula (6); a sulfonic ester represented by the aforementioned general formula (9) and a sulfone compound represented by the aforementioned general formula (10) are most preferable.

Namely, as for the Group C photosensitive heat cure accelerator, the employment of sulfonates of diazonium compound, sulfonates of iodonium compound, sulfonates of sulfonium compound, sulfonic acid esters of hydroxy compound, sulfonic acid esters of N-hydroxy compound, and sulfonic compounds is most preferable.

Specific examples of diazonium compound are benzene diazonium, nitrobenzene diazonium, dinitrobenzene diazonium, chlorobenzene diazonium, dichlorobenzene diazonium, methoxybenzene diazonium, dimethoxybenzene diazonium, dimethylaminobenzene diazonium, morpholinobenzene diazonium, naphthalene diazonium and anthracene diazonium.

Specific examples of iodonium compound are diphenyl iodonium, phenyltolyl iodonium, ditolyl iodonium, phenylxylyl iodonium, dixylyl iodonium, cumenyl phenyl iodonium, dicumenyl iodonium, mesitylphenyl iodonium, dimesityl iodonium, methoxydiphenyl iodonium and dimethoxydiphenyl iodonium.

Specific examples of sulfonium compound are triphenyl sulfonium, diphenyltolyl sulfonium, phenylditolyl sulfonium, tritolyl sulfonium, diphenylxylyl sulfonium, phenyldixylyl sulfonium, trixylyl sulfonium, cumenyldiphenyl sulfonium, dicumenylphenyl sulfonium, tricumenyl sulfonium, mesityldiphenyl sulfonium, dimesitylphenyl sulfonium, trimesityl sulfonium, methoxyphenyldiphenyl sulfonium, phenylthiophenyldiphenyl sulfonium, naphthyldimethyl sulfonium, hydroxynaphthyldimethyl sulfonium, dihydroxynaphthyldimethyl sulfonium, and S-(naphthoyl) thiolanium.

Specific examples of sulfonate ion are benzene sulfonate, p-toluene sulfonate, methane sulfonate, ethane sulfonate, propane sulfonate, butane sulfonate, pentane sulfonate, hexane sulfonate, trifluoromethane sulfonate, pentafluoroethane sulfonate, heptanefluoropropane sulfonate, nonafluorobutane sulfonate, camphor sulfonate, naphthalene sulfonate, phenanthrene sulfonate, anthracene sulfonate, dimethoxyanthracene sulfonate, anthraquinone sulfonate, cyclohexane sulfonate and fluorosulfonate.

Specific examples of hydroxyl compound are nitrophenol, dinitrophenol, trifluoromethyl phenol, nitrobenzyl alcohol, dinitrobenzyl alcohol, benzoin, 1-benzoyl-1-phenylethylene glycol, benzoylmethoxy methanol, benzoyldimethoxy methanol, dihydroxybenzene, trihydroxybenzene, naphthol, dihydroxy naphthalene, hydroxyanthracene, dihydroxyanthracene, hydroxydimethoxyanthracene, hydroxyanthraquinone, dihydroxybiphenyl, dihydroxydiphenylmethane, dihydroxydiphenylpropane, dihydroxydiphenyl ether, dihydroxydiphenyl sulfone, hydroxybenzophenone, dihydroxybenzophenone, trihydroxybenzophenone, tetrahydroxybenzophenone, phenolphthalein and cresolphthalein.

Specific examples of N-hydroxyl compound are benzaldoxime, nitrobenzaldoxime, dinitrobenzaldoxime, trifluorobenzaldoxime, methoxybenzaldoxime, dimethoxybenzaldoxime, dimethylaminobenzaldoxime, naphthalenealdoxime, phenanthrenealdoxime, anthracenealdoxime, pyridinealdoxime, quinolinealdoxime, furanaldoxime, thiophenealdoxime, α-cyanobenzaldoxime, α-cyano-4-methoxybenzaldoxime, acetophenoneoxime, benzophenoneoxime, N-hydroxysuccinimide, N-hydroxyglutarimide, N-hydroxymaleimide, N-hydroxycrotonimide, N-hydroxyphthalimide, N-hydroxynaphthalimide, N-hydroxynaphthalene-2,3-dicarboxyimide, N-hydroxycyclohexanedicarboxyimide, N-hydroxycyclohexenedicarboxyimide, N-hydroxy-5-norbornene-2,3-dicarboxyimide and N'-hydroxypyridine-2,3-dicarboxyimide.

Specific examples of sulfonic ester are benzene sulfonic ester, p-toluene sulfonic ester, methane sulfonic ester, ethane sulfonic ester, propane sulfonic ester, butane sulfonic ester, pentane sulfonic ester, hexane sulfonic ester, trifluoromethane sulfonic ester, pentafluoroethane sulfonic ester, heptafluoropropane sulfonic ester, nonafluorobutane sulfonic ester, camphor sulfonic ester, naphthalene sulfonic ester, phenathrene sulfonic ester, anthracene sulfonic ester, dimethoxyanthracene sulfonic ester, anthraquinone sulfonic ester and cyclohexane sulfonic ester.

Specific examples of sulfone compound are diphenyldi sulfone, ditolyldisulfone, dixylyldisulfone, dimethoxydiphenyldisulfone, dinitrodiphenyldisulfone, dichlorodiphenyldisulfone, bis(phenylsulfonyl)methane, bis(tolylsulfonyl)methane, bis(xlylsulfonyl)methane, bis (methoxyphenylsulfonyl)methane, bis(nitrophenylsulfonyl) methane, bis(chlorosulfonyl)methane, bis(phenylsulfonyl) diazomethane, bis(tolylsulfonyl)diazomethane, bis (xlylsulfonyl)diazomethane, bis(methoxyphenylsulfonyl) diazomethane, bis(nitrophenylsulfonyl)diazomethane and bis(chlorosulfonyl)diazomethane.

In the case of the compounds constituting the photosensitive heat cure accelerating agent of Group C, it is substantially not provided with heat cure accelerating property (cyclodehydration reaction-accelerating property). However, this photosensitive heat cure accelerating agent is designed such that when it is irradiated with light, an acid is generated whereby exhibiting more or less a heat cure accelerating property (cyclodehydration reaction-accelerating property).

These photosensitive heat cure accelerating agents are designed to be added to a solution of a thermosetting polymer precursor such as a polyimide precursor (polyamic acid), which is designed to be heat cured through a cyclodehydration, whereby obtaining a negative photosensitive resin composition which is capable of forming a fine pattern through a sequence of process comprising coating, exposure, PEB (post exposure bake) and developing steps.

These photosensitive heat cure accelerators may be employed singly or in combination of two or more kinds at a mixing ratio falling within the range of not less than 0.1 molar equivalent, more preferably in the range of 0.2 to 4.0 molar equivalent, and most preferably in the range of 1.0 to 2.0 molar equivalent per molar equivalent of repeating unit of a termosetting polymer. The reason for limiting the range of mixing ratio of the photosensitive heat cure accelerator is as follows. Namely, if the mixing ratio of this heat cure accelerator is less than the lower limit, the photosensitivity of a layer of the resultant resin may be insufficient, thereby failing to obtain a sufficient resolution, whereas if the mixing ratio of this heat cure accelerator exceeds over the upper limit, a prominent thinning of the film may be resulted so that it would be difficult to form a clear thin film.

A fourth negative photosensitive resin composition according to this invention comprises a thermosetting polymer precursor which can be cured through cyclodehydration upon heating as mentioned above, a latent heat cure accelerator which is capable of changing into a compound exhibiting a heat cure accelerating property through a reaction with an acid, and a photo-acid generating agent which is capable of generating an acid upon irradiation of light.

According to this fourth negative photosensitive resin composition, a photosensitive heat cure accelerator can be said to be constituted by the combination of a latent heat cure accelerator and a photo-acid generating agent.

The latent heat cure accelerator will be referred as Group D herein. Followings are explanations on this Group D. The latent heat cure accelerater according to this Group D can be classified into four kinds as explained below.

A first kind (LCA1) of the latent heat cure accelerator of Group D is a compound represented by the following general formula (12).

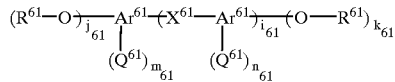

(12)

wherein $Ar^{61}$s may be the same or different and are individually a substituted or unsubstituted aromatic hydrocarbon group or a substituted or unsubstituted aromatic hetrocyclic group; $X^{61}$s may be the same or different and are individually a bivalent organic group or a single bond; $Q^{61}$ is hydroxyl group, carboxyl group, carboxyalkyl group, sulfo group, sulfoalkyl group, substituted or unsubstituted amino group, substituted or unsubstituted aminoalkyl group or mercapto group; $R^{61}$s may be the same or different and are individually a protective substituent group which can be eliminated by an acid; $i_{61}$ is an integer of 0 to 4; $j_{61}$ is an integer of 1 to 5; $k_{61}$ is an integer of 0 to 5; $m_{61}$ and $n_{61}$ are respectively an integer of 0 to 4; and a total of $j_{61}$, $k_{61}$, $m_{61}$ and $n_{61}$ is 2 or more.

Specific examples of the unsubstituted aromatic hydrocarbon group to be introduced into the aforementioned general formula (12) as the $Ar^{61}$ are benzene ring, naphthalene ring, anthracene ring, phenanthrene ring, tetralin ring, azulene ring, biphenylene ring, acenaphthylene ring, acenaphthene ring, fluorene ring, triphenylene ring, pyrene ring, chrysene ring, picene ring, perylene ring, benzopyrene ring, rubicene ring, coronene ring, ovalene ring, indene ring, pentalene ring, heptalene ring, indacene ring, phenalene ring, fluoranthene ring, acephenanthrylene ring, aceanthrylene ring, naphthacene ring, pleiadene ring, pentaphene ring, pentacene ring, tetraphenylene ring, hexaphene ring, hexacene ring, trinaphthylene ring, heptaphene ring, heptacene ring and pyranthrene ring.

Examples of a substituent group to be introduced into these aromatic hydrocarbon group so as to form a substituted aromatic hydrocarbon group are ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; oxime group (hydroxyiminomethyl, methoxyiminomethyl, ethoxyiminomethyl, hydroxyiminoethyl and hydroxyiminopropyl group); alkoxyalkyl group (hydroxymethyl, hydroxyethyl and hydroxypropyl group); cyano group; cyanato group; thiocyanato group; nitro group; nitroso group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group);

ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; and organosilicic group (silyl, disilanyl, trimethylsilyl and triphenylsilyl group). These characteristic will be hereinafter referred to as Group (a) characteristic group.

Specific examples of the unsubstituted aromatic heterocyclic group to be introduced into the aforementioned general formula (12) as the $Ar^{61}$ are pyrrole ring, indole ring, isoindole ring, carbazole ring, furan ring, coumarone ring, isobenzofuran ring, thiophene ring, benzothiophene ring, dibenzothiophene ring, oxazine ring, benzoxazine ring, phenoxazine ring, thiazine ring, benzothiazine ring, phenothiazine ring, oxadiazine ring, thiadiazine ring, benzodioxole ring, benzodioxane ring, pyrane ring, chromene ring, xanthene ring, chroman ring, isochroman ring, etc. These aromatic heterocyclic rings may be substituted by various kinds of the aforementioned Group (a) characteristic group.

Specific examples of the bivalent organic group to be introduced as the $X^{61}$ into the aforementioned general formula (12) are bivalent oxy group, thio group, sulfinyl group, sufonyl group, carbonyl group, carbonyloxy group, oxycarbonyloxy group, peralkylpolysiloxanediyl group (such as 1,1,3,3-tetramethyldisiloxane-1,3-diyl, 1,1,3,3,5,5-hexamethyltrisiloxane-1,5-diyl, 1,1,3,3,5,5,7,7-octamethyltetrasiloxane-1,7-diyl, etc.), substituted or unsubstituted imino group (such as imino, methylimino, ethylimino, propylimino, phenylimino, etc.), substituted or unsubstituted aliphatic hydrocarbon group (such as methylene, ethylene, propylene, butylene, pentylene, ethylidene, propylidene, butylidene, pentylidene, vinylene, difluoromethylene, tetrafluoroethylene, hexafluoropropylene, octafluorobutylene, decafluoropentylene, trifluoroethylidene, tetrafluoroethylidene, hexafluoropropylidene, octafluorobutylidene, decafluoropentylidene, etc.), substituted or unsubstituted alkylenedioxy group (such as methylenedioxy, ethylenedioxy, propylenedioxy, butylenedioxy, pentylenedioxy, ethylidenedioxy, propylidenedioxy, butylidenedioxy, pentylidenedioxy, etc.), azo group, azoxy group and azomethine group.

Specific examples of the substituent group to be introduced as the $Q^{61}$ into the aforementioned general formula (12) are hydroxyl group, carboxyl group, carboxyalkyl group (such as carboxymethyl, carboxyethyl, carboxypropyl, etc.), sulfo group, sufoalkyl group (such as sulfomethyl, sulfoethyl, sulfopropyl, etc.), substituted or unsubstituted amino group (such as amino, methylamino, ethylamino, dimethylamino, diethylamino, acetylamino, mesylamino, hydroxyamino, etc.), substituted or unsubstituted aminoalkyl group (such as aminomethyl, aminoethyl, aminopropyl, dimethylaminomethyl, dimethylaminoethyl, dimethylaminopropyl, etc.), and mercapto group.

Specific examples of the protective substituent group which is to be introduced as the $R^{61}$ into the aforementioned general formula (12) and can be eliminated by an acid are oxycarbonyl group (methoxycarbonyl, ethoxycarbonyl, propoxycarbonyl, butoxycarbonyl, t-butoxycarbonyl, phenoxycarbonyl and benzyloxycarbonyl group); tetrahydrofuran-2-yl group, tetrahydropyran-2-yl group, 1,3-dioxoran-2-yl group, 1,3-dioxan-2-yl group, 1-hydroxyalkyl group (hydroxymethyl, 1-hydroxyethyl and 1-hydroxypropyl group); 1-alkoxyalkyl group (methoxymethyl, ethoxymethyl, 1-methoxyethyl, 1-ethoxyethyl and 1-ethoxypropyl group); acyl group (formyl, acetyl, benzoyl, nitrobenzoyl, pyridinecarbonyl and trifluoroacetyl group); and acylmethyl group (benzoylmethyl, nitrobenzoylmethyl and pyridinecarbonylmethyl group). These protective substituent groups may be substituted by various kinds of the aforementioned Group (a) characteristic group.

A second kind (LCA2) of the latent heat cure accelerator of Group D is a compound represented by the following general formula (13).

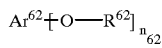

(13)

wherein $Ar^{62}$ is a substituted or unsubstituted nitrogen-containing aromatic heterocyclic group having a pyridine type nucleus nitrogen atom; $R^{62}$s may be the same or different and are individually a protective substituent group which can be eliminated by an acid; $n_{62}$ is an integer of 1 to 5.

Specific examples of the unsubstituted nitrogen-containing aromatic heterocyclic group to be introduced into the aforementioned general formula (13) as the $Ar^{62}$ are pyridine ring, quinoline ring, isoquinoline ring, phenanthridine ring, phenanthroline ring, pyridazine ring, phthalazine ring, cinnoline ring, pyrimidine ring, quinazoline ring, pyrazine ring, quinoxaline ring, 1,3,5-triazine ring, 1,2,4,5-tetrazine ring, imidazole ring, benzimidazole ring, naphthimidazole ring, pyrazole ring, indazole ring, oxazole ring, benzoxazole ring, naphthoxazole ring, isoxazole ring, benzisoxazole ring, thiazole ring, benzothiazole ring, naphthothiazole ring, selenazole ring, benzoselenazole ring, tetrazole ring, benzotetrazole ring, 1,2,3-triazole ring, 1,2,4-triazole ring, 1,2,3,5-tetrazole ring and naphthylidine ring.

As for the characteristic group that is to be introduced into these unsubstituted nitrogen-containing aromatic heterocyclic compound thereby to form a substituted nitrogen-containing aromatic heterocyclic compound, it is possible to employ the same kind of group as exemplified in the aforementioned Group (a) characteristic group.

Specific examples of the protective substituent group which is to be introduced as the $R^{62}$ into the aforementioned general formula (13) and can be eliminated by an acid are oxycarbonyl group (methoxycarbonyl, ethoxycarbonyl, propoxycarbonyl, butoxycarbonyl, t-butoxycarbonyl, phenoxycarbonyl and benzyloxycarbonyl group); tetrahydrofuran-2-yl group, tetrahydropyran-2-yl group, 1,3-dioxoran-2-yl group, 1,3-dioxan-2-yl group, 1-hydroxyalkyl group (hydroxymethyl, 1-hydroxyethyl and 1-hydroxypropyl group); 1-alkoxyalkyl group (methoxymethyl, ethoxymethyl, 1-methoxyethyl, 1-ethoxyethyl and 1-ethoxypropyl group); acyl group (formyl, acetyl, benzoyl, nitrobenzoyl, pyridinecarbonyl and trifluoroacetyl group); and acylmethyl group (benzoylmethyl, nitrobenzoylmethyl and pyridinecarbonylmethyl group). These protective substituent groups may be substituted by various kinds of the aforementioned Group (a) characteristic group.

A third kind (LCA3) of the latent heat cure accelerator of Group D is consisted of a nitrogen-containing hetrocyclic ketone compound having a protective substituent group which can be eliminated by an acid and substitutes for at least one cyclic imino group (>N—H). Specific examples of such a compound whose at least one cyclic imino group (>N—H) is protected by a protecting group are substituted or unsubstituted, or ring-fused or unfused imidazolone, imidazolinedion, pyrazolone, pyrazolinedione, thiazolone, thiazolinedione, pyridone, pyridazinone, pyridazinedione, pyrimidinone, pyrimidinedione, pyrazinone and pyrazinedione.

Examples of unsubstituted nitrogen-containing hetrocyclic ketone compound are 2-imidazolone, 5-imidazolone, 2-benzimidazolone, 2,4-imidazolinedion, 3-pyrazolone, 5-pyrazolone, 3,5-pyrazolinedione, 3-indazolone, 2-thiazolone, 2-benzothiazolone, 2-pyridone, 4-pyridone, 2-quinolone, 4-quinolone, 1-isoquinolone, 3-isoquinolone, 9-acridinone, 6-phenanthridinone, 3-pyridazinone, 4-pyridazinone, 3,6-pyridazinedione, 3-cinnolinone, 4-cinnolinone, 1-phthaladinone, 1,4-phthaladinedione, 2-pyrimidinone, 4-pyrimidinone, uracil, barbituric acid, 2-quinazolinone, 4-quinazolinone, 2,4-quinazolinedione, 2-pyrazinone, 2,4-pyrazinedione, 2-quinoxalinone and 2,3-quinoxalinedione.

As for the characteristic group that is to be introduced into these unsubstituted nitrogen-containing heterocyclic ketone compounds thereby to form a substituted nitrogen-containing heterocyclic ketone compound, it is possible to employ the following groups, i.e. di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anicidino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pyrazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; hydroxyamino group; ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; oxime group (hydroxyiminomethyl, methoxyiminomethyl, ethoxyiminomethyl, hydroxyiminoethyl, hydroxyiminopropyl group, etc.); hydroxyl group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); alkoxyalkyl group (hydroxymethyl, hydroxyethyl and hydroxypropyl group); cyano group; cyanato group; thiocyanato group; nitro group; nitroso group; mercapto group; halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfino group and the salts thereof; sulfo group and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); hydrocarbon group (alkyl, aryl, alkenyl and alkynyl group); heterocyclic group; organosilicic group (silyl, disilanyl, trimethylsilyl and triphenylsilyl group). These characteristic will be hereinafter referred to as Group (b) characteristic group.

As for the protective substituent group which can be eliminated by an acid and is capable of substituting at least one cyclic imino group (>N—H) of the aforementioned substituted or unsubstituted nitrogen-containing heterocyclic ketone compound, it is possible to employ oxycarbonyl group (methoxycarbonyl, ethoxycarbonyl, propoxycarbonyl, butoxycarbonyl, t-butoxycarbonyl, phenoxycarbonyl and benzyloxycarbonyl group); tetrahydrofuran-2-yl group, tetrahydropyran-2-yl group, 1,3-dioxoran-2-yl group, 1,3-dioxan-2-yl group, 1-hydroxyalkyl group (hydroxymethyl, 1-hydroxyethyl and 1-hydroxypropyl group); 1-alkoxyalkyl group (methoxymethyl, ethoxyethyl, 1-methoxyethyl, 1-ethoxyethyl and 1-ethoxypropyl group); acyl group (formyl, acetyl, benzoyl, nitrobenzoyl, pyridinecarbonyl and trifluoroacetyl group); and acylmethyl group (benzoylmethyl, nitrobenzoylmethyl and pyridinecarbonylmethyl group). These protective substituent groups may be substituted by various kinds of the aforementioned Group (b) characteristic group.

A fourth kind (LCA4) of the latent heat cure accelerator of Group D is consisted of a nitrogen-containing hetrocyclic compound having a protective substituent group which can be eliminated by an acid and substitutes for at least one N-hydroxyl group (>N—OH) of an N-hydroxyl nitrogen-containing heterocyclic ketone compound. The N-hydroxyl nitrogen-containing heterocyclic ketone compound to be employed herein may be a substituted or unsubstituted, or ring-fused or unfused compound, examples of which being N-hydroxypyridone, N-hydroxypyridazinone, N-hydroxypyridazinedione, N,N'-dihydroxypyridazinedione, N-hydroxypyrimidinone, N-hydroxypyrimidinedione, N,N'-dihydroxypyrimidinedione, N-hydroxypyrazinone, N-hydroxypyrazinedione, N,N'-dihydroxypyrazinedione, N-hydroxymaleimide, N-hydroxysuccinimide, N-hydroxynadicimide, etc.

As for the unsubstituted nitrogen-containing heterocyclic compound, it is possible to employ, for example, N-hydroxy-2-pyridone, N-hydroxy-4-pyridone, N-hydroxy-2-quinolone, N-hydroxy-4-quinolone, N-hydroxy-1-isoquinolone, N-hydroxy-3-isoquinolone, N-hydroxy-9-acridinone, N-hydroxy-6-phenanthridinone, N-hydroxy-3-pyridazinone, N-hydroxy-4-pyridazinone, N-hydroxy-3,6-pyridazinedione, N,N'-dihydroxy-3,6-pyridazinedione, N-hydroxy-3-cinnolinone, N-hydroxy-4-cinnolinone, N-hydroxy-1-phthaladinone, N-hydroxy-1,4-phthaladinedione, N,N'-dihydroxy-1,4-phthaladinedione, N-hydroxy-2-pyrimidinone, N-hydroxy-4-pyrimidinone, N-hydroxy-2,4-pyrimidinedione, N,N'-dihydroxy-2,4-pyrimidinedione, N-hydroxy-2-quinazolinone, N-hydroxy-4-quinazolinone, N-hydroxy-2,4-quinazolinedione, N,N'-dihydroxy-2,4-quinazolinedione, N-hydroxy-2-pyrazinone, N-hydroxy-2,4-pyrazinedione, N,N'-dihydroxy-2,4-pyrazinedione, N-hydroxy-2-quinoxalinon, N-hydroxy-2,3-quinoxalinedione, N,N'-dihydroxy-2,3-quinoxalinedione, N-hydroxymaleimide, N-hydroxysuccinimide, N-hydroxynadicimide, N-hydroxyphthalimide, N-hydroxynaphthalene-1,2-dicarboxyimide, N-hydroxynaphthalene-2,3-dicarboxyimide, N,N'-dihydroxy pyromellitic diimide, N,3-dihydroxyphthalimide, N,4-dihydroxyphthalimide, N,N'-dihydroxybiphenyl-3,3',4,4'-tetracarboxydiimide, oxy-4,4'-bis(N-hydroxyphthalimide), sulfonyl-4,4'-bis(N-hydroxyphthalimide), carbonyl-4,4'-bis(N-hydroxyphthalimide), methylene-4,4'-bis(N-hydroxyphthalimide), 2,2-propylidene-4,4'-bis(N-hydroxyphthalimide), 1,1,1,3,3,3-hexafluoro-2,2-propylidene-4,4'-bis(N-hydroxyphthalimide), N-hydroxycyclohexane-1,2-dicarboxyimide, N,N'-dihydroxycyclohexane-1,2,4,5-tetracarboxydiimide, N-hydroxyendomethylene tetrahydrophthalimide, and N,N'-dihydroxybicyclo[2,2,2]oct-7-en-2,3,5,6-tetracarboxydiimide.

As for the characteristic group that is to be introduced into these unsubstituted N-hydroxy nitrogen-containing heterocyclic ketone compounds thereby to form a substituted nitrogen-containing N-hydroxy nitrogen-containing heterocyclic ketone compound, it is possible to employ the same kinds of characteristic group as exemplified in the aforementioned Group (b) characteristic group.

As for the protective substituent group which can be eliminated by an acid and is capable of protecting at least one N-hydroxyl group (>N—OH) of such a substituted or unsubstituted N-hydroxyl nitrogen-containing heterocyclic ketone compound, it is possible to employ oxycarbonyl group (methoxycarbonyl, ethoxycarbonyl, propoxycarbonyl, butoxycarbonyl, t-butoxycarbonyl, phenoxycarbonyl and benzyloxycarbonyl group); tetrahydrofuran-2-yl group, tetrahydropyran-2-yl group, 1,3-dioxoran-2-yl group, 1,3-dioxan-2-yl group, 1-hydroxyalkyl group (hydroxymethyl, 1-hydroxyethyl and 1-hydroxypropyl group); 1-alkoxyalkyl group (methoxymethyl, ethoxyethyl, 1-methoxyethyl, 1-ethoxyethyl, 1-methoxypropyl and 1-ethoxypropyl group); acyl group (formyl, acetyl, benzoyl, nitrobenzoyl, pyridinecarbonyl and trifluoroacetyl group); and acylmethyl group (benzoylmethyl, nitrobenzoylmethyl and pyridinecarbonylmethyl group). These protective substituent groups may be substituted by various kinds of the aforementioned Group (b) characteristic group.

These latent heat cure accelerators may be employed singly or in combination of two or more kinds at a mixing ratio falling within the range of not less than 0.1 molar equivalent, more preferably in the range of 0.1 to 4.0 molar equivalent, and most preferably in the range of 0.1 to 2.0 molar equivalent per molar equivalent of repeating unit of a termosetting polymer. The reason for limiting the range of mixing ratio of the latent heat cure accelerator is as follows. Namely, if the mixing ratio of this heat cure accelerator is less than the lower limit, the photo-sensitivity of a layer of the resultant resin may be insufficient, thereby failing to obtain a sufficient resolution, whereas if the mixing ratio of this heat cure accelerator exceeds over the upper limit, a prominent thinning of the film may be resulted so that it would be difficult to form a clear thin film.

As for the photo-acid generating agent to be incorporated into the fourth negative photosensitive resin composition, it is possible to employ a Lewis acid salt of diazonium compound, a Lewis acid salt of iodonium compound, a Lewis acid salt of sulfonium compound, a Lewis acid salt of phosphonium compound, a Lewis acid salt of selenonium compound, a sulfonic ester of hydroxy compound, a sulfonic ester of N-hydroxy compound, a sulfone compound, or an organic halogen compound having a polychloroalkyl or polybromoalkyl group.

Specific examples of diazonium compound are benzene diazonium, nitrobenzene diazonium, dinitrobenzene diazonium, chlorobenzene diazonium, dichlorobenzene diazonium, methoxybenzene diazonium, dimethoxybenzene diazonium, dimethylaminobenzene diazonium, morpholinobenzene diazonium, naphthalene diazonium and anthracene diazonium.

Specific examples of iodonium compound are diphenyl iodonium, phenyltolyl iodonium, ditolyl iodonium, phenylxylyl iodonium, dixylyl iodonium, cumenylphenyl iodonium, dicumenyl iodonium, mesitylphenyl iodonium, dimesityl iodonium, methoxydiphenyl iodonium and dimethoxydiphenyl iodonium.

Specific examples of sulfonium compound are triphenyl sulfonium, diphenyltolyl sulfonium, phenylditolyl sulfonium, tritolyl sulfonium, diphenylxylyl sulfonium, phenyldixylyl sulfonium, trixylyl sulfonium, cumenyldiphenyl sulfonium, dicumenylphenyl sulfonium, tricumenyl sulfonium, mesityldiphenyl sulfonium, dimesitylphenyl sulfonium, trimesityl sulfonium, methoxyphenyldiphenyl sulfonium, phenylthiophenyldiphenyl sulfonium, naphthyldimethyl sulfonium, hydroxynaphthyldimethyl sulfonium, dihydroxynaphthyldimethyl sulfonium, and S-(naphthoyl) thiolanium.

Specific examples of phosphonium compound are tetraphenyl phosphonium, tetratolyl phosphonium, tetracumenyl phosphonium, tetramesityl phosphonium, trimethylphenyl phosphonium and naphthyltrimethyl phosphonium.

Specific examples of selenonium compound are triphenyl selenonium, diphenyltolyl selenonium, phenylditolyl selenonium, tritolyl selenonium, diphenylxylyl selenonium, phenyldixylyl selenonium, trixylyl selenonium, cumenyldiphenyl selenonium, dicumenylphenyl selenonium, tricumenyl selenonium, mesityldiphenyl selenonium, dimesitylphenyl selenonium, trimesityl selenonium and naphthyldimethyl selenonium.

Specific examples of Lewis acid counter anion are hexafluorophosphate, hexafluoroarsenate, hexafluoroantimonate, tetrafluoroborate, hexachloroantimonate, perchlorate, benzene sulfonate, p-toluene sulfonate, methane sulfonate, ethane sulfonate, propane sulfonate, butane sulfonate, pentane sulfonate, hexane sulfonate, trifluoromethane sulfonate, pentafluoroethane sulfonate, heptafluoropropane sulfonate, nonafluorobutane sulfonate, camphor sulfonate, naphthalene sulfonate, phenanthrene sulfonate, anthracene sulfonate, dimethoxyanthracene sulfonate, anthraquinone sulfonate, cyclohexane sulfonate, fluorosulfonate, difluorosulfonate, chloride, bromide, fluoride, nitrate and sulfate.

Specific examples of hydroxyl compound are nitrophenol, dinitrophenol, trifluoromethyl phenol, nitrobenzyl alcohol, dinitrobenzyl alcohol, benzoin, 1-benzoyl-1-phenylethylene glycol, benzoylmethoxy methanol, benzoyldimethoxy methanol, dihydroxybenzene, trihydroxybenzene, naphthol, dihydroxy naphthalene, hydroxyanthracene, dihydroxyanthracene, hydroxydimethoxyanthracene, hydroxyanthraquinone, dihydroxybiphenyl, dihydroxydiphenylmethane, dihydroxydiphenylpropane, dihydroxydiphenyl ether, dihydroxydiphenyl sulfone, hydroxybenzophenone, dihydroxybenzophenone, trihydroxybenzophenone, tetrahydroxybenzophenone, phenolphthalein and cresolphthalein.

Specific examples of N-hydroxyl compound are benzaldoxime, nitrobenzaldoxime, dinitrobenzaldoxime, trifluorobenzaldoxime, methoxybenzaldoxime, dimethoxybenzaldoxime, dimethylaminobenzaldoxime, naphthalenealdoxime, phenanthrenealdoxime, anthracenealdoxime, pyridinealdoxime, quinolinealdoxime, furanaldoxime, thiophenealdoxime, α-cyanobenzaldoxime, α-cyano-4-methoxybenzaldoxime, acetophenoneoxime, benzophenoneoxime, N-hydroxysuccinimide, N-hydroxyglutarimide, N-hydroxymaleimide, N-hydroxycrotonimide, N-hydroxyphthalimide, N-hydroxynaphthalimide, N-hydroxynaphthalene-2,3-dicarboxyimide, N-hydroxycyclohexanedicarboxyimide, N-hydroxycyclohexenedicarboxyimide, N-hydroxy-5-norbornene-2,3-dicarboxyimide and N'-hydroxypyridine-2,3-dicarboxyimide.

Specific examples of sulfonic ester are benzene sulfonic ester, p-toluene sulfonic ester, methane sulfonic ester, ethane sulfonic ester, propane sulfonic ester, butane sulfonic ester, pentane sulfonic ester, hexane sulfonic ester, trifluoromethane sulfonic ester, pentafluoroethane sulfonic ester, heptanefluoropropane sulfonic ester, nonafluorobutane sulfonic ester, camphor sulfonic ester, naphthalene sulfonic ester, phenanthrene sulfonic ester, anthracene sulfonic ester, dimethoxyanthracene sulfonic ester, anthraquinone sulfonic ester, 2-diazo-1-naphthol-4-sulfonic ester, 2-diazo-1-naphthol-5-sulfonic ester and cyclohexane sulfonic ester.

Specific examples of sulfone compound are diphenyl disulfone, ditolyldisulfone, dixylyldisulfone, dimethoxydiphenyldisulfone, dinitrodiphenyldisulfone, dichlorodiphenyldisulfone, bis(phenylsulfonyl)methane, bis(tolylsulfonyl)methane, bis(xlylsulfonyl)methane, bis(methoxyphenylsulfonyl)methane, bis(nitrophenylsulfonyl)diazomethane, bis(chlorosulfonyl)methane, bis(phenylsulfonyl)methane, bis(tolylsulfonyl)diazomethane, bis(xlylsulfonyl)diazomethane, bis(methoxyphenylsulfonyl)diazomethane, bis(nitrophenylsulfonyl)diazomethane and bis(chlorosulfonyl)diazomethane.

Specific examples of an organic halogen compound having a polychloroalkyl or polybromoalkyl group are 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzodioxole-4-yl)-4,6-bis(trichloromethyl)-1,3,5-triazine, 2-styryl-4,6-bis(trichloromethyl)-1,3,5-triazine, 2-(2-methoxystyryl)-4,6-bis(trichloromethyl)-1,3,5-triazine, 2-(4-methoxystyryl)-4,6-bis(trichloromethyl)-1,3,5-triazine, 2-(2,4-dimethoxystyryl)-4,6-bis(trichloromethyl)-1,3,5-triazine, 2-(3,4-dimethoxystyryl)-4,6-bis(trichloromethyl)-1,3,5-triazine, 2-(3,4,5-trimethoxystyryl)-4,6-bis(trichloromethyl)-1,3,5-triazine, 2-(4-ethoxystyryl)-4,6-bis(trichloromethyl)-1,3,5-triazine, 2-(4-propoxystyryl)-4,6-bis(trichloromethyl)-1,3,5-triazine, 2-(4-butoxystyryl)-4,6-bis(trichloromethyl)-1,3,5-triazine, 2-(4-pentoxystyryl)-4,6-bis(trichloromethyl)-1,3,5-triazine, 2-(4-dimethylaminostyryl)-4,6-bis(trichloromethyl)-1,3,5-triazine, 2-(4-diethylaminostyryl)-4,6-bis(trichloromethyl)-1,3,5-triazine, 2-(2-methyl-4-diethylaminostyryl)-4,6-bis(trichloromethyl)-1,3,5-triazine, 2-(2-furylvinyl)-4,6-bis(trichloromethyl)-1,3,5-triazine, 2-(5-methyl-2-furilvinyl)-4,6-bis(trichloromethyl)-1,3,5-triazine, and [4,6-bis(trichloromethyl)-1,3,5-triazine-2-yl aminoethyl]trimethyl ammonium methanesulfonate.

These photo-acid generating agents may be employed singly or in combination of two or more kinds at a mixing ratio falling within the range of not less than 0.01 molar equivalent, more preferably in the range of 0.02 to 1.0 molar equivalent, and most preferably in the range of 0.05 to 0.5 molar equivalent per molar equivalent of repeating unit of a termosetting polymer. The reason for limiting the range of mixing ratio of the photo-acid generating agents is as follows. Namely, if the mixing ratio of the photo-acid generating agents is less than the lower limit, the decomposition of the latent heat cure accelerator may become insufficient, thereby failing to obtain a sufficient resolution, whereas if the mixing ratio of the photo-acid generating agents exceed over the upper limit, a prominent thinning of the film may be resulted so that it would be difficult to form a clear thin film.

According to this photosensitive heat cure accelerator, the effects thereof are generated from the combination of the aforementioned latent heat cure accelerator and the aforementioned photo-acid generating agent.

In the case of the compounds constituting the latent heat cure accelerating agent of Group D, since the hydroxyl group or imino group thereof is blocked by a protective substituent group which can be eliminated by an acid, it is substantially not provided with heat cure accelerating property (cyclodehydration reaction-accelerating property). However, this latent heat cure accelerating agent is designed such that when it is employed in combination with a photo-acid generating agent, an acid is generated from the photo-acid generating agent upon being irradiated with light, thus allowing the protective substituent group of the latent heat cure accelerating agent to be eliminated whereby making it possible to exhibit a heat cure accelerating property (cyclodehydration reaction-accelerating property).

These latent heat cure accelerating agents are designed to be added to a solution of a thermosetting polymer precursor such as a polyimide precursor (polyamic acid), which is designed to be heat-cured through a cyclodehydration, whereby obtaining a negative photosensitive resin composition which is capable of forming a fine pattern through a sequence of process comprising coating, exposure, PEB (post exposure bake) and developing steps.

When the following acid-generating type photosensitive heat cure accelerators are employed as a photo-acid generating agent to be incorporated into the aforementioned fourth negative photosensitive resin composition, the heat cure capability of the resin composition can be further promoted.

These acid-generating type photosensitive heat cure accelerators are constituted by a compound which is capable of reacting with ambient water under an irradiation of light, thereby being decomposed into a compound exhibiting a heat cure accelerating property and a sulfonic compound.

These acid-generating type photosensitive heat cure accelerators can be classified into the following four kinds as explained below.

A first kind (PAC1) of the acid-generating type photosensitive heat cure accelerators is a compound represented by the following general formula (14).

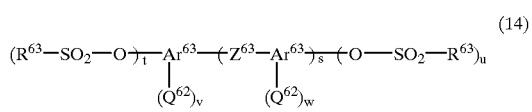

wherein $Ar^{63}$s may be the same or different and are individually a substituted or unsubstituted aromatic hydrocarbon group or a substituted or unsubstituted aromatic hetrocyclic group; $Z^{63}$s may be the same or different and are individually a bivalent organic group or a single bond; $Q^{62}$s may be the same or different and are individually hydroxyl group, carboxyl group, carboxyalkyl group, sulfo group, sulfoalkyl group, substituted or unsubstituted amino group, substituted or unsubstituted aminoalkyl group or mercapto group; $R^{63}$s may be the same or different and are individually a substituted or unsubstituted aliphatic hydrocarbon group, a substituted or unsubstituted alicyclic hydrocarbon group, a substituted or unsubstituted aromatic hydrocarbon group, or a substituted or unsubstituted heterocyclic group; s is an integer of 0 to 4; t is an integer of 1 to 5; u is an integer of 0 to 5; v and w are an integer of 0 to 4; a total of v and w is 2 or less; and a total of t, u, v and w is 2 or more.

As for the $Ar^{63}$ in this general formula (14), the same kinds of group as employed for the $Ar^{61}$ in the aforementioned general formula (12) can be employed. Namely, the same kinds of substituted or unsubstituted aromatic hydrocarbon group or substituted or unsubstituted aromatic hetrocyclic group as employed for the $Ar^{61}$ can be employed as this $Ar^{63}$.

As for the bivalent organic group to be introduced into the $Z^{63}$, the same kinds of organic group as employed for the $X^{61}$ in the aforementioned general formula (12) can be employed.

Specific examples of the unsubstituted aliphatic hydrocarbon group to be introduced as the $R^{63}$ in the aforementioned general formula (14) are methyl, ethyl, propyl, isopropyl, butyl, isobutyl, sec-butyl, tert-butyl, pentyl, tert-pentyl, isopentyl, neopentyl, hexyl, isohexyl, heptyl, octyl, nonyl, decyl, vinyl, allyl, isopropenyl, propenyl, methallyl, crotyl, butenyl, pentenyl, butadienyl, ethynyl, propynyl, butynyl and pentynyl. These unsubstituted aliphatic hydrocarbon groups may be substituted by various kinds of the aforementioned Group (a) characteristic group.

Specific examples of the alicyclic hydrocarbon group to be introduced as the $R^{63}$ in the aforementioned general formula are cyclopropyl, cyclobutyl, cyclopentyl, cyclohexyl, cycloheptyl, cyclooctyl, cyclopentenyl, cyclohexenyl, cycloheptenyl, cyclooctenyl, cyclopentadienyl, cyclohexadienyl, menthanyl, menthenyl, menthadienyl, norbornanyl, norbornenyl and camphoryl. These unsubstituted alicyclic hydrocarbon groups may be substituted by various kinds of the aforementioned Group (a) characteristic group.

As for the substituted or unsubstituted aromatic hydrocarbon group or substituted or unsubstituted aromatic hetrocyclic group to be employed for the $R^{63}$ in this general formula (14), the same kinds of group as employed for the $Ar^{63}$ can be employed.

A second kind (PAC2) of the acid-generating type photosensitive heat cure accelerators is a nitrogen-containing heterocyclic compound represented by the following general formula (15).

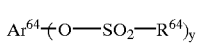

wherein $Ar^{64}$ is a substituted or unsubstituted nitrogen-containing aromatic heterocyclic ring having a pyridine type nucleus nitrogen atom (=N—); $R^{64}$s may be the same or different and are individually a substituted or unsubstituted aliphatic hydrocarbon group, alicyclic hydrocarbon group, aromatic hydrocarbon group or aromatic hetrocyclic group; and y is an integer of 1 to 5.

As for the $Ar^{64}$ in this general formula (15), the same kinds of group as employed for the $Ar^{62}$ in the aforementioned general formula (13) can be employed. Namely, the same kinds of substituted or unsubstituted nitrogen-containing aromatic heterocyclic group having a pyridine type nucleus nitrogen atom as employed for the $Ar^{62}$ can be employed as this $Ar^{64}$.

As for the $R^{64}$, the same kinds of group as employed for the $R^{63}$ in the aforementioned general formula (14) can be employed. Namely, the same kinds of substituted or unsubstituted aliphatic hydrocarbon group, alicyclic hydrocarbon group, aromatic hydrocarbon group or aromatic hetrocyclic group as employed for the $R^{63}$ in the aforementioned general formula (14) can be employed as this $R^{64}$ in the general formula (15).

A third kind (PAC3) of the acid-generating type photosensitive heat cure accelerator is consisted of a sulfonic amide wherein the hydrogen atom of at least one cyclic imino group (>NH) thereof is substituted by sulfonyl group. More specifically, it is consisted of a nitrogen-containing hetrocyclic compound wherein the hydrogen atom of at least one cyclic imino group (>NH) of a substituted or unsubstituted nitrogen-containing hetrocyclic ketone compound (a ring-fused or unfused imidazolone, imidazolinedion, pyrazolone, pyrazolinedione, thiazolone, thiazolinedione, pyridone, pyridazinone, pyridazinedione, pyrimidinone, pyrimidinedione, pyrazinone or pyrazinedione) is protected with a sulfonyl group.

Examples of unsubstituted nitrogen-containing hetrocyclic ketone compound are 2-imidazolone, 5-imidazolone, 2-benzimidazolone, 2,4-imidazolinedion, 3-pyrazolone, 5-pyrazolone, 3,5-pyrazolinedione, 3-indazolone, 2-thiazolone, 2-benzothiazolone, 2-pyridone, 4-pyridone, 2-quinolone, 4-quinolone, 1-isoquinolone, 3-isoquinolone, 9-acridinone, 6-phenanthridinone, 3-pyridazinone, 4-pyridazinone, 3,6-pyridazinedione, 3-cinnolinone, 4-cinnolinone, 1-phthaladinone, 1,4-phthaladinedione, 2-pyrimidinone, 4-pyrimidinone, uracil, barbituric acid, 2-quinazolinone, 4-quinazolinone, 2,4-quinazolinedione, 2-pyrazinone, 2,4-pyrazinedione, 2-quinoxalinone and 2,3-quinoxalinedione.

As for the characteristic group that is to be introduced into these unsubstituted nitrogen-containing heterocyclic ketone compounds thereby to form a substituted nitrogen-containing nitrogen-containing heterocyclic ketone compound, it is possible to employ the same kinds of characteristic group as exemplified in the aforementioned Group (b) characteristic group.

As for the sulfonyl group which is capable of substituting for the hydrogen atom of at least one cyclic imino group (>NH) of the aforementioned substituted or unsubstituted nitrogen-containing heterocyclic ketone compounds, it is possible to employ benzene sulfonyl group, p-toluene sulfonyl group, methane sulfonyl group, ethane sulfonyl group, propane sulfonyl group, butane sulfonyl group, pentane sulfonyl group, hexane sulfonyl group, trifluoromethane sulfonyl group, pentafluoroethane sulfonyl group, heptafluoropropane sulfonyl group, nonafluorobutane sulfonyl group, camphor sulfonyl group, naphthalene sulfonyl group, phenathrene sulfonyl group, anthracene sulfonyl group, dimethoxyanthracene sulfonyl group, anthraquinone sulfonyl group, 2-diazo-1-naphthol-4-sulfonyl group, 2-diazo-1-naphthol-5-sulfonyl group, and cyclohexane sulfonyl group.

A fourth kind (PAC4) of the acid-generating type photosensitive heat cure accelerator is consisted of a sulfonic ester (sulfonate) wherein the hydrogen atom of at least one N-hydroxyl group (>N—OH) of an N-hydroxyl nitrogen-containing heterocyclic ketone compound is substituted by sulfonyl group. As for the N-hydroxyl nitrogen-containing heterocyclic ketone compound to be employed herein, it may be substituted or unsubstituted, or ring-fused or unfused. For example, it is possible to employ N-hydroxypyridone, N-hydroxypyridazinone, N-hydroxypyridazinedione, N,N'-dihydroxypyridazinedione, N-hydroxypyrimidinone, N-hydroxypyrimidinedione, N,N'-dihydroxypyrimidinedione, N-hydroxypyrazinone, N-hydroxypyrazinedione, N,N'-dihydroxypyrazinedione, N-hydroxymaleimide, N-hydroxysuccinimide, N-hydroxynadicimide, etc.

As for the unsubstituted N-hydroxy nitrogen-containing heterocyclic ketone compound, it is possible to employ, for example, N-hydroxy-2-pyridone, N-hydroxy-4-pyridone, N-hydroxy-2-quinolone, N-hydroxy-4-quinolone, N-hydroxy-1-isoquinolone, N-hydroxy-3-isoquinolone, N-hydroxy-9-acridinone, N-hydroxy-6-phenanthridinone, N-hydroxy-3-pyridazinone , N-hydroxy-4-pyridazinone, N-hydroxy-3,6-pyridazinedione, N,N'-dihydroxy-3,6-pyridazinedione, N-hydroxy-3-cinnolinone, N-hydroxy-4-cinnolinone, N-hydroxy-1-phthaladinone, N-hydroxy-1,4-phthaladinedione, N,N'-dihydroxy-1,4-phthaladinedione, N-hydroxy-2-pyrimidinone, N-hydroxy-4-pyrimidinone, N-hydroxy-2,4-pyrimidinedione, N,N'-dihydroxy-2,4-pyrimidinedione, N-hydroxy-2-quinazolinone, N-hydroxy-4-quinazolinone, N-hydroxy-2,4-quinazolinedione, N,N'-dihydroxy-2,4-quinazolinedione, N-hydroxy-2-pyrazinone, N-hydroxy-2,4-pyrazinedione, N,N'-dihydroxy-2,4-pyrazinedione, N-hydroxy-2-quinoxalinone, N-hydroxy-2,3-quinoxalinedione, N,N'-dihydroxy-2,3-quinoxalinedione, N-hydroxymaleimide, N-hydroxysuccinimide, N-hydroxynadicimide, N-hydroxyphthal imide, N-hydroxynaphthalene-1,2-dicarboxyimide, N-hydroxynaphthalene-2,3-dicarboxyimide, N,N'-dihydroxy pyromellitic diimide, N,3-dihydroxyphthalimide, N,4-dihydroxyphthalimide, N,N'-dihydroxybiphenyl-3,3',4,4'-tetracarboxydiimide, oxy-4,4'-bis(N-hydroxyphthalimide), sulfonyl-4,4,-bis(N-hydroxyphthalimide), carbonyl-4,4'-bis(N-hydroxyphthalimide), methylene-4,4'-bis(N-hydroxyphthalimide), 2,2-propylidene-4,4'-bis(N-hydroxyphthalimide), 1,1,1,3,3,3-hexafluoro-2,2-propylidene-4,4'-bis(N-hydroxyphthalimide), N-hydroxycyclohexane-1,2-dicarboxyimide, N,N'-dihydroxycyclohexane-1,2,4,5-tetracarboxydiimide, N-hydroxyendomethylene tetrahydrophthalimide, and N,N'-dihydroxybicyclo[2,2,2]oct-7-en-2,3,5,6-tetracarboxydiimide.

These unsubstituted N-hydroxy nitrogen-containing heterocyclic ketone compounds may be substituted by any of characteristic groups which are exemplified in the aforementioned Group (b) characteristic group.

As for the sulfonyl group which is capable of substituting for the hydrogen atom of at least one N-hydroxyl group (>N—OH) of the aforementioned substituted or unsubstituted N-hydroxyl nitrogen-containing heterocyclic ketone compounds, it is possible to employ benzene sulfonyl group, p-toluene sulfonyl group, methane sulfonyl group, ethane sulfonyl group, propane sulfonyl group, butane sulfonyl group, pentane sulfonyl group, hexane sulfonyl group, trifluoromethane sulfonyl group, pentafluoroethane sulfonyl group, heptafluoropropane sulfonyl group, nonafluorobutane sulfonyl group, camphor sulfonyl group, naphthalene sulfonyl group, phenathrene sulfonyl group, anthracene sulfonyl group, dimethoxyanthranene sulfonyl group, anthraquinone sulfonyl group, 2-diazo-1-naphthol-4-sulfonyl group, 2-diazo-1-naphthol-5-sulfonyl group, and cyclohexane sulfonyl group.

In the case of the compound constituting the acid-generating type photosensitive heat cure accelerating agent of the aforementioned (PAC1) to (PAC4), since the hydroxyl group or imino group thereof is blocked by a sulfonyl group, it is substantially not provided with heat cure accelerating property (cyclodehydration reaction-accelerating property) under a condition where light is not irradiated thereto. However, this compound is designed such that it reacts with ambient water as it is irradiated with light, thereby being decomposed into a heat cure accelerating agent exhibiting a heat cure accelerating property (cyclodehydration reaction-accelerating property) and a sulfonic acid compound.

When this acid-generating type photosensitive heat cure accelerator is employed together with the aforementioned latent heat cure accelerating agent, a sulfonic acid compound is generated at first from the acid-generating type photosensitive heat cure accelerator upon irradiation of light, thus causing the protective substituent group of the latent heat cure accelerating agent to be eliminated therefrom. Then, due to the generation of the heat cure accelerating agent, the light exposure portion is enabled to exhibit a further excellent heat cure accelerating property (cyclodehydration reaction-accelerating property).

These photosensitive heat cure accelerating agents are designed to be added to a solution of a thermosetting polymer precursor such as a polyimide precursor (polyamic acid), which is designed to be heat cured through a cyclodehydration, whereby obtaining a negative photosensitive resin composition which is capable of forming a fine pattern through a sequence of process comprising coating, exposure, PEB (post exposure bake) and developing steps.

These acid-generating type photosensitive heat cure accelerators may be employed singly or in combination of two or more kinds at a mixing ratio falling within the range of not less than 0.01 molar equivalent, more preferably in the range of 0.02 to 2.0 molar equivalent, and most preferably in the range of 0.05 to 1.0 molar equivalent per molar equivalent of repeating unit of a termosetting polymer. The reason for limiting the range of mixing ratio of the acid-generating type photosensitive heat cure accelerator is as follows. Namely, if the mixing ratio of this heat cure accelerator is less than the lower limit, the photo-sensitivity of a layer of the resultant resin may be insufficient, thereby failing to obtain a sufficient resolution, whereas if the mixing ratio of this acid-generating type photosensitive heat cure accelerator exceeds over the upper limit, a prominent thinning of the film may be resulted so that it would be difficult to form a clear thin film.

If desired in view of enhancing the sensitivity of the aforementioned photosensitive heat cure accelerators, a sensitizer may be added to the photosensitive resin composition of this invention. Specific examples of such a sensitizer are acetophenone, benzophenone, benzoin, 2-methylbenzoin, benzoin isopropyl ether, anthrone, 1,9-benzoanthrone, anthracene, perylene, pyrene, benzanthracene, coronene, phenanthrenequinone, pyrene-1,6-quinone, 9-fluorenone, anthraquinone, 1,2-benzoanthraquinone, anthoanthrone, 2-chlorobenzanthraquinone, 2-bromobenzanthraquinone, 2-chloro-1,8-phthaloylnaphthalene, Michler's ketone, 4,4'-bis(diethylamino)benzophenone, benzoin methyl ether, benzil dimethyl ketal, 2-methyl-1-[4-(methylthio)phenyl]-2-morpholino-1-propane, 1-hydroxycyclohexyl phenyl ketone, ethyl N,N-dimethylaminobenzoate, acridine, cyanoacridine, nitropyrene, 1,8-dinitropyrene, 5-nitroacenaphthene, 2-nitrofluorene, 2-tertiary-butyl-9,10-anthraquinone, N-phenylmaleimide, 9,10-dimethoxyanthracene, 2-ethyl-9,10-dimethoxyanthracene, phenothiazine, thioxanthone, 2-chlorothioxanthone, 3,3'-carbonyl bis[7-(diethylamino)coumarin], 3-(2-benzothiazolyl)-7-(diethylamino)coumarin, 3-(2-benzimidazolyl)-7-(diethylamino)coumarin, 2,3,6,7-tetrahydro-1,1,7,7-tetramethyl-10-(benzothiazolyl)-11-oxo-1H,5H,11H-[1]benzopyrano[6,7,8-ij]quinolizine, 2-{2-[4-(dimethylamino)phenyl]ethenyl}naphth[1,2-d]thiazole, 2-{2-[6-(1-ethyl-1,2,3,4-tetrahydro-2,2,4,7-tetramethyl) quinolyl]ethenyl}naphth[1,2-d]thiazole, 3-ethyl-5-[2-(3-ethyl-2(3H)-benzothiazolidene)ethylidene]-2-thioxo-4-oxazolidinone, 5-[2-(1,3-dihydro-1,3,3-trimethyl-2H-indol-2-ylidene)ethylidene]-3-ethyl-2-thioxo-4-oxazolidinone, 2-[7-(1,3-dihydro-1,1,3,3-trimethyl-2H-indol-2-ylidene)-1, 3,5-heptatrienyl]-3H-indolium butyltriphenylborate, 2-{(3-[(1,3-dihydro-1-ethyl-3,3,5-trimethyl-2H-indol-2-ylidene) methyl]-2-hydroxy-4-oxo-2-cyclobuten-1-ylidene)methyl}-1-methyl-3,3,5-trimethyl-3H-indolium (betaine), acridine orange, acridine yellow, phosphine R, benzoflavine and cetofurabine T.

These sensitizers may be employed singly or in combination of two or more kinds at a mixing ratio falling within the range of not less than 0.01 molar equivalent, more preferably not less than 0.1 molar equivalent, most preferably from 0.1 to 5.0 molar equivalent, each based on one molar equivalent of the repeating unit of the termosetting polymer. If the mixing ratio of this sensitizer falls outside this range, the developing property and film-forming property of the resin composition may be badly affected.

If desired, a dyestuff, a surfactant, an adhesion-enhancing agent (for example, a coupling agent such as aminosilane and epoxysilane), and an alkali-soluble resin may be added to the photosensitive resin composition of this invention. Specific examples of such an alkali-soluble resin are poly-p-vinylphenol, poly-o-vinylphenol, poly-m-isopropenylphenol, m- or p-cresolnovolak resin, xylenolnovolak resin, a copolymer of p-vinylphenol and methyl methacrylate, a copolymer of p-isopropenylphenol and maleic anhydride, and polymethacrylate.

The photosensitive resin composition of this invention can be easily prepared by adding a photosensitive heat cure accelerator which is capable of exhibiting a heat cure-accelerating property (a cyclodehydration reaction-accelerating property) upon being irradiated with light to a solution, in an organic solvent, of a thermosetting polymer precursor such as polyamic acid which is capable of being thermally cured through a cyclodehydration reaction. If desired, this photosensitive resin composition may be further diluted with a suitable solvent. Further, it may be also possible to mix the solution of this photosensitive resin composition with a sensitizing agent, a dyestuff, a surfactant or an alkali-soluble resin. If desired, the addition of these additives to the photosensitive resin composition may be carried out through a filtration so as to remove any fine impurities included therein. Namely, the photosensitive resin composition according to this invention can be easily prepared without undergoing any troublesome step and without any impurities mingling into the photosensitive resin composition.

Examples of organic solvent to be used in the preparation of the aforementioned photosensitive resin composition are N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphosphoric triamide, N-methyl-ε-caprolactam, N-acetyl-ε-caprolactam, 1,2-dimethoxyethane, 1,2-diethoxyethane, bis(2-methoxyethyl)ether, bis(2-ethoxyethyl)ether, 1,2-bis(2-methoxyethoxy)ethane, bis[2-(2-methoxyethoxy)ethyl] ether, (2-acetoxyethyl)(2-methoxyethyl)ether, (2-acetoxyethyl)(2-ethoxyethyl)ether, methyl 3-methoxypropionate, tetrahydrofuran, 1,3-dioxane, 1,3-dioxolane, 1,4-dioxane, pyrroline, pyridine, picoline, dimethylsulfoxide, sulfolane, γ-butyrolactone, propylene carbonate, phenol, cresol, acetone, methyl ethyl ketone, methyl isobutyl ketone; cyclohexanone, acetonylacetone, methyl Cellosolve, ethyl Cellosolve, butyl Cellosolve, methyl Cellosolve acetate, ethyl Cellosolve acetate, butyl Cellosolve acetate, ethyl acetate, butyl acetate, isoamyl acetate, xylene, toluene, chlorobenzene, ethylene glycol and propylene glycol.

These organic solvents may be employed singly or in combination of two or more kinds.

Followings are detailed explanations on the method of forming a pattern by making use of a negative photosensitive resin composition according to this invention.

First of all, a negative photosensitive resin composition prepared as explained above is coated by way of spin coating method for instance on the surface of a substrate, and then dried by heating it with a hot plate for instance at temperature of not more than 180° C., more preferably not more than 120° C. thereby to obtain a resin layer. Since the patterning of the photosensitive resin composition of this invention is carried out by taking advantage of a difference in cyclodehydration reaction ratio between the exposure portions and non-exposure portions that will be resulted from PEB (post exposure bake), the resin layer may be entirely cured and the resolution of the pattern may be deteriorated if the heat drying step of the resin layer is performed at a temperature exceeding over the aforementioned upper limit.

Next, a photomask having a predetermined pattern is superimposed on the resin layer formed as described above, and then a visible light, infrared ray, ultraviolet ray or an energy beam such as EB or X-ray is irradiated to the surface of the resin layer through the photomask, thereby exposing the predetermined regions of the resin layer to light. The method of this light exposure may be carried out by means of a contact exposure system or by means of a projection exposure system.

As a result of this light exposure, the heat cure-accelerating property (or cyclodehydration reaction-accelerating property) of the photosensitive heat cure accelerator is selectively effected on the light exposure portions of the resin layer, and hence the curing of unexposed portions of the resin layer can be inhibited from being cured even if the heat-treatment is performed after the light exposure. Namely, in the case of the photosensitive heat cure accelerator of the Group A type, the heat cure-accelerating property (or cyclodehydration reaction-accelerating property) is effected through the elimination of the protective substituent group blocking the hydroxyl group or imino group; in the case of the photosensitive heat cure accelerator of the Group B type, the heat cure-accelerating property (or cyclodehydration reaction-accelerating property) is effected through the production of a compound or skeleton having a heat cure accelerating property, which is resulted from the transition of the N-oxide group; in the case of the photosensitive heat cure accelerator of the Group C type, the heat cure-accelerating property (or cyclodehydration reaction-accelerating property) is effected through the generation of an acid; and in the case of the photosensitive heat cure accelerator of the Group D type, the heat cure-accelerating property (or cyclodehydration reaction-accelerating property) is effected through the elimination of the protective substituent group blocking the hydroxyl group or imino group by the effect of an acid generated from the photo-acid generating agent.

Next, in the course of the light exposure process or in subsequent to the light exposure process, the resin layer is subjected to a heat-treatment at a temperature ranging from 50 to 200° C. by making use of a hot plate for instance. Since the heat cure-accelerating property (or cyclodehydration reaction-accelerating property) of the photosensitive heat cure accelerator is already effected at the light exposure portions of the resin layer, a thermal cure via the cyclodehydration of polyamic acid is further advanced by this heat treatment if a polyamic acid (a polyimide precursor) is employed as a base polymer, thereby forming a polyimide layer. By contrast, the curing of the polyamic acid is substantially suppressed at the unexposed portions, thus bringing about a marked difference in solubility in a developing solution of the polymer layer between the exposure portions and non-exposure portions. The temperature of this heat treatment should more preferably be in the range of from 80 to 160° C. If the resin layer is heated at a low temperature of less than the predetermined temperature in this heat treatment, it is hardly possible to sufficiently utilize the cure-accelerating property of the photosensitive heat cure accelerator, so that the thermal curing of the polymer would hardly proceed even at the light exposure portions. On the other hand, if the resin layer is heated at a temperature higher than the predetermined temperature in this heat treatment, the curing of the polymer would prominently proceed even at the unexposed portions. Therefore, if the temperature of this heat treatment falls outside the aforementioned range, the resolution of the resultant pattern would be deteriorated, thus making it difficult to form a fine pattern. The time required in this heat treatment is, though dependent on the temperature of this heat treatment, generally in the range of 0.5 to 60 minutes, more preferably in the range of 0.5 to 30 minutes. If the time for this heat treatment is too short, the thermal curing at the exposure portions would not proceed sufficiently, whereas if the time for this heat treatment is too long, the thermal curing of the polymer would markedly proceed even at the unexposed portions. Therefore, if the time for this heat treatment falls outside the aforementioned range, the resolution of the resultant pattern would be deteriorated, thus making it difficult to form a fine pattern.

After this heat treatment, the resin layer is subjected to a development process by means of a dipping method, a spray method or a paddle method, using a suitable developing solution. As for the developing solution to be utilized in this method, an organic solvent type developing solution or an aqueous alkaline solution type developing solution may be employed.

Specific examples of such an organic solvent type developing solution are polar organic solvents such as N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphosphoric triamide, dimethylsulfoxide, N-methyl-$\epsilon$-caprolactam and N-acetyl-$\epsilon$-caprolactam. These solvents may be employed singly or as a mixed solution together with a poor solvent for the polymer, such as methanol, ethanol, isopropyl alcohol, benzene, toluene, xylene, methyl Cellosolve or water.

Specific examples of such an aqueous alkaline solution type developing solution are an aqueous solution of organic alkali, such as tetramethyl ammonium hydroxide, tetraethyl ammonium hydroxide, choline, propylamine, butylamine, monoethanolethylenediamine, trimethylenediamine, trimethylammonium hydroxide, hydrazine and trimethylhydroxyethylammonium hydroxide; and an aqueous solution of inorganic alkali, such as sodium hydroxide, potassium hydroxide, lithium hydroxide, sodium carbonate, potassium carbonate, ammonium carbonate, hydrogen potassium carbonate, ammonium phosphate and ammonia. These aqueous solutions may be mixed with an organic solvent such as methanol, ethanol, isopropyl alcohol, acetone, ethylene glycol, ethyl Cellosolve, butyl Cellosolve, diethylene glycol, diethylene glycol monoethyl ether, N-methylpyrrolidinone, N,N-dimethylformamide, N,N-dimethylacetamide and dimethylsulfoxide.

Although the employment of an organic solvent in the developing process may be advantageous in that the contamination with a metallic impurity can be minimized, it is preferable to employ an aqueous alkaline solution type developing solution in view of safety, sanitation and environment. Furthermore, if an aqueous alkaline solution type developing solution is employed, the swelling of a polymer film pattern can be avoided.

As a result of the developing process as explained, above, the unexposed portions of the resin layer can be dissolved and remove, thus obtaining a negative polymer pattern. In particular, since a photosensitive heat cure accelerator which is capable of exhibiting a heat cure-accelerating property (or cyclodehydration reaction-accelerating property) as it is irradiated with light is mixed in the photosensitive resin composition of this invention, if a polyamic acid (a polyimide precursor) is employed as a base polymer, the cyclodehydration reaction of polyamic acid selectively takes place only at the light exposure portions of the resin layer as a result of the heat treatment after the light irradiation, thereby forming a polyimide layer which is insoluble in the developing solution. By contrast, the curing of the polyamic acid is substantially suppressed at the unexposed portions, since the heat cure-accelerating property (or cyclodehydration reaction-accelerating property) of the photosensitive heat cure accelerator cannot be brought about at the unexposed portions.

Namely, as a result of the heat treatment after the light irradiation, polyimide is formed at the light exposure portions of the resin layer, while polyamic acid is left unchanged at the unexposed portions, thus giving rise to the generation of much difference in solubility to the developing solution between the light-exposed portions and the unexposed portions of the resin layer. As a result, only the unexposed portions of the resin layer is selectively dissolved and removed in the developing process, thereby making it possible to form a fine pattern with high resolution.

It is preferable in view of removing any residue of developing solution to perform a rinsing of the resin layer after the developing process by making use of water, alcohol or acetone. It is also preferable for the purpose of not only drying the developing solution or rinsing solution but also completing the curing of any remaining uncured portions to perform a heat treatment or a vacuum heat treatment at a temperature in the range of 120 to 400° C. It is possible with this heat treatment to accomplish the cyclization reaction of polyamic acid and at the same time to allow any solvent component or decomposed materials of the cure accelerator that may be left remained in the patterned layer to be volatilized or sublimed. As a result, it is possible to obtain a desired polyimide pattern which is excellent in electric properties, heat resistance and adhesion.

It is possible according to the method of this invention to form a polyimide film without the employment of photoresist and to perform the development process with an aqueous alkaline solution, thus obviating any problems involving safety and environmental pollution.

The patterned polyimide film formed in this manner can be used as an insulating material for forming an interlayer insulating film between conductive or semiconductive layers or for forming a wiring insulation film, or as a protecting material such as a passivation film in the manufacture of many kinds of device, e.g. various kinds of electronic parts, a semiconductor element such as an LSI, a high-density printed wiring board, a thin film magnetic head, magnetic bubble memory, a solar cell, a thermal head. It is also possible to utilize the patterned polyimide film formed according to the method of this invention as an optical material for forming an optical waveguide of an optical device, or as an orienting film of liquid crystal device. Since, the patterned polyimide film formed in this manner is excellent in adhesion or bonding to substrate in addition to its inherent properties of high heat resistance and low dielectric constant, it is possible to further improve the reliability of electronic parts.

The negative polymer pattern formed in this manner according to this invention is also applicable to a fine working technique using a photolithography. For example, a negative photosensitive resin composition of this invention may be used for forming a pattern on a predetermined substrate, and then a dry etching or a wet etching is performed in the conventional manner using the aforementioned pattern as an etching mask thereby to carry out the fine working of the substrate. In this case, if a fine working of 3 $\mu$m or less (in line width) is desired, a dry etching method may be preferably employed.

In the case of wet etching method, various kinds of etching solution can be employed depending on the kinds of film to be etched; i.e. an aqueous solution of hydrofluoric acid or an aqueous solution of ammonium fluoride may be employed for etching a silicon oxide film; an aqueous solution of phosphoric acid, an aqueous solution of acetic acid or aqueous solution of nitric acid may be employed for etching an aluminum film; and an aqueous solution of ammonium cerium nitrate may be employed for etching an chromium-based film. In the case of dry etching method, $CF_4$, $C_2F_6$, $CCl_4$, $BCl_3$, $Cl_2$, $HCl$, $H_2$, etc. may be employed as a dry etching gas. These etching gases may be combined if required. The conditions for the etching, i.e. the concentration of a wet etching agent in a reaction chamber, the concentration of a dry etching gas in a reaction chamber, reaction temperature and reaction time are determined depending on the combination of the kind of material on which a pattern is formed and on the kind of a photosensitive resin composition. There is not any particular limitation regarding the method of etching. The pattern formed with a photosensitive resin composition of this invention and remaining on a substrate after an etching may be removed by making use of a release agent (for example, an aqueous solution of hydrazine) or an oxygen gas plasma.

Since a negative pattern is formed through the insolubilization of polymer to developing solution without accompanying the crosslinking of polyamic acid in the method of forming a pattern according to this invention, the thinning of film through the volume shrinkage thereof can be avoided, thereby making it possible to assure the accuracy of pattern. Moreover, since there is not any particular restriction regarding the structure of polyamic acid, i.e. a polyimide precursor, it is possible to easily form a polyimide film pattern which is excellent in electric properties, in heat resistance and in adhesion. Therefore, the photosensitive resin composition of this invention is useful not only for forming an insulating film for various kinds of electronic parts, but also for conducting a fine working on a predetermined substrate.

Followings are detailed explanations on specific examples of this invention. However, these examples should not be construed as limiting the present invention.

Polyamic acid was synthesized as follows by making use of raw materials mixed together at a predetermined mixing ratio (shown in molar equivalent) as shown in the following Table 1. First of all, 50 ml of N,N-dimethylacetamide was placed under an argon gas atmosphere into a separable flask cooled down to −5 to 5° C. by making use of a cooling medium. Then, a predetermined amount of tetracarboxylic dianhydride compound was added to the flask and dissolved with stirring to obtain a solution. Subsequently, a predetermined amount of diamine compound was dissolved in 50 ml of N,N-dimethylacetamide to obtain a solution, which was then slowly dripped into the first mentioned solution by means of a dropping funnel provided with a pressure balance tube and stirred for 4 hours. Then, the resultant solution was further stirred at room temperature to obtain five kinds of polyamic acid, i.e. PAA1 to PAA5.

Then, the inherent viscosity of a 0.5 wt % solution of each of these polyamic acids in N-methyl-2-pyrrolidinone was measured at a temperature of 30° C., the results being shown in Table 1.

The tetracarboxylic dianhydride compounds, diamine compounds and the solvent employed and shown in abbreviation in Table 1 are as follows.

Tetracarboxylic Dianhydride Compound

PMA: Pyromellitic dianhydride.

BNTA: 3,3',4,4'-benzophenonetetracarboxylic dianhydride.

6FTA: 1,1,1,3,3,3-hexafluoro-2,2-propylidene-4,4'-diphthalic dianhydride.

Diamine Compound

ODA: Oxy-4,4'-dianiline.

SNDA: Sulfonyl-3,3'-dianiline.

TSDA: 1,3-bis(3-aminopropyl)-1,1,3,3-tetramethyldisiloxane.

Solvent

DMAC: N,N-dimethylacetamide.

TABLE 1

| | PAA1 | PAA2 | PAA3 | PAA4 | PAA5 |
|---|---|---|---|---|---|
| PMA | 1.00 | — | — | 1.00 | — |
| BNTA | — | 1.00 | — | — | 1.00 |
| 6FTA | — | — | 1.00 | — | — |
| ODA | 0.95 | 0.95 | 0.95 | — | — |
| SNDA | — | — | — | 0.95 | 0.95 |
| TSDA | 0.05 | 0.05 | 0.05 | 0.05 | 0.05 |
| Solvent | DMAC | DMAC | DMAC | DMAC | DMAC |
| Concentration (wt %) | 10.82 | 12.48 | 11.75 | 10.24 | 12.55 |
| Inherent viscosity [dL/g] | 0.92 | 0.98 | 0.88 | 0.82 | 0.86 |

*) 0.5 wt % NMP (N-methyl-2-pyrrolidone) solution Measuring temp.: 30° C.

Then, the polyamic acids obtained as mentioned above were employed for the preparation of negative photosensitive resin compositions of this invention as follows.

EXAMPLE I

In this example, photosensitive heat cure accelerating agents having a protective substituent group which can be eliminated upon irradiation of light were employed.

EXAMPLES I-1 TO I-40

The compounds represented by the aforementioned general formula (1) were employed as a photosensitive heat cure accelerating agent for the preparation of negative photosensitive resin compositions, the characteristics of which were then investigated. Followings are abbreviations of the photosensitive heat cure accelerating agents employed in this example.

NBNP: 1-hydoxy-3-(2-nitrobenzyloxy)naphthalene

NBAP: 3,-hydoxy-5'-(2-nitrobenzyloxy)acetophenone

DNAP: 3'-(2-diazo-1-naphthol-4-sulfonyloxy)-5'-hydroxyacetophenone

DNBM: methyl 3-(2-diazo-1-naphthol-4-sulfonyloxy)-5-hydroxybenzoate

DNDA: 3-(2-diazo-1-naphthol-4-sulfonyloxy)-N,N'-dimethylaniline

3FBP: 2,3,4-tris(formyloxy)benzophenone

3TBP: 2,3,4-tris(trifluoromethanesulfonyloxy)benzophenone

4TBP: 2,3,4,4'-tetrakis(trifluoromethanesulfonyloxy)benzophenone.

As shown in the following Tables 2 to 5, each of the solution of polyamic acid synthesized in the process as mentioned above is mixed with a photosensitive heat cure accelerating agent at a predetermined mixing ratio, and agitated at room temperature to obtain a homogeneous solution. The mixed solution was then filtered with a membrane filter having a pore size of 0.5 $\mu$m, thereby to prepare the photosensitive resin compositions of this invention (Examples I-1 to I-40).

The photosensitive resin compositions thus obtained were then subjected to patterning to evaluate the resolution thereof, the results being summarized in the following Tables 2 and 3. Further, polyimide films were formed using these photosensitive resin compositions to evaluate the adhesivity and heat resistance thereof, the results being shown in the following Tables 4 and 5. In this case, the resolution, adhesivity and heat resistance of the films were evaluated as explained below.

Evaluation of Resolution

First of all, a solution of each photosensitive resin composition was coated on the surface of a silicon wafer 4 inches in diameter by means of a spin-coating method, and then the coated layer was heated (pre-baking) for 10 minutes on a hot plate heated up to 90° C. thereby to form a resin layer having a film thickness of about 5 $\mu$m. Then, the resin layer was exposed through a quartz mask for resolution test to the irradiation of light at a predetermined exposure dose by making use of a light exposure apparatus (PLA-501FA, Canon Co., Ltd.).

After this light exposure, the silicon wafer was heated for 5 minutes (PEB) on a hot plate heated up to 130 to 150° C., thereby heating the resin layer.

Subsequently, the resin layer was dipped in an alkaline developing solution (a 2.38 wt % aqueous solution of tetramethyl ammonium hydroxide) for 60 seconds thereby selectively dissolve and remove the unexposed portions. Thereafter, the resin layer was rinsed with water for 20 seconds.

Finally, the pattern thus obtained was heated for 60 minutes on the hot plate heated to 300° C. so as to thermally cure the pattern, thereby obtaining a polyimide film pattern.

The section of patterned films thus obtained was observed with an electron microscope (SEM) to determine the resolution of the patterned films.

Evaluation of Adhesivity

First of all, a solution of each photosensitive resin composition was coated on the surface of a silicon wafer 4 inches in diameter by means of a spin-coating method, and then the coated layer was heated (pre-baking) for 10 minutes on a hot plate heated up to 90° C. thereby to form a resin layer having a film thickness of about 5 $\mu$m. Then, the resin layer was entirely exposed to the irradiation of light at a predetermined exposure dose by making use of a light exposure apparatus (PLA-501FA, Canon Co., Ltd.).

After this light exposure, the silicon wafer was heated for 5 minutes (PEB) on a hot plate heated up to 130 to 150° C., thereby heating the resin layer.

Then, the resin layer thus obtained was heated for 60 minutes on the hot plate heated to 300° C. thereby obtaining a polyimide film sample.

The evaluation of adhesivity of each sample was performed by heating at first the sample for 24 hours at a temperature of 120° C. in a saturated aqueous vapor of 2 atms. and then by subjecting the sample to a cross-cut adhesion test.

Evaluation of Heat Resistance

Polyimide films were prepared in the same manner as in the case of the samples for the aforementioned adhesivity evaluation. The evaluation of heat resistance was performed by peeling at first the resin layer with a knife and then by measuring the 3 wt %-reduction temperature (in a nitrogen gas stream) of the resin layer by means of thermogravimetric analysis (TGA).

TABLE 2

| | Polyamic acid | Photosensitive heat cure acclerator | *) Amount added | Film thickness ($\mu$m) | Irradiation dosage (mJ/cm$^2$) | PEB temp. (° C.) | Resolution ($\mu$m) |
|---|---|---|---|---|---|---|---|
| Example (I-1) | PAA1 | NBNP | 0.4 | 5.0 | 300 | 135 | 3.5 |
| Example (I-2) | PAA1 | NBAP | 0.4 | 5.0 | 300 | 135 | 3.0 |
| Example (I-3) | PAA1 | DNAP | 0.4 | 5.0 | 150 | 135 | 2.0 |
| Example (I-4) | PAA1 | DNBM | 0.4 | 5.0 | 150 | 135 | 2.5 |
| Example (I-5) | PAA1 | DNDA | 0.4 | 5.0 | 150 | 135 | 2.5 |
| Example (I-6) | PAA1 | 3FBP | 0.4 | 5.0 | 300 | 135 | 3.0 |
| Example (I-7) | PAA1 | 3TBP | 0.4 | 5.0 | 200 | 135 | 2.5 |
| Example (I-8) | PAA1 | 4TBP | 0.4 | 5.0 | 200 | 135 | 2.5 |
| Example (I-9) | PAA2 | DNAP | 0.4 | 5.1 | 150 | 130 | 2.0 |
| Example (I-10) | PAA2 | 3TBP | 0.4 | 5.1 | 200 | 130 | 2.5 |

*) Molar ratio to repeating unit of polyamic acid

TABLE 3

|  | Polyamic acid | Photo-sensitive heat cure acclerator | *) Amount added | Film thickness (μm) | Irradiation dosage (mJ/cm²) | PEB temp. (° C.) | Resolution (μm) |
|---|---|---|---|---|---|---|---|
| Example (I-11) | PAA2 | 4TBP | 0.4 | 5.1 | 200 | 130 | 2.5 |
| Example (I-12) | PAA3 | NBAP | 0.4 | 5.0 | 300 | 130 | 3.0 |
| Example (I-13) | PAA3 | DNAP | 0.4 | 5.0 | 150 | 130 | 2.0 |
| Example (I-14) | PAA3 | 4TBP | 0.4 | 5.0 | 200 | 130 | 2.5 |
| Example (I-15) | PAA4 | NBNP | 0.4 | 5.0 | 300 | 135 | 3.5 |
| Example (I-16) | PAA4 | DNAP | 0.4 | 5.0 | 150 | 135 | 2.0 |
| Example (I-17) | PAA4 | 3TBP | 0.4 | 5.0 | 200 | 135 | 2.5 |
| Example (I-18) | PAA5 | DNBM | 0.4 | 5.1 | 150 | 130 | 2.5 |
| Example (I-19) | PAA5 | DNDA | 0.4 | 5.1 | 150 | 130 | 2.5 |
| Example (I-20) | PAA5 | 3FBP | 0.4 | 5.1 | 300 | 130 | 3.0 |

*) Molar ratio to repeating unit of polyamic acid

TABLE 4

|  | Polyamic acid | Photo-sensitive heat cure acclerator | *) Amount added | Film thickness (μm) | Irradiation dosage (mJ/cm²) | PEB temp. (° C.) | Cross-cut adhesion test | 3% weight reduction temp. |
|---|---|---|---|---|---|---|---|---|
| Example (I-21) | PAA1 | NBNP | 0.4 | 5.0 | 300 | 135 | 0/100 | 505° C. |
| Example (I-22) | PAA1 | NBAP | 0.4 | 5.0 | 300 | 135 | 0/100 | 505° C. |
| Example (I-23) | PAA1 | DNAP | 0.4 | 5.0 | 150 | 135 | 0/100 | 505° C. |
| Example (I-24) | PAA1 | DNBM | 0.4 | 5.0 | 150 | 135 | 0/100 | 505° C. |
| Example (I-25) | PAA1 | DNDA | 0.4 | 5.0 | 150 | 135 | 0/100 | 505° C. |
| Example (I-26) | PAA1 | 3FBP | 0.4 | 5.0 | 300 | 135 | 0/100 | 505° C. |
| Example (I-27) | PAA1 | 3TBP | 0.4 | 5.0 | 200 | 135 | 0/100 | 505° C. |
| Example (I-28) | PAA1 | 4TBP | 0.4 | 5.0 | 200 | 135 | 0/100 | 505° C. |
| Example (I-29) | PAA2 | DNAP | 0.4 | 5.1 | 150 | 130 | 0/100 | 485° C. |
| Example (I-30) | PAA2 | 3TBP | 0.4 | 5.1 | 200 | 130 | 0/100 | 485° C. |

*) Molar ratio to repeating unit of polyamic acid

TABLE 5

|  | Polyamic acid | Photo-sensitive heat cure acclerator | *) Amount added | Film thickness (μm) | Irradiation dosage (mJ/cm²) | PEB temp. (° C.) | Cross-cut adhesion test | 3% weight reduction temp. |
|---|---|---|---|---|---|---|---|---|
| Example (I-31) | PAA2 | 4TBP | 0.4 | 5.1 | 200 | 130 | 0/100 | 485° C. |
| Example (I-32) | PAA3 | NBAP | 0.4 | 5.0 | 300 | 130 | 0/100 | 505° C. |
| Example (I-33) | PAA3 | DNAP | 0.4 | 5.0 | 150 | 130 | 0/100 | 505° C. |
| Example (I-34) | PAA3 | 4TBP | 0.4 | 5.0 | 200 | 130 | 0/100 | 505° C. |
| Example (I-35) | PAA4 | NBNP | 0.4 | 5.0 | 300 | 135 | 0/100 | 490° C. |
| Example (I-36) | PAA4 | DNAP | 0.4 | 5.0 | 150 | 135 | 0/100 | 490° C. |
| Example (I-37) | PAA4 | 3TBP | 0.4 | 5.0 | 200 | 135 | 0/100 | 490° C. |
| Example (I-38) | PAA5 | DNBM | 0.4 | 5.1 | 150 | 130 | 0/100 | 475° C. |
| Example (I-39) | PAA5 | DNDA | 0.4 | 5.1 | 150 | 130 | 0/100 | 475° C. |
| Example (I-40) | PAA5 | 3FBP | 0.4 | 5.1 | 300 | 130 | 0/100 | 475° C. |

*) Molar ratio to repeating unit of polyamic acid

EXAMPLES I-41 TO I-80

The nitrogen-containing heterocyclic ketone compounds whose at least one cyclic imino group (>NH) was substituted by a protective substituent group which can be eliminated upon irradiation of light were employed as a photosensitive heat cure accelerating agent for the preparation of negative photosensitive resin compositions, the characteristics of which were then investigated. Followings are abbreviations of the photosensitive heat cure accelerating agents employed in this example.

NBPY: 1-(2-nitrobenzyl)-4-pyridone
PNPY: 1-phenacyl-4-pyridone
TFPY: 1-(trifluoromethanesulfonyl)-4-pyridone
PIPY: 1-(2-phenylisopropoxycarbonyl)-4-pyridone
NBQN: 1-(2-nitrobenzyl)-4-quinolone
TFQN: 1-(trifluoromethanesulfonyl)-4-quinolone
TFAD: 10-(trifluoromethanesulfonyl)-9-acridinone
NBIM: 1-(2-nitrobenzyl)-2-imidazolone As shown in the following Tables 6 to 9, each of the solution of polyamic acid synthesized in the process as mentioned above is mixed with a photosensitive heat cure accelerating agent at a predetermined mixing ratio, and agitated at room temperature to obtain a homogeneous solution. The mixed solution was then filtered with a membrane filter having a pore size of 0.5 μm, thereby to prepare the photosensitive resin compositions of this invention (Examples I-41 to I-80).

The photosensitive resin compositions thus obtained were then subjected to patterning under the same conditions as mentioned above to evaluate the resolution thereof, the results being summarized in the following Tables 6 and 7. Further, polyimide films were formed using these photosensitive resin compositions in the same manner as mentioned above to evaluate the adhesivity and heat resistance of the films, the results being shown in the following Tables 8 and 9.

TABLE 6

|  | Polyamic acid | Photo-sensitive heat cure acclerator | *) Amount added | Film thickness ($\mu$m) | Irradiation dosage (mJ/cm$^2$) | PEB temp. (° C.) | Resolution ($\mu$m) |
|---|---|---|---|---|---|---|---|
| Example (I-41) | PAA1 | NBPY | 0.4 | 5.0 | 300 | 135 | 3.0 |
| Example (I-42) | PAA1 | PNPY | 0.4 | 5.0 | 300 | 135 | 3.5 |
| Example (I-43) | PAA1 | TFPY | 0.4 | 5.0 | 300 | 135 | 3.0 |
| Example (I-44) | PAA1 | PIPY | 0.4 | 5.0 | 300 | 135 | 3.5 |
| Example (I-45) | PAA1 | NBQN | 0.4 | 5.0 | 200 | 135 | 3.0 |
| Example (I-46) | PAA1 | TFQN | 0.4 | 5.0 | 200 | 135 | 3.0 |
| Example (I-47) | PAA1 | TFAD | 0.4 | 5.0 | 150 | 135 | 3.0 |
| Example (I-48) | PAA1 | NBIM | 0.4 | 5.0 | 300 | 135 | 3.5 |
| Example (I-49) | PAA2 | NBPY | 0.4 | 5.1 | 300 | 130 | 3.0 |
| Example (I-50) | PAA2 | PNPY | 0.4 | 5.1 | 300 | 130 | 3.5 |

*) Molar ratio to repeating unit of polyamic acid

TABLE 7

|  | Polyamic acid | Photo-sensitive heat cure acclerator | *) Amount added | Film thickness ($\mu$m) | Irradiation dosage (mJ/cm$^2$) | PEB temp. (° C.) | Resolution ($\mu$m) |
|---|---|---|---|---|---|---|---|
| Example (I-51) | PAA2 | NBQN | 0.4 | 5.1 | 200 | 130 | 3.0 |
| Example (I-52) | PAA3 | NBPY | 0.4 | 5.0 | 300 | 130 | 3.0 |
| Example (I-53) | PAA3 | TFPY | 0.4 | 5.0 | 300 | 130 | 3.0 |
| Example (I-54) | PAA3 | TFQN | 0.4 | 5.0 | 200 | 130 | 3.0 |
| Example (I-55) | PAA4 | NBPY | 0.4 | 5.0 | 300 | 135 | 3.0 |
| Example (I-56) | PAA4 | PIPY | 0.4 | 5.0 | 300 | 135 | 3.5 |
| Example (I-57) | PAA4 | NBQN | 0.4 | 5.0 | 200 | 135 | 3.0 |
| Example (I-58) | PAA5 | NBPY | 0.4 | 5.1 | 300 | 130 | 3.0 |
| Example (I-59) | PAA5 | TFQN | 0.4 | 5.1 | 200 | 130 | 3.0 |
| Example (I-60) | PAA5 | TFAD | 0.4 | 5.1 | 150 | 130 | 3.0 |

*) Molar ratio to repeating unit of polyamic acid

TABLE 8

|  | Polyamic acid | Photo-sensitive heat cure acclerator | *) Amount added | Film thickness ($\mu$m) | Irradiation dosage (mJ/cm$^2$) | PEB temp. (° C.) | Cross-cut adhesion test | 3% weight reduction temp. |
|---|---|---|---|---|---|---|---|---|
| Example (I-61) | PAA1 | NBPY | 0.4 | 5.0 | 300 | 135 | 0/100 | 505° C. |
| Example (I-62) | PAA1 | PNPY | 0.4 | 5.0 | 300 | 135 | 0/100 | 505° C. |
| Example (I-63) | PAA1 | TFPY | 0.4 | 5.0 | 300 | 135 | 0/100 | 505° C. |
| Example (I-64) | PAA1 | PIPY | 0.4 | 5.0 | 300 | 135 | 0/100 | 505° C. |
| Example (I-65) | PAA1 | NBQN | 0.4 | 5.0 | 200 | 135 | 0/100 | 505° C. |
| Example (I-66) | PAA1 | TFQN | 0.4 | 5.0 | 200 | 135 | 0/100 | 505° C. |
| Example (I-67) | PAA1 | TFAD | 0.4 | 5.0 | 150 | 135 | 0/100 | 505° C. |
| Example (I-68) | PAA1 | NBIM | 0.4 | 5.0 | 300 | 135 | 0/100 | 505° C. |
| Example (I-69) | PAA2 | NBPY | 0.4 | 5.1 | 300 | 130 | 0/100 | 485° C. |
| Example (I-70) | PAA2 | PNPY | 0.4 | 5.1 | 300 | 130 | 0/100 | 485° C. |

*) Molar ratio to repeating unit of polyamic acid

TABLE 9

|  | Polyamic acid | Photo-sensitive heat cure acclerator | *) Amount added | Film thickness ($\mu$m) | Irradiation dosage (mJ/cm$^2$) | PEB temp. (° C.) | Cross-cut adhesion test | 3% weight reduction temp. |
|---|---|---|---|---|---|---|---|---|
| Example (I-71) | PAA2 | NBQN | 0.4 | 5.1 | 200 | 130 | 0/100 | 485° C. |
| Example (I-72) | PAA3 | NBPY | 0.4 | 5.0 | 300 | 130 | 0/100 | 505° C. |
| Example (I-73) | PAA3 | TFPY | 0.4 | 5.0 | 300 | 130 | 0/100 | 505° C. |
| Example (I-74) | PAA3 | TFQN | 0.4 | 5.0 | 200 | 130 | 0/100 | 505° C. |
| Example (I-75) | PAA4 | NBPY | 0.4 | 5.0 | 300 | 135 | 0/100 | 490° C. |

TABLE 9-continued

|  | Polyamic acid | Photo-sensitive heat cure acclerator | *) Amount added | Film thickness ($\mu$m) | Irradiation dosage (mJ/cm$^2$) | PEB temp. (° C.) | Cross-cut adhesion test | 3% weight reduction temp. |
|---|---|---|---|---|---|---|---|---|
| Example (I-76) | PAA4 | PIPY | 0.4 | 5.0 | 300 | 135 | 0/100 | 490° C. |
| Example (I-77) | PAA4 | NBQN | 0.4 | 5.0 | 200 | 135 | 0/100 | 490° C. |
| Example (I-78) | PAA5 | NBPY | 0.4 | 5.1 | 300 | 130 | 0/100 | 475° C. |
| Example (I-79) | PAA5 | TFQN | 0.4 | 5.1 | 200 | 130 | 0/100 | 475° C. |
| Example (I-80) | PAA5 | TFQD | 0.4 | 5.1 | 150 | 130 | 0/100 | 475° C. |

*) Molar ratio to repeating unit of polyamic acid

EXAMPLES I-81 TO I-120

The compounds represented by the aforementioned general formula (2) were employed as a photosensitive heat cure accelerating agent for the preparation of negative photosensitive resin compositions, the characteristics of which were then investigated. Followings are abbreviations of the photosensitive heat cure accelerating agents employed in this example.

3NBP: 3-(2-nitrobenzyloxy)pyridine
4NBP: 4-(2-nitrobenzyloxy)pyridine
3DNP: 3-(2-diazo-1-naphthol-4-sulfonyloxy)pyridine
4DNP: 4-(2-diazo-1-naphthol-4-sulfonyloxy)pyridine
4NBQ: 4-(2-nitrobenzyloxy)quinoline
6NBQ: 6-(2-nitrobenzyloxy)quinoline
4DNQ: 4-(2-diazo-1-naphthol-4-sulfonyloxy)quinoline
6DNQ: 6-(2-diazo-1-naphthol-4-sulfonyloxy)quinoline
NBPO: 3-(2-nitrobenzyloxy)pyridine-N-oxide
DNPO: 3-(2-diazo-1-naphthol-4-sulfonyloxy)pyridine-N-oxide.

As shown in the following Tables 10 to 13, each of the solution of polyamic acid synthesized in the process as mentioned above is mixed with a photosensitive heat cure accelerating agent at a predetermined mixing ratio, and agitated at room temperature to obtain a homogeneous solution. The mixed solution was then filtered with a membrane filter having a pore size of 0.5 $\mu$m, thereby to prepare the photosensitive resin compositions of this invention (Examples I-81 to I-120).

The photosensitive resin compositions thus obtained were then subjected to patterning under the same conditions as mentioned above to evaluate the resolution thereof, the results being summarized in the following Tables 10 and 11. Further, polyimide films were formed using these photosensitive resin compositions in the same manner as mentioned above to evaluate the adhesivity and heat resistance of the films, the results being shown in the following Tables 12 and 13.

TABLE 10

|  | Polyamic acid | Photo-sensitive heat cure acclerator | *) Amount added | Film thickness ($\mu$m) | Irradiation dosage (mJ/cm$^2$) | PEB temp. (° C.) | Resolution ($\mu$m) |
|---|---|---|---|---|---|---|---|
| Example (I-81) | PAA1 | 3NBP | 0.4 | 5.0 | 250 | 135 | 2.5 |
| Example (I-82) | PAA1 | 4NBP | 0.4 | 5.0 | 250 | 135 | 2.5 |
| Example (I-83) | PAA1 | 3DNP | 0.4 | 5.0 | 150 | 135 | 2.0 |
| Example (I-84) | PAA1 | 4DNP | 0.4 | 5.0 | 150 | 135 | 2.0 |
| Example (I-85) | PAA1 | 4NBQ | 0.4 | 5.0 | 200 | 135 | 2.5 |
| Example (I-86) | PAA1 | 6NBQ | 0.4 | 5.0 | 200 | 135 | 2.5 |
| Example (I-87) | PAA1 | 4DNQ | 0.4 | 5.0 | 150 | 135 | 2.0 |
| Example (I-88) | PAA1 | 6DNQ | 0.4 | 5.0 | 150 | 135 | 2.0 |
| Example (I-89) | PAA1 | NBPO | 0.4 | 5.0 | 250 | 135 | 2.5 |
| Example (I-90) | PAA1 | DNPO | 0.4 | 5.0 | 150 | 135 | 2.0 |

*) Molar ratio to repeating unit of polyamic acid

TABLE 11

|  | Polyamic acid | Photo-sensitive heat cure acclerator | *) Amount added | Film thickness ($\mu$m) | Irradiation dosage (mJ/cm$^2$) | PEB temp. (° C.) | Resolution ($\mu$m) |
|---|---|---|---|---|---|---|---|
| Example (I-91) | PAA3 | 4NBP | 0.4 | 5.0 | 250 | 130 | 2.5 |
| Example (I-92) | PAA3 | 3DNP | 0.4 | 5.0 | 150 | 130 | 2.0 |
| Example (I-93) | PAA3 | 4DNP | 0.4 | 5.0 | 150 | 130 | 2.0 |
| Example (I-94) | PAA3 | 4NBQ | 0.4 | 5.0 | 200 | 130 | 2.5 |
| Example (I-95) | PAA3 | 4DNQ | 0.4 | 5.0 | 150 | 130 | 2.0 |
| Example (I-96) | PAA3 | NBPO | 0.4 | 5.0 | 250 | 130 | 2.5 |
| Example (I-97) | PAA3 | DNPO | 0.4 | 5.0 | 150 | 130 | 2.0 |
| Example (I-98) | PAA5 | 3DNP | 0.4 | 5.1 | 150 | 130 | 2.0 |

TABLE 11-continued

| | Polyamic acid | Photo-sensitive heat cure acclerator | *) Amount added | Film thickness (μm) | Irradiation dosage (mJ/cm²) | PEB temp. (° C.) | Resolution (μm) |
|---|---|---|---|---|---|---|---|
| Example (I-99) | PAA5 | 4DNP | 0.4 | 5.1 | 150 | 130 | 2.0 |
| Example (I-100) | PAA5 | DNPO | 0.4 | 5.1 | 150 | 130 | 2.0 |

*) Molar ratio to repeating unit of polyamic acid

TABLE 12

| | Polyamic acid | Photo-sensitive heat cure acclerator | *) Amount added | Film thickness (μm) | Irradiation dosage (mJ/cm²) | PEB temp. (° C.) | Cross-cut adhesion test | 3% weight reduction temp. |
|---|---|---|---|---|---|---|---|---|
| Example (I-101) | PAA1 | 3NBP | 0.4 | 5.0 | 256 | 135 | 0/100 | 505° C. |
| Example (I-102) | PAA1 | 4NBP | 0.4 | 5.0 | 250 | 135 | 0/100 | 505° C. |
| Example (I-103) | PAA1 | 3DNP | 0.4 | 5.0 | 150 | 135 | 0/100 | 505° C. |
| Example (I-104) | PAA1 | 4DNP | 0.4 | 5.0 | 150 | 135 | 0/100 | 505° C. |
| Example (I-105) | PAA1 | 4NBQ | 0.4 | 5.0 | 250 | 135 | 0/100 | 505° C. |
| Example (I-106) | PAA1 | 6NBQ | 0.4 | 5.0 | 250 | 135 | 0/100 | 505° C. |
| Example (I-107) | PAA1 | 4DNQ | 0.4 | 5.0 | 150 | 135 | 0/100 | 505° C. |
| Example (I-108) | PAA1 | 6DNQ | 0.4 | 5.0 | 150 | 135 | 0/100 | 505° C. |
| Example (I-109) | PAA1 | NBPO | 0.4 | 5.0 | 250 | 135 | 0/100 | 505° C. |
| Example (I-110) | PAA1 | DNPO | 0.4 | 5.0 | 150 | 135 | 0/100 | 505° C. |

*) Molar ratio to repeating unit of polyamic acid

TABLE 13

| | Polyamic acid | Photo-sensitive heat cure acclerator | *) Amount added | Film thickness (μm) | Irradiation dosage (mJ/cm²) | PEB temp. (° C.) | Cross-cut adhesion test | 3% weight reduction temp. |
|---|---|---|---|---|---|---|---|---|
| Example (I-111) | PAA3 | 4NBP | 0.4 | 5.0 | 250 | 130 | 0/100 | 505° C. |
| Example (I-112) | PAA3 | 3DNP | 0.4 | 5.0 | 150 | 130 | 0/100 | 505° C. |
| Example (I-113) | PAA3 | 4DNP | 0.4 | 5.0 | 150 | 130 | 0/100 | 505° C. |
| Example (I-114) | PAA3 | 4NBQ | 0.4 | 5.0 | 250 | 130 | 0/100 | 505° C. |
| Example (I-115) | PAA3 | 4DNQ | 0.4 | 5.0 | 150 | 130 | 0/100 | 505° C. |
| Example (I-116) | PAA3 | NBPO | 0.4 | 5.0 | 250 | 130 | 0/100 | 505° C. |
| Example (I-117) | PAA3 | DNPO | 0.4 | 5.0 | 150 | 130 | 0/100 | 505° C. |
| Example (I-118) | PAA5 | 3DNP | 0.4 | 5.1 | 150 | 130 | 0/100 | 475° C. |
| Example (I-119) | PAA5 | 4DNP | 0.4 | 5.1 | 150 | 130 | 0/100 | 475° C. |
| Example (I-120) | PAA5 | DNPO | 0.4 | 5.1 | 150 | 130 | 0/100 | 475° C. |

*) Molar ratio to repeating unit of polyamic acid

EXAMPLES I-121 TO I-160

The nitrogen-containing heterocyclic compounds wherein at least one N-hydroxyl group (>N—OH) of a substituted or unsubstituted N-hydroxy nitrogen-containing heterocyclic ketone compounds was substituted by a protective substituent group which can be eliminated upon irradiation of light were employed as a photosensitive heat cure accelerating agent for the preparation of negative photosensitive resin compositions, the characteristics of which were then investigated. Followings are abbreviations of the photosensitive heat cure accelerating agents employed in this example.

NBOP: N-(2-nitrobenzyloxy)-4-pyridone
TFOP: N-(trifluoromethanesulfonyloxy)-4-pyridone
PIOP: N-(2-phenylisopropoxycarbonyloxy)-4-pyridone
DNOP: N-(2-diazo-1-naphthol-4-sulfonyloxy)-4-pyridone
NBOQ: N-(2-nitrobenzyloxy)-4-quinolone
TFOQ: N-(trifluoromethanesulfonyloxy)-4-quinolone
DNOQ: N-(2-diazo-1-naphthol-4-sulfonyloxy)-4-quinolone
TFOA: N-(trifluoromethanesulfonyloxy)-9-acridone
TFNI: N-(trifluoromethanesulfonyloxy)naphthalene-2,3-dicarboxyimide
DNPI: N-(2-diazo-1-naphthol-4-sulfonyloxy)phthalimide.

As shown in the following Tables 14 to 17, each of the solution of polyamic acid synthesized in the process as mentioned above is mixed with a photosensitive heat cure accelerating agent at a predetermined mixing ratio, and agitated at room temperature to obtain a homogeneous solution. The mixed solution was then filtered with a membrane filter having a pore size of 0.5 μm, thereby to prepare the photosensitive resin compositions of this invention (Examples I-121 to I-160).

The photosensitive resin compositions thus obtained were then subjected to patterning under the same conditions as mentioned above to evaluate the resolution thereof, the results being summarized in the following Tables 14 and 15. Further, polyimide. films were formed using these photosensitive resin compositions in the same manner as mentioned above to evaluate the adhesivity and heat resistance of the films, the results being shown in the following Tables 16 and 17.

TABLE 14

|  | Polyamic acid | Photo-sensitive heat cure acclerator | *) Amount added | Film thickness (μm) | Irradiation dosage (mJ/cm²) | PEB temp. (° C.) | Resolution (μm) |
| --- | --- | --- | --- | --- | --- | --- | --- |
| Example (I-121) | PAA1 | NBOP | 0.4 | 5.0 | 250 | 135 | 2.5 |
| Example (I-122) | PAA1 | TFOP | 0.4 | 5.0 | 300 | 135 | 3.0 |
| Example (I-123) | PAA1 | PIOP | 0.4 | 5.0 | 300 | 135 | 3.0 |
| Example (I-124) | PAA1 | DNOP | 0.4 | 5.0 | 150 | 135 | 2.0 |
| Example (I-125) | PAA1 | NBOQ | 0.4 | 5.0 | 250 | 135 | 2.5 |
| Example (I-126) | PAA1 | TFOQ | 0.4 | 5.0 | 250 | 135 | 3.0 |
| Example (I-127) | PAA1 | DNOQ | 0.4 | 5.0 | 150 | 135 | 2.0 |
| Example (I-128) | PAA1 | TFOA | 0.4 | 5.0 | 200 | 135 | 3.0 |
| Example (I-129) | PAA1 | TFNI | 0.4 | 5.0 | 250 | 135 | 3.0 |
| Example (I-130) | PAA1 | DNPI | 0.4 | 5.0 | 150 | 135 | 2.0 |

*) Molar ratio to repeating unit of polyamic acid

TABLE 15

|  | Polyamic acid | Photo-sensitive heat cure acclerator | *) Amount added | Film thickness (μm) | Irradiation dosage (mJ/cm²) | PEB temp. (° C.) | Resolution (μm) |
| --- | --- | --- | --- | --- | --- | --- | --- |
| Example (I-131) | PAA3 | NBOP | 0.4 | 5.0 | 250 | 130 | 2.5 |
| Example (I-132) | PAA3 | TFOP | 0.4 | 5.0 | 300 | 130 | 3.0 |
| Example (I-133) | PAA3 | DNOP | 0.4 | 5.0 | 150 | 130 | 2.0 |
| Example (I-134) | PAA3 | NBOQ | 0.4 | 5.0 | 250 | 130 | 2.5 |
| Example (I-135) | PAA3 | DNOQ | 0.4 | 5.0 | 150 | 130 | 2.0 |
| Example (I-136) | PAA3 | TFOA | 0.4 | 5.0 | 200 | 130 | 3.0 |
| Example (I-137) | PAA3 | DNPI | 0.4 | 5.0 | 150 | 130 | 2.0 |
| Example (I-138) | PAA5 | NBOP | 0.4 | 5.1 | 250 | 130 | 2.5 |
| Example (I-139) | PAA5 | DNOP | 0.4 | 5.1 | 150 | 130 | 2.0 |
| Example (I-140) | PAA5 | DNPI | 0.4 | 5.1 | 150 | 130 | 2.0 |

*) Molar ratio to repeating unit of polyamic acid

TABLE 16

|  | Polyamic acid | Photo-sensitive heat cure acclerator | *) Amount added | Film thickness (μm) | Irradiation dosage (mJ/cm²) | PEB temp. (° C.) | Cross-cut adhesion test | 3% weight reduction temp. |
| --- | --- | --- | --- | --- | --- | --- | --- | --- |
| Example (I-141) | PAA1 | NBOP | 0.4 | 5.0 | 250 | 135 | 0/100 | 505° C. |
| Example (I-142) | PAA1 | TFOP | 0.4 | 5.0 | 300 | 135 | 0/100 | 505° C. |
| Example (I-143) | PAA1 | PIOP | 0.4 | 5.0 | 300 | 135 | 0/100 | 505° C. |
| Example (I-144) | PAA1 | DNOP | 0.4 | 5.0 | 150 | 135 | 0/100 | 505° C. |
| Example (I-145) | PAA1 | NBOQ | 0.4 | S.0 | 250 | 135 | 0/100 | 505° C. |
| Example (I-146) | PAA1 | TFOQ | 0.4 | 5.0 | 250 | 135 | 0/100 | 505° C. |
| Example (I-147) | PAA1 | DNOQ | 0.4 | 5.0 | 150 | 135 | 0/100 | 505° C. |
| Example (I-148) | PAA1 | TFOA | 0.4 | 5.0 | 200 | 135 | 0/100 | 505° C. |
| Example (I-149) | PAA1 | TFNI | 0.4 | 5.0 | 250 | 135 | 0/100 | 505° C. |
| Example (I-150) | PAA1 | DNPL | 0.4 | 5.0 | 150 | 135 | 0/100 | 505° C. |

*) Molar ratio to repeating unit of polyamic acid

TABLE 17

|  | Polyamic acid | Photo-sensitive heat cure acclerator | *) Amount added | Film thickness (μm) | Irradiation dosage (mJ/cm²) | PEB temp. (° C.) | Cross-cut adhesion test | 3% weight reduction temp. |
| --- | --- | --- | --- | --- | --- | --- | --- | --- |
| Example (I-151) | PAA3 | NBOP | 0.4 | 5.0 | 250 | 130 | 0/100 | 505° C. |
| Example (I-152) | PAA3 | TFOP | 0.4 | 5.0 | 300 | 130 | 0/100 | 505° C. |
| Example (I-153) | PAA3 | DNOP | 0.4 | 5.0 | 150 | 130 | 0/100 | 505° C. |
| Example (I-154) | PAA3 | NBOQ | 0.4 | 5.0 | 250 | 130 | 0/100 | 505° C. |
| Example (I-155) | PAA3 | DNOQ | 0.4 | 5.0 | 150 | 130 | 0/100 | 505° C. |
| Example (I-156) | PAA3 | TFOA | 0.4 | 5.0 | 200 | 130 | 0/100 | 505° C. |
| Example (I-157) | PAA3 | DNPI | 0.4 | 5.0 | 150 | 130 | 0/100 | 505° C. |
| Example (I-158) | PAA5 | NBOP | 0.4 | 5.1 | 250 | 130 | 0/100 | 475° C. |

TABLE 17-continued

|  | Polyamic acid | Photo-sensitive heat cure acclerator | *) Amount added | Film thickness (μm) | Irradiation dosage (mJ/cm²) | PEB temp. (° C.) | Cross-cut adhesion test | 3% weight reduction temp. |
|---|---|---|---|---|---|---|---|---|
| Example (I-159) | PAA5 | DNOP | 0.4 | 5.1 | 150 | 130 | 0/100 | 475° C. |
| Example (I-160) | PAA5 | DNPI | 0.4 | 5.1 | 150 | 130 | 0/100 | 475° C. |

*) Molar ratio to repeating unit of polyamic acid

As seen from these results, the photosensitive resin compositions of this invention containing a photosensitive heat cure accelerator having a protective substituent group which can be eliminated upon irradiation of light were all exhibited an excellent resolution. Namely, when they were subjected to exposure at a dosage of not more than 300 mJ/cm², it was possible to form an excellent negative pattern of line-and-space having line width of 2.0 to 3.5 μm, thus suggesting the usefulness thereof for forming a passivation film or wiring-insulation film with high resolution. Moreover, the polyimide films obtained by making use of the photosensitive resin compositions according to this invention indicated a sufficient adhesivity to the silicon wafer, and at the same time, exhibited no weight reduction, that might be resulted from a thermal decomposition of resin, even if they were heated up to 450° C. The polyimide films obtained by making use of the photosensitive resin compositions according to this invention were found as having a high heat resistance which was comparable to the polyimide films manufactured in a high temperature heating process according to Comparative Examples 12 to 16 to be illustrated hereinafter.

EXAMPLE II

In this example, photosensitive heat cure accelerating agents consisting of an N-oxide compound which is capable of exhibiting a heat cure accelerating property through a transition of oxide group thereof upon irradiation of light were employed.

EXAMPLES II-1 TO II-40

N-oxide compounds of substituted or unsubstituted nitrogen-containing aromatic heterocyclic compounds having a pyridine nucleus nitrogen atom (=N—) were employed as a photosensitive heat cure accelerating agent for the preparation of negative photosensitive resin compositions, the characteristics of which were then investigated. Followings are abbreviations of the photosensitive heat cure accelerating agents employed in this example.

4PPO: 4-phenylpyridine-N-oxide
4NQO: 4-nitroquinoline-N-oxide
6MQO: 6-methoxyquinoline-N-oxide
8HQO: 8-hydroxyquinoline-N-oxide
PTDO: phenanthridine-N-oxide
BFQO: benzo[f]quinoline-N-oxide
BHQO: benzo[h]quinoline-N-oxide
2DPO: 2,2'-dipyridyl-N,N'-dioxide
4DQO: 4,4'-dipyridyl-N,N'-dioxide
POBN: (4-pyridyl-N-oxide)-N-tert-butylnitrone.

As shown in the following Tables 18 to 21, each of the solution of polyamic acid synthesized in the process as mentioned above is mixed with a photosensitive heat cure accelerating agent at a predetermined mixing ratio, and agitated at room temperature to obtain a homogeneous solution. The mixed solution was then filtered with a membrane filter having a pore size of 0.5 μm, thereby to prepare the photosensitive resin compositions of this invention (Examples II-1 to II-40).

The photosensitive resin compositions thus obtained were then subjected to patterning under the same conditions as mentioned above to evaluate the resolution thereof, the results being summarized in the following Tables 18 and 19. Further, polyimide films were formed using these photosensitive resin compositions in the same manner as mentioned above to evaluate the adhesivity and heat resistance of the films, the results being shown in the following Tables 20 and 21.

TABLE 18

|  | Polyamic acid | Photo-sensitive heat cure acclerator | *) Amount added | Film thickness (μm) | Irradiation dosage (mJ/cm²) | PEB temp. (° C.) | Resolution (μm) |
|---|---|---|---|---|---|---|---|
| Example (II-1) | PAA1 | 4PPO | 0.5 | 5.0 | 500 | 140 | 3.0 |
| Example (II-2) | PAA1 | 4NQO | 0.5 | 5.0 | 500 | 140 | 3.0 |
| Example (II-3) | PAA1 | 6MQO | 0.5 | 5.0 | 500 | 140 | 3.0 |
| Example (II-4) | PAA1 | 8HQO | 0.5 | 5.0 | 300 | 140 | 2.0 |
| Example (II-5) | PAA1 | PTDO | 0.5 | 5.0 | 300 | 140 | 2.5 |
| Example (II-6) | PAA1 | BFQO | 0.5 | 5.0 | 300 | 140 | 2.5 |
| Example (II-7) | PAA1 | BHQO | 0.5 | 5.0 | 300 | 140 | 2.5 |
| Example (II-8) | PAA1 | 2DPO | 0.5 | 5.0 | 400 | 140 | 3.0 |
| Example (II-9) | PAA1 | 4DPO | 0.5 | 5.0 | 400 | 140 | 3.0 |
| Example (II-10) | PAA1 | POBN | 0.5 | 5.0 | 300 | 140 | 2.5 |

*) Molar ratio to repeating unit of polyamic acid

TABLE 19

| | Polyamic acid | Photo-sensitive heat cure acclerator | *) Amount added | Film thickness (μm) | Irradia-tion dosage (mJ/cm²) | PEB temp. (° C.) | Resolu-tion (μm) |
|---|---|---|---|---|---|---|---|
| Example (II-11) | PAA3 | 4PPO | 0.5 | 5.0 | 500 | 135 | 3.0 |
| Example (II-12) | PAA3 | 6MQO | 0.5 | 5.0 | 500 | 135 | 3.0 |
| Example (II-13) | PAA3 | 8HQO | 0.5 | 5.0 | 300 | 135 | 2.0 |
| Example (II-14) | PAA3 | BFQO | 0.5 | 5.0 | 300 | 135 | 2.5 |
| Example (II-15) | PAA3 | BHQO | 0.5 | 5.0 | 300 | 135 | 2.5 |
| Example (II-16) | PAA3 | 2DPO | 0.5 | 5.0 | 400 | 135 | 3.0 |
| Example (II-17) | PAA3 | POBN | 0.5 | 5.0 | 300 | 135 | 2.5 |
| Example (II-18) | PAA5 | 8HQO | 0.5 | 5.1 | 300 | 135 | 2.5 |
| Example (II-19) | PAA5 | BHQO | 0.5 | 5.1 | 300 | 135 | 2.5 |
| Example (II-20) | PAA5 | POBN | 0.5 | 5.1 | 300 | 135 | 2.5 |

*) Molar ratio to repeating unit of polyamic acid

TABLE 20

| | Polyamic acid | Photo-sensitive heat cure acclerator | *) Amount added | Film thick-ness (μm) | Irradia-tion dosage (mJ/cm²) | PEB temp. (° C.) | Cross-cut adhesion test | 3% weight reduction temp. |
|---|---|---|---|---|---|---|---|---|
| Example (II-21) | PAA1 | 4PPO | 0.5 | 5.0 | 500 | 140 | 0/100 | 505° C. |
| Example (II-22) | PAA1 | 4NQO | 0.5 | 5.0 | 500 | 140 | 0/100 | 505° C. |
| Example (II-23) | PAA1 | 6MQO | 0.5 | 5.0 | 500 | 140 | 0/100 | 505° C. |
| Example (II-24) | PAA1 | 8HQO | 0.5 | 5.0 | 300 | 140 | 0/100 | 505° C. |
| Example (II-25) | PAA1 | PTDO | 0.5 | 5.0 | 300 | 140 | 0/100 | 505° C. |
| Example (II-26) | PAA1 | BFQO | 0.5 | 5.0 | 300 | 140 | 0/100 | 505° C. |
| Example (II-27) | PAA1 | BHQO | 0.5 | 5.0 | 300 | 140 | 0/100 | 505° C. |
| Example (II-28) | PAA1 | 2DPO | 0.5 | 5.0 | 400 | 140 | 0/100 | 505° C. |
| Example (II-29) | PAA1 | 4DPO | 0.5 | 5.0 | 400 | 140 | 0/100 | 505° C. |
| Example (II-30) | PAA1 | POBN | 0.5 | 5.0 | 300 | 140 | 0/100 | 505° C. |

*) Molar ratio to repeating unit of polyamic acid

TABLE 21

| | Polyamic acid | Photo-sensitive heat cure acclerator | *) Amount added | Film thick-ness (μm) | Irradia-tion dosage (mJ/cm²) | PEB temp. (° C.) | Cross-cut adhesion test | 3% weight reduction temp. |
|---|---|---|---|---|---|---|---|---|
| Example (II-31) | PAA3 | 4PPO | 0.5 | 5.0 | 500 | 135 | 0/100 | 505° C. |
| Example (II-32) | PAA3 | 6MQO | 0.5 | 5.0 | 500 | 135 | 0/100 | 505° C. |
| Example (II-33) | PAA3 | 8HQO | 0.5 | 5.0 | 300 | 135 | 0/100 | 505° C. |
| Example (II-34) | PAA3 | BFQO | 0.5 | 5.0 | 300 | 135 | 0/100 | 505° C. |
| Example (II-35) | PAA3 | BHQO | 0.5 | 5.0 | 300 | 135 | 0/100 | 505° C. |
| Example (II-36) | PAA3 | 2DPO | 0.5 | 5.0 | 400 | 135 | 0/100 | 505° C. |
| Example (II-37) | PAA3 | POBN | 0.5 | 5.0 | 300 | 135 | 0/100 | 505° C. |
| Example (II-38) | PAA5 | 8HQO | 0.5 | 5.1 | 300 | 135 | 0/100 | 475° C. |
| Example (II-39) | PAA5 | BHQO | 0.5 | 5.1 | 300 | 135 | 0/100 | 475° C. |
| Example (II-40) | PAA5 | POBN | 0.5 | 5.1 | 300 | 135 | 0/100 | 475° C. |

*) Molar ratio to repeating unit of polyamic acid

EXAMPLES II-41 TO II-60

The N-oxide compounds represented by the aforementioned general formula (3) were employed as a photosensitive heat cure accelerating agent for the preparation of negative photosensitive resin compositions, the characteristics of which were then investigated. Followings are abbreviations of the photosensitive heat cure accelerating agents employed in this example.

3PPN: α-(3-pyridyl)-N-phenylnitrone
4PPN: α-(4-pyridyl)-N-phenylnitrone
TZPN: α-(2-thiazolyl)-N-phenylnitrone
3HPN: α-(3-hydroxyphenyl)-N-phenylnitrone
4HPN: α-(4-hydroxyphenyl)-N-phenylnitrone.

As shown in the following Tables 22 and 23, each of the solution of polyamic acid synthesized in the process as mentioned above is mixed with a photosensitive heat cure accelerating agent at a predetermined mixing ratio, and agitated at room temperature to obtain a homogeneous solution. The mixed solution was then filtered with a membrane filter having a pore size of 0.5 μm, thereby to prepare the photosensitive resin compositions of this invention (Examples II-41 to II-60).

The photosensitive resin compositions thus obtained were then subjected to patterning under the same conditions as mentioned above to evaluate the resolution thereof, the results being summarized in the following Table 22. Further, polyimide films were formed using these photosensitive resin compositions in the same manner as mentioned above to evaluate the adhesivity and heat resistance of the films, the results being shown in the following Table 23.

TABLE 22

| | Polyamic acid | Photo-sensitive heat cure acclerator | *) Amount added | Film thickness (μm) | Irradiation dosage (mJ/cm$^2$) | PEB temp. (° C.) | Resolution (μm) |
|---|---|---|---|---|---|---|---|
| Example (II-41) | PAA1 | 3PPN | 0.5 | 5.0 | 300 | 140 | 2.5 |
| Example (II-42) | PAA1 | 4PPN | 0.5 | 5.0 | 300 | 140 | 2.5 |
| Example (II-43) | PAA1 | TZPN | 0.5 | 5.0 | 300 | 140 | 3.0 |
| Example (II-44) | PAA1 | 3HPN | 0.5 | 5.0 | 400 | 140 | 3.0 |
| Example (II-45) | PAA1 | 4HPN | 0.5 | 5.0 | 400 | 140 | 3.0 |
| Example (II-46) | PAA3 | 3PPN | 0.5 | 5.0 | 300 | 135 | 2.5 |
| Example (II-47) | PAA3 | 4PPN | 0.5 | 5.0 | 300 | 135 | 2.5 |
| Example (II-48) | PAA3 | 3HPN | 0.5 | 5.0 | 400 | 135 | 3.0 |
| Example (II-49) | PAA5 | 3PPN | 0.5 | 5.0 | 300 | 135 | 2.5 |
| Example (II-50) | PAA5 | 3HPN | 0.5 | 5.0 | 400 | 135 | 3.0 |

*) Molar ratio to repeating unit of polyamic acid

TABLE 23

| | Polyamic acid | Photo-sensitive heat cure acclerator | *) Amount added | Film thickness (μm) | Irradiation dosage (mJ/cm$^2$) | PEB temp. (° C.) | Cross-cut adhesion test | 3% weight reduction temp. |
|---|---|---|---|---|---|---|---|---|
| Example (II-51) | PAA1 | 3PPN | 0.5 | 5.0 | 300 | 140 | 0/100 | 505° C. |
| Example (II-52) | PAA1 | 4PPN | 0.5 | 5.0 | 300 | 140 | 0/100 | 505° C. |
| Example (II-53) | PAA1 | TZPN | 0.5 | 5.0 | 300 | 140 | 0/100 | 505° C. |
| Example (II-54) | PAA1 | 3HPN | 0.5 | 5.0 | 400 | 140 | 0/100 | 505° C. |
| Example (II-55) | PAA1 | 4HPN | 0.5 | 5.0 | 400 | 140 | 0/100 | 505° C. |
| Example (II-56) | PAA3 | 3PPN | 0.5 | 5.0 | 300 | 135 | 0/100 | 505° C. |
| Example (II-57) | PAA3 | 4PPN | 0.5 | 5.0 | 300 | 135 | 0/100 | 505° C. |
| Example (II-58) | PAA3 | 3HPN | 0.5 | 5.0 | 400 | 135 | 0/100 | 505° C. |
| Example (II-59) | PAA5 | 3PPN | 0.5 | 5.1 | 300 | 135 | 0/100 | 475° C. |
| Example (II-60) | PAA5 | 3HPN | 0.5 | 5.1 | 400 | 135 | 0/100 | 475° C. |

*) Molar ratio to repeating unit of polyamic acid

As seen from these results, the photosensitive resin compositions of this invention containing a photosensitive heat cure accelerator consisting of an N-oxide compound which is capable of exhibiting heat cure accelerating property through the transition of the oxide group thereof upon irradiation of light were all exhibited an excellent resolution. Namely, when they were subjected to exposure at a dosage of not more than 500 mJ/cm$^2$, it was possible to form an excellent negative pattern of line-and-space having line width of 2.0 to 3.0 μm, thus suggesting the usefulness thereof for forming a passivation film or wiring-insulation film with high resolution. Moreover, the polyimide films obtained by making use of the photosensitive resin compositions according to this invention indicated a sufficient adhesivity to the silicon wafer, and at the same time, exhibited no weight reduction, that might be resulted from a thermal decomposition of resin, even if they were heated up to 450° C. The polyimide films obtained by making use of the photosensitive resin compositions according to this invention were found as having a high heat resistance which was comparable to the polyimide films manufactured in a high temperature heating process according to Comparative Examples 12 to 14 to be illustrated hereinafter.

EXAMPLE III

In this example, photosensitive heat cure accelerating agents which is capable of exhibiting a heat cure accelerating property through the generation of an acid upon irradiation of light were employed to prepare negative photosensitive resin compositions, the characteristics of which were then investigated. Followings are abbreviations of the photosensitive heat cure accelerating agents employed in this example.

Photosensitive Heat Cure Accelerating Agent

CIMS: di-p-cumenyliodonium methanesulfonate

NSTF: 4-hydroxy-1-naphthyldimethylsulfonium trifluoromethanesulfonate

MANB: 9,10-dimethoxyanthracene-2-sulfonic acid-4-nitrobenzyl ester

MSNI: N-(methanesulfonyloxy)naphthalene-1,8-dicarboxyimide

MGTO: (4-methoxyphenyl)glyoxylonitrile=O-tosyloxime

Sensitizer

EMA: 2-ethyl-9,10-dimethoxyanthracene.

As shown in the following Tables 24 and 25, each of the solution of polyamic acid synthesized in the process as mentioned above is mixed with a photosensitive heat cure accelerating agent at a predetermined mixing ratio, and agitated at room temperature to obtain a homogeneous solution. The mixed solution was then filtered with a membrane filter having a pore size of 0.5 μm, thereby to prepare the photosensitive resin compositions of this invention (Examples III-1 to III 20). In every compositions, the mixing ratio of the photosensitive heat cure accelerating agent was set to 1.0 molar equivalent per the repeating unit of the polyamic acid. In the compositions where the sensitizer was added, the mixing ratio of the sensitizer was set to 0.5 molar equivalent per the repeating unit of the polyamic acid.

The photosensitive resin compositions thus obtained were then subjected to patterning under the same conditions as mentioned above to evaluate the resolution thereof, the results being summarized in the following Table 24. Further, polyimide films were formed using these photosensitive resin compositions in the same manner as mentioned above to evaluate the adhesivity and heat resistance of the films, the results being shown in the following Table 25.

TABLE 24

| | Polyamic acid | Photo-sensitive heat cure acclerator | Sensi-tizer | Film thickness ($\mu$m) | Irradia-tion dosage (mJ/cm$^2$) | PEB temp. (° C.) | Resolu-tion ($\mu$m) |
|---|---|---|---|---|---|---|---|
| Example (III-1) | PAA1 | CIMS | EMA | 5.0 | 400 | 150 | 6.0 |
| Example (III-2) | PAA1 | NSTF | None | 5.0 | 400 | 150 | 6.0 |
| Example (III-3) | PAA1 | MANB | None | 5.0 | 350 | 150 | 5.0 |
| Example (III-4) | PAA1 | MSNI | None | 5.0 | 350 | 150 | 5.0 |
| Example (III-5) | PAA1 | MGTO | None | 5.0 | 350 | 150 | 6.0 |
| Example (III-6) | PAA3 | MSTF | EMA | 5.0 | 400 | 150 | 6.0 |
| Example (III-7) | PAA3 | MANB | None | 5.0 | 350 | 150 | 5.0 |
| Example (III-8) | PAA3 | MSNI | None | 5.0 | 350 | 150 | 5.0 |
| Example (III-9) | PAA5 | MSNI | None | 5.1 | 350 | 150 | 5.0 |
| Example (III-10) | PAA5 | MGTO | None | 5.1 | 350 | 150 | 6.0 |

TABLE 25

| | Polyamic acid | Photo-sensitive heat cure acclerator | Sensi-tizer | Film thick-ness ($\mu$m) | Irradia-tion dosage (mJ/cm$^2$) | PEB temp. (° C.) | Cross-cut adhesion test | 3% weight reduction temp. |
|---|---|---|---|---|---|---|---|---|
| Example (III-11) | PAA1 | CIMS | EMA | 5.0 | 400 | 150 | 0/100 | 505° C. |
| Example (III-12) | PAA1 | NSTF | None | 5.0 | 400 | 150 | 0/100 | 505° C. |
| Example (III-13) | PAA1 | MANB | None | 5.0 | 350 | 150 | 0/100 | 505° C. |
| Example (III-14) | PAA1 | MSNI | None | 5.0 | 350 | 150 | 0/100 | 505° C. |
| Example (III-15) | PAA1 | MGTO | None | 5.0 | 350 | 150 | 0/100 | 505° C. |
| Example (III-16) | PAA3 | MSTF | EMA | 5.0 | 400 | 150 | 0/100 | 505° C. |
| Example (III-17) | PAA3 | MANB | None | 5.0 | 350 | 150 | 0/100 | 505° C. |
| Example (III-18) | PAA3 | MSNI | None | 5.0 | 350 | 150 | 0/100 | 505° C. |
| Example (III-19) | PAA5 | MSNI | None | 5.1 | 350 | 150 | 0/100 | 475° C. |
| Example (III-20) | PAA5 | MGTO | None | 5.1 | 350 | 150 | 0/100 | 475° C. |

As seen from these results, the photosensitive resin compositions of this invention containing a photosensitive heat cure accelerator which is capable of exhibiting heat cure accelerating property through the generation of an acid upon irradiation of light were all exhibited an excellent resolution. Namely, when they were subjected to exposure at a dosage of not more than 500 mJ/cm$^2$, it was possible to form an excellent negative pattern of line-and-space having line width of 2.0 to 3.0 $\mu$m, thus suggesting the usefulness thereof for forming a passivation film or wiring-insulation film with high resolution. Moreover, the polyimide films obtained by making use of the photosensitive resin compositions according to this invention indicated a sufficient adhesivity to the silicon wafer, and at the same time, exhibited no weight reduction, that might be resulted from a thermal decomposition of resin, even if they were heated up to 450° C. The polyimide films obtained by making use of the photosensitive resin compositions according to this invention were found as having a high heat resistance which was comparable to the polyimide films manufactured in a high temperature heating process according to Comparative Examples 12 to 14 to be illustrated hereinafter.

EXAMPLE IV

In this example, a latent heat cure accelerating agent was mixed with a photo-acid generating agent which is capable of generating an acid upon irradiation of light to obtain a photosensitive heat cure accelerating agent. The latent heat cure accelerating agent is a compound which can be transformed, through a reaction with the acid, into a compound which is capable of exhibiting a heat cure accelerating property. The photosensitive heat cure accelerating agent was employed to prepare negative photosensitive resin compositions, the characteristics of which were then investigated. Followings are abbreviations of the photosensitive heat cure accelerating agents employed in this example.

Latent Heat Cure Accelerating Agent
  TBBP: 2,3,4,4'-tetrakis(t-butoxycarbonyloxy)benzophenone
  TBPY: 3-(t-butoxycarbonyloxy)pyridine
  TPSI: N-(tetrahydropyran-2-yloxy)succineimide
  TBPI: N-(t-butoxycarbonyloxy)phthalimide
  TBPD: 1-(t-butoxycarbonyloxy)-4-pyridone
Photo-Acid Generating Agent
  TFBP: 2,3,4,4'-tetrakis(trifluoromethanesulfonyloxy)benzophenone
  TFNI: N-(trifluoromethanesulfonyloxy)naphthalene-2,3-dicarboxyimide.
  MGTO: (4-methoxyphenyl)gyoxylonitrile=O-tosyloxime As shown in the following Tables 26 to 29, each of the solution of polyamic acid synthesized in the process as mentioned above is mixed with a latent heat cure accelerating agent and a photo-acid generating agent at a predetermined mixing ratio, and agitated at room temperature to obtain a homogeneous solution. The mixed solution was then filtered with a membrane filter having a pore size of 0.5 $\mu$m, thereby to prepare the photosensitive resin compositions of this invention (Examples IV-1 to IV-30). In every compositions, the mixing ratio of the latent heat cure accelerating agent was set to 1.0 molar equivalent per the repeating unit of the polyamic acid, and the mixing ratio of the photo-acid generating agent was set to 0.2 molar equivalent per the repeating unit of the polyamic acid.

The photosensitive resin compositions thus obtained were then subjected to patterning under the same conditions as mentioned above to evaluate the resolution thereof, the results being summarized in the following Tables 26 and 27. Further, polyimide films were formed using these photosensitive resin compositions in the same manner as mentioned above to evaluate the adhesivity and heat resistance of the films, the results being shown in the following Tables 28 and 29.

TABLE 26

|  | Polyamic acid | Latent heat cure accelerator | Photo-acid generator | Film thickness (μm) | Irradiation dosage (mJ/cm$^2$) | PEB temp. (° C.) | Resolution (μm) |
|---|---|---|---|---|---|---|---|
| Example (IV-1) | PAA1 | TBBP | TFBP | 5.0 | 300 | 135 | 2.5 |
| Example (IV-2) | PAA1 | TBBP | TFNI | 5.0 | 200 | 135 | 2.5 |
| Example (IV-3) | PAA1 | TBBP | MGTO | 5.0 | 400 | 135 | 3.0 |
| Example (IV-4) | PAA1 | TBPY | TFBP | 5.0 | 300 | 135 | 2.5 |
| Example (IV-5) | PAA1 | TBPY | TFNI | 5.0 | 200 | 135 | 2.5 |
| Example (IV-6) | PAA1 | TBPY | MGTO | 5.0 | 400 | 135 | 3.0 |
| Example (IV-7) | PAA1 | TPSI | TFBP | 5.0 | 300 | 135 | 2.5 |
| Example (IV-8) | PAA1 | TPSI | TFNI | 5.0 | 200 | 135 | 2.5 |

TABLE 27

|  | Polyamic acid | Latent heat cure accelerator | Photo-acid generator | Film thickness (μm) | Irradiation dosage (mJ/cm$^2$) | PEB temp. (° C.) | Resolution (μm) |
|---|---|---|---|---|---|---|---|
| Example (IV-9) | PAA1 | TPSI | MGTO | 5.0 | 400 | 135 | 3.0 |
| Example (IV-10) | PAA1 | TBPI | TFBP | 5.0 | 300 | 135 | 2.0 |
| Example (IV-11) | PAA1 | TBPI | TFNI | 5.0 | 200 | 135 | 2.0 |
| Example (IV-12) | PAA1 | TBPI | MGTO | 5.0 | 400 | 135 | 2.5 |
| Example (IV-13) | PAA1 | TBPD | TFBP | 5.0 | 300 | 135 | 2.0 |
| Example (IV-14) | PAA1 | TBPD | TFNI | 5.0 | 200 | 135 | 2.0 |
| Example (IV-15) | PAA1 | TBPD | MGTO | 5.0 | 400 | 135 | 2.5 |

TABLE 28

|  | Polyamic acid | Latent heat cure accelerator | Photo-acid generator | Film thickness (μm) | Irradiation dosage (mJ/cm$^2$) | PEB temp. (° C.) | Cross-cut adhesion test | 3% weight reduction temp. |
|---|---|---|---|---|---|---|---|---|
| Example (IV-16) | PAA1 | TBBP | TFBP | 5.0 | 300 | 135 | 0/100 | 505° C. |
| Example (IV-17) | PAA1 | TBBP | TFNI | 5.0 | 200 | 135 | 0/100 | 505° C. |
| Example (IV-18) | PAA1 | TBBP | MGTO | 5.0 | 400 | 135 | 0/100 | 505° C. |
| Example (IV-19) | PAA1 | TBPY | TFBP | 5.0 | 300 | 135 | 0/100 | 505° C. |
| Example (IV-20) | PAA1 | TBPY | TFNI | 5.0 | 200 | 135 | 0/100 | 505° C. |
| Example (IV-21) | PAA1 | TBPY | MGTO | 5.0 | 400 | 135 | 0/100 | 505° C. |
| Example (IV-22) | PAA1 | TPSI | TFBP | 5.0 | 300 | 135 | 0/100 | 505° C. |

TABLE 29

|  | Polyamic acid | Latent heat cure accelerator | Photo-acid generator | Film thickness (μm) | Irradiation dosage (mJ/cm$^2$) | PEB temp. (° C.) | Cross-cut adhesion test | 3% weight reduction temp. |
|---|---|---|---|---|---|---|---|---|
| Example (IV-23) | PAA1 | TPSI | TFNI | 5.0 | 200 | 135 | 0/100 | 505° C. |
| Example (IV-24) | PAA1 | TPSI | MGTO | 5.0 | 400 | 135 | 0/100 | 505° C. |
| Example (IV-25) | PAA1 | TBPI | TFBP | 5.0 | 300 | 135 | 0/100 | 505° C. |
| Example (IV-26) | PAA1 | TBPI | TFNI | 5.0 | 200 | 135 | 0/100 | 505° C. |
| Example (IV-27) | PAA1 | TBPI | MGTO | 5.0 | 400 | 135 | 0/100 | 505° C. |
| Example (IV-28) | PAA1 | TBPD | TFBP | 5.0 | 300 | 135 | 0/100 | 505° C. |
| Example (IV-29) | PAA1 | TBPD | TFNI | 5.0 | 200 | 135 | 0/100 | 505° C. |
| Example (IV-30) | PAA1 | TBPD | MGTO | 5.0 | 400 | 135 | 0/100 | 505° C. |

As seen from these results, the photosensitive resin compositions of this invention containing a photosensitive heat cure accelerating agent comprising a latent heat cure accelerating agent which can be transformed, through a reaction with an acid, into a compound which is capable of exhibiting a heat cure accelerating property, and a photo-acid generating agent which is capable of generating an acid upon irradiation of light were all exhibited an excellent resolution. Namely, when they were subjected to exposure at a dosage of not more than 500 mJ/cm$^2$, it was possible to form an excellent negative pattern of line-and-space having line width of 2.0 to 3.0 μm, thus suggesting the usefulness thereof for forming a passivation film or wiring-insulation film with high resolution. Moreover, the polyimide films obtained by making use of the photosensitive resin compositions according to this invention indicated a sufficient adhesivity to the silicon wafer, and at the same time, exhibited no weight reduction, that might be resulted from a thermal decomposition of resin, even if they were heated up to 450° C. The polyimide films obtained by making use of the photosensitive resin compositions according to this invention were found as having a high heat resistance which was comparable to the polyimide films manufactured in a high temperature heating process according to Comparative Example 12 to be illustrated hereinafter.

COMPARATIVE EXAMPLE

In this example, negative photosensitive resin compositions were prepared without employing a photosensitive heat cure accelerating agent, and the patterning was performed under the same conditions as those of previous Examples to investigate the resolution thereof, the results being summarized in the following Table 30 as Comparative Examples 1 to 11.

TABLE 30

| | Polyamic acid | Photo-sensitive heat cure acclerator | Amount added | Film thickness ($\mu$m) | Irradiation dosage (mJ/cm$^2$) | PEB temp. (° C.) | Resolution ($\mu$m) |
|---|---|---|---|---|---|---|---|
| Comparative Example 1 | PAA1 | None | — | 5.0 | 1000 | 135 | X |
| Comparative Example 2 | PAA2 | None | — | 5.1 | 1000 | 130 | X |
| Comparative Example 3 | PAA3 | None | — | 5.0 | 1000 | 130 | X |
| Comparative Example 4 | PAA4 | None | — | 5.0 | 1000 | 135 | X |
| Comparative Example 5 | PAA5 | None | — | 5.1 | 1000 | 130 | X |
| Comparative Example 6 | PAA1 | None | — | 5.0 | 1000 | 140 | X |
| Comparative Example 7 | PAA3 | None | — | 5.0 | 1000 | 135 | X |
| Comparative Example 8 | PAA5 | None | — | 5.1 | 1000 | 135 | X |
| Comparative Example 9 | PAA1 | None | — | 5.0 | 1000 | 150 | X |
| Comparative Example 10 | PAA3 | None | — | 5.0 | 1000 | 150 | X |
| Comparative Example 11 | PAA5 | None | — | 5.1 | 1000 | 150 | X |

Further, photosensitive resin compositions were prepared without employing a photosensitive heat cure accelerating agent. The photosensitive resin compositions were formed into a polyimide film by means of a high temperature heat-curing process (one hour at 150° C.—one hour at 250° C.—one hour at 350° C.) to investigate the adhesivity and heat resistance thereof, the results being summarized as Comparative Examples 12 to 16 in the following Table 31.

TABLE 31

| | Polyamic acid | Photo-sensitive heat cure acclerator | Amount added | Film thickness ($\mu$m) | Irradiation dosage (mJ/cm$^2$) | PEB temp. (° C.) | Cross-cut adhesion test | 3% weight reduction temp. |
|---|---|---|---|---|---|---|---|---|
| Comparative Example 12 | PAA1 | None | — | 5.0 | — | 350 | 0/100 | 505° C. |
| Comparative Example 13 | PAA3 | None | — | 5.0 | — | 350 | 0/100 | 505° C. |
| Comparative Example 14 | PAA5 | None | — | 5.1 | — | 350 | 0/100 | 475° C. |
| Comparative Example 15 | PAA2 | None | — | 5.1 | — | 350 | 0/100 | 485° C. |
| Comparative Example 16 | PAA4 | None | — | 5.1 | — | 350 | 0/100 | 490° C. |

As seen from Table 30, the resin compositions (Comparative Examples 1 to 11) which contained no photosensitive heat cure accelerator were incapable of forming a pattern at all even if a light irradiation with a dosage of 1,000 mJ/cm$^2$ was performed thereon.

On the other hand, as seen from the results shown in Table 31, the polyimide films which were formed using the photosensitive resin compositions of this invention were found as having a high heat resistance which is comparable to the polyimide films of Comparative Examples 12 to 16 which were prepared by means of high temperature heat curing process.

Next, a polyimide film pattern which was obtained by patterning a resin film formed by making use of a negative photosensitive resin composition of this invention was employed for the manufacture of various kinds of electronic parts as shown in FIGS. 1 to 4.

FIG. 1 illustrates a cross-sectional view of a semiconductor device provided with a passivation film which was formed by making use of a photosensitive resin composition of this invention. In this case, the photosensitive resin composition of Example (I-98) was employed for forming a patterned polyimide film to be utilized as a passivation film as explained below.

First of all, the photosensitive resin composition was coated on the surface of a silicon substrate (wafer) bearing thereon a pnp type transistor on which a thermal oxide film and electrodes were formed. The coated layer was prebaked for 10 minutes at a temperature of 90° C. to obtain a resin layer having a film thickness of about 10 μm. Subsequently, the resin layer was exposed through a quartz mask to the irradiation of light at a dosage of 300 mJ/cm$^2$ by making use of a light exposure apparatus (PLA-501FA, Canon Co.).

After this light exposure, the aforementioned silicon substrate was heated for 5 minutes on a hot plate heated up to 130° C., thereby heating the resin layer. Then, the silicon substrate was dipped into an alkaline developing solution (a 2.38 wt % aqueous solution of tetramethylammonium hydroxide) for 60 seconds thereby allowing the unexposed portions of the resin layer to be selectively dissolved and removed. Thereafter, the resin layer was rinsed with water for 20 seconds. Finally, the pattern thus obtained was heat-treated for 60 minutes on the hot plate heated to 300° C., thereby obtaining a polyimide film pattern.

Referring to FIG. 1, a bonding pad 12 is formed on an LSI chip 11 mounted on a tab 13, and a passivation film 15 consisting of a patterned polyimide film is superimposed thereon. The bonding pad 12 formed on the LSI chip 11 is connected via a bonding wire 16 to a lead frame 17. Furthermore, these members are entirely encapsulated with a sealing agent 18.

When a passivation film 15 consisting of a patterned polyimide film formed from a photosensitive resin composition of this invention is employed in the manufacture of a semiconductor element, it is possible to obtain a semiconductor element which is excellent in reliability while substantially preventing any defective product from being produced in the manufacturing steps. Moreover, since the conventional PEP step can be dispensed with, the manufacturing process would be simplified without giving rise to any problem involving safety, etc.

Figure 2:
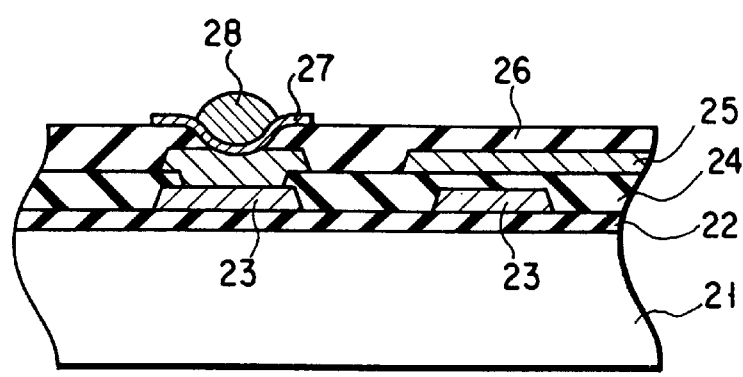
FIG. 2 is a cross-sectional view of a multi-chip module provided with an interlayer insulating film which has been obtained by patterning a film formed of a photosensitive resin composition according to this invention.

FIG. 2 illustrates a cross-sectional view showing a portion of a multi-chip module provided with an interlayer insulation film which was formed making use of a resin composition of this invention. In this case, a polyimide film which was formed by making use of the photosensitive resin composition of Example (I-126) and patterned in the same manner as mentioned above was utilized as the interlayer insulation film.

Referring to FIG. 2, a thermal oxide film 22 is formed on the surface of a silicon substrate (wafer) 21. On this thermal oxide film 22, a copper wiring 23, an interlayer insulation film 24 consisting of a polyimide film, another copper wiring 25 and another interlayer insulation film 26 consisting of a polyimide film are successively superimposed. Furthermore, a contact hole is formed at a portion of the upper interlayer insulation film 26. A Pb/Sn electrode 27 connected to the copper wiring 23 and BLM (Ball Limiting Metallization) 28 are also formed.

Since the interlayer insulation film 24 is formed through a curing of a spin-coated layer of a solution comprising a polyamic acid, the step portions to be formed due to the presence of the copper wiring can be greatly minimized, thus making it possible to flatten the surface of the device and to obtain a highly reliable wiring structure.

Figure 3:
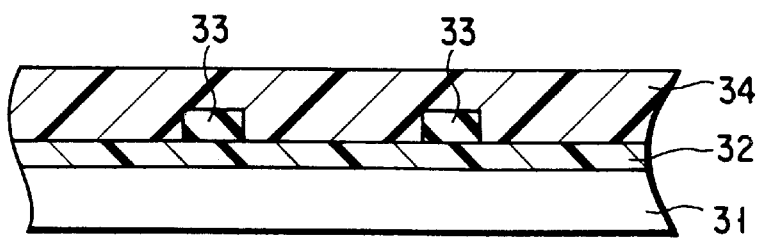
FIG. 3 is a cross-sectional view of an optical waveguide provided with a polymer core layer which has been obtained by patterning a film formed of a photosensitive resin composition according to this invention.

FIG. 3 illustrates a cross-sectional view showing a embedded optical waveguide provided with a core layer which was formed making use of a photosensitive resin composition of this invention. In this case, a polyimide film which was formed by making use of the photosensitive resin composition of Example (II-13) and patterned in the same manner as mentioned above was utilized as an interlayer insulation film.

Referring to FIG. 3, a lower clad layer 32 consisting of a heat-cured PAA1 film is formed on the surface of a silicon substrate (wafer) 31. On this lower clad layer 32, a core layer 33 and an upper clad layer 34 consisting of a heat-cured PAA1 film are successively superimposed.

Since the core layer 33 can be formed easily and precisely by making use of a photosensitive resin composition of this invention, the conventional PEP step can be dispensed with, so that the productivity of the device can be greatly improved.

Figure 4:
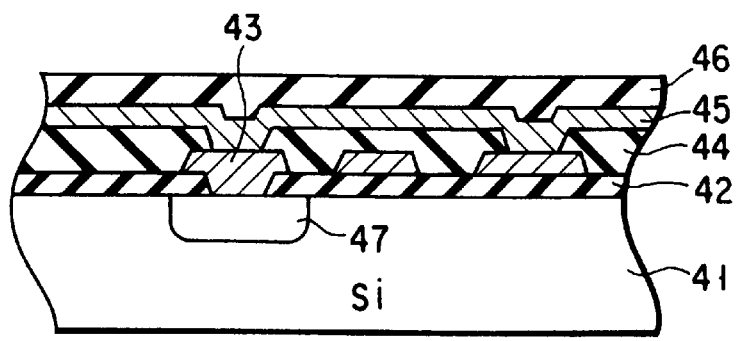
FIG. 4 is a cross-sectional view of a semiconductor element having a multilayered wiring structure comprising an interlayer insulating film which has been obtained by patterning a film formed of a photosensitive composition according to this invention.

FIG. 4 illustrates a cross-sectional view showing a semiconductor element having a multilayered wiring structure provided with an interlayer insulation film which was formed making use of a resin composition of this invention. In this case, a polyimide film which was formed by making use of the photosensitive resin composition of Example (I-14) and patterned in the same manner as mentioned above was utilized as the interlayer insulation film.

Referring to FIG. 4, a thermal oxide film 42 is formed on the surface of a silicon substrate (wafer) 41 bearing thereon an element region 47. A contact hole is formed at a portion of this thermal oxide film 42, and a first Al wiring 43 is formed over the contact hole. An interlayer insulation film 44 consisting of a polyimide film is superimposed on this first Al wiring 43. Furthermore, another contact hole is formed at a portion of the interlayer insulation film 44, and a second Al wiring 45 connected to the first Al wiring 43 is formed over the latter contact hole. On this second Al wiring 45 is further superimposed another interlayer insulation film 46.

Since the interlayer insulation film 44 is formed through a curing of a spin-coated layer of a solution comprising a polyamic acid, the step portions to be formed on the surface of substrate can be greatly minimized, thus making it possible to form multi-layered Al wirings while maintaining the flatness of the surface of the device and to obtain a highly reliable wiring structure.

As explained above, since the photosensitive resin composition of this invention is mixed therein with a specific kind of photosensitive heat cure accelerator, it is possible, with the employment of this photosensitive resin composition, to form a fine pattern without requiring the employment of a photoresist. Furthermore, since it is possible to perform the developing process of this photosensitive resin composition by employing an aqueous alkaline solution, it is possible to obtain a polymer film pattern excellent in adhesion to a substrate while obviating any problems involving safety, sanitation and environmental pollution.

It is also possible, with the employment of this photosensitive resin composition, to provide a highly reliable electronic parts wherein a polymer film pattern excellent in resolution, adhesion and heat resistance is utilized as an insulating member, a protecting film member, a liquid crystal member or an optical waveguide member.

Therefore, the patterned polyimide film of this invention can be used as a wiring insulating film for an LSI, as a humidity resistant protecting film for an LSI, as an α-ray shielding film for an LSI, as a passivation film for a semiconductor device, as a wiring insulating film for a multi-chip module, as a wiring insulating film for a thin film magnetic head, as a wiring insulating film for a magnetic bubble memory, or as an optical material for forming an optical waveguide of an optical device or as an olienting film of a liquid crystal display device.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A negative photosensitive resin composition, which comprises;
    a thermosetting polymer precursor which can be cured through cyclodehydration upon heating; and
    a photosensitive heat cure accelerator comprising a compound having a protective substituent group which can be eliminated upon irradiation with light, wherein after irradiation with light the photosensitive heat cure accelerator accelerates the cyclodehydration of the thermosetting polymer precursor upon heating the negative photosensitive resin composition.

2. The negative photosensitive resin composition according to claim 1, wherein said photosensitive heat cure accelerator comprising a compound having a protective substituent group which can be eliminated upon irradiation of light is at least one kind of compound selected from the group consisting of the following compounds (aa1), (aa2), (aa3) and (aa4):

(aa1), a compound represented by the following general formula (1);

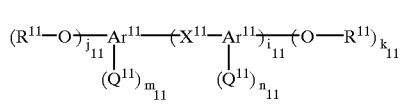

wherein $Ar^{11}$s may be the same or different and are individually a substituted or unsubstituted aromatic hydrocarbon group or a substituted or unsubstituted aromatic hetrocyclic group; $X^{11}$s may be the same or different and are individually a bivalent organic group or a single bond; $Q^{11}$ is hydroxyl group, carboxyl group, carboxyalkyl group, sulfo group, sulfoalkyl group, substituted or unsubstituted amino group, substituted or unsubstituted aminoalkyl group or mercapto group; $R^{11}$s may be the same or different and are individually a protective substituent group which can be eliminated upon irradiation of light; $i_{11}$ is an integer of 0 to 4; $j_{11}$ is an integer of 1 to 5; $k_{11}$ is an integer of 0 to 5; $m_{11}$ and $n_{11}$ are respectively an integer of 0 to 4; and a total of $j_{11}$, $k_{11}$, $m_{11}$ and $n_{11}$ is 2 or more;

(aa2), a nitrogen-containing hetrocyclic ketone compound having a protective substituent group which can be eliminated upon irradiation of light and substitutes for at least one cyclic imino group (>N—H);

(aa3), a nitrogen-containing heterocyclic compound represented by the following general formula (2);

wherein $Ar^{21}$ is a substituted or unsubstituted nitrogen-containing aromatic heterocyclic group having a pyridine type nucleus nitrogen atom; $R^{21}$s may be the same or different and are individually a protective substituent group which can be eliminated upon irradiation of light; $n_{21}$ is an integer of 1 to 5; and (aa4), a nitrogen-containing heterocyclic compound having a protective substituent group which can be eliminated upon irradiation of light and substitutes for at least one N-hydroxyl group (>N—OH) of an N-hydroxyl nitrogen-containing heterocyclic ketone compound.

3. The negative photosensitive resin composition according to claim 1, wherein said thermosetting polymer precursor which can be cured through cyclodehydration upon heating is a polyamic acid.

4. A negative photosensitive resin composition, which comprises;
    a thermosetting polymer precursor which can be cured through cyclodehydration upon heating; and
    a photosensitive heat cure accelerator comprising an N-oxide compound which is capable of exhibiting a heat cure accelerating property through a transition of an oxide group thereof upon irradiation with light, wherein after irradiation with light the photosensitive heat cure accelerator accelerates the cyclodehydration of the thermosetting polymer precursor upon heating the negative photosensitive resin composition.

5. The negative photosensitive resin composition according to claim 4, wherein said photosensitive heat cure accelerator comprising an N-oxide compound which is capable of exhibiting a heat cure accelerating property through a transition of an oxide group thereof upon irradiation of light is at least one kind of N-oxide compound selected from the group consisting of the following compounds (PS1) and (PS2):

(PS1), an N-oxide compound of a substituted or unsubstituted nitrogen-containing aromatic heterocyclic compound having a pyridine type nucleus nitrogen atom (=N—); and (PS2), an N-oxide compound represented by the following general formula (3);

(3)

wherein Ar³¹ is a cyclic group selected from the group consisting of pyridine ring, quinoline ring, isoquinoline ring, pyridazine ring, phthalazine ring, cinnoline ring, pyrimidine ring, quinazoline ring, pyrazine ring, quinoxaline ring, 1,3,5-triazine ring, 1,2,4,5-tetrazine ring, pyrazole ring, indazole ring, oxazole ring, benzoxazole ring, thiazole ring, benzothiazole ring, 1,2,3-triazole ring, 1,2,4-triazole ring, benzotriazole ring, 1,2,3,5-tetrazole ring and julolidine ring; or a group which is substituted by at least one group selected from hydroxyl, mercapto, substituted or unsubstituted amino, and substituted or unsubstituted aminoalkyl, said group being selected from the group consisting of benzene ring, naphthalene ring, anthracene ring, phenanthrene ring, biphenyl ring, pyrrole ring, indole ring, isoindole ring, carbazole ring, furan ring, coumarone ring, isobenzofuran ring, thiophene ring, benzothiophene ring, dibenzothiophene ring, oxazine ring, benzoxazine ring, phenoxazine ring, thiazine ring, benzothiazine ring, phenothiazine ring, oxadiazine ring, thiadiazine ring, benzodioxole ring, benzodioxane ring, pyrane ring, chromene ring, xanthene ring, chroman ring and isochroman ring; and R³¹ is a aliphatic hydrocarbond group, an alicyclic hydrocarbon group, an aromatic hydrocarbon group or a heterocyclic group, each being substituted or unsubstituted group and having 1 to 30 carbon atoms.

6. The negative photosensitive resin composition according to claim 4, wherein said thermosetting polymer precursor which can be cured through cyclodehydration upon heating is a polyamic acid.

7. A negative photosensitive resin composition, which comprises;

a thermosetting polymer precursor which can be cured through cyclodehydration upon heating; and a photosensitive heat cure accelerator comprising a compound which is capable of exhibiting a heat cure accelerating property through generation of an acid upon irradiation with light, wherein after irradiation with light the photosensitive heat cure accelerator accelerates the cyclodehydration of the thermosetting polymer precursor upon heating the negative photosensitive resin composition.

8. The negative photosensitive resin composition according to claim 7, wherein said compound which is capable of exhibiting a heat cure accelerating property through generation of an acid upon irradiation of light is at least one kind of compound selected from the group consisting of a diazonium salt represented by the following general formula (4), an iodonium salt represented by the following general formula (5), a sulfonium salt represented by the following general formula (6), a phosphonium salt represented by the following general formula (7), a selenonium salt represented by the following general formula (8), a sulfonic ester represented by the following general formula (9), a sulfone compound represented by the following general formula (10) and an organic halogen compound represented by the following general formula (11):

(4)

(5)

(6)

(7)

(8)

(9)

(10)

(11)

wherein R⁴¹ to R⁵⁰ represent individually an aliphatic hydrocarbon group, an alicyclic hydrocarbon group, an aromatic hydrocarbon group, a heterocyclic ring group, or a compound group wherein an aliphatic hydrocarbon group, an alicyclic hydrocarbon group, an aromatic hydrocarbon group or a heterocyclic group is mutually linked to each other directly or via a crosslinking group, each group being substituted or unsubstituted group;

Ar⁴¹ to Ar⁴⁶ represent individually an aromatic hydrocarbon group, a heterocyclic ring group, or a compound group wherein an aromatic hydrocarbon group or a heterocyclic group is mutually linked to each other directly or via a crosslinking group, each group being substituted or unsubstituted group;

X⁴¹⁻ to X⁴⁵⁻ represent individually Lewis acid counter anion;

Y⁴¹ and Y⁴² represent individually an aliphatic hydrocarbon group, an alicyclic hydrocarbon group, an aromatic hydrocarbon group, a heterocyclic ring group, imino group or a compound group wherein an aliphatic hydrocarbon group, an alicyclic hydrocarbon group, an aromatic hydrocarbon group or a heterocyclic group is mutually linked to each other directly or via a crosslinking group, each group being substituted or unsubstituted group;

Y⁴³ is methylene group, ethylidene group, propylidene group, diazomethylene group, and a single bond;

$Z^{41}$ is polychloroalkyl group or polybromoalkyl group; and $n_{41}$ is 0 or 1

$n_{42}$ is an integer of 1 to 10.

9. The negative photosensitive resin composition according to claim 7, wherein said thermosetting polymer precursor which can be cured through cyclodehydration upon heating is a polyamic acid.

10. A negative photosensitive resin composition, which comprises;

a thermosetting polymer precursor which can be cured through cyclodehydration upon heating;

a latent heat cure accelerator which is capable of changing into a compound exhibiting a heat cure accelerating property through a reaction with an acid; and a photo-acid generating agent which is capable of generating an acid upon irradiation of light, wherein the compound formed by the reaction of the latent heat cure accelerator and the photo-generated acid accelerates the cyclodehydration of the thermosetting polymer precursor upon heating the negative photosensitive resin composition.

11. The negative photosensitive resin composition according to claim 10, wherein said latent heat cure accelerator which is capable of changing into a compound exhibiting a heat cure accelerating property through a reaction with an acid is at least one kind of compound selected from the group consisting of the following compounds (LCA1), (LCA2), (LCA3) and (LCA4):

(LCA1), a compound represented by the following general formula (12);

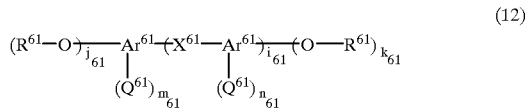

(12)

wherein $Ar^{61}$s may be the same or different and are individually a substituted or unsubstituted aromatic hydrocarbon group or a substituted or unsubstituted aromatic hetrocyclic group; $X^{61}$s may be the same or different and are individually a bivalent organic group or a single bond; $Q^{61}$ is hydroxyl group, carboxyl group, carboxyalkyl group, sulfo group, sulfoalkyl group, substituted or unsubstituted amino group, substituted or unsubstituted aminoalkyl group or mercapto group; $R^{61}$s may be the same or different and are individually a protective substituent group which can be eliminated by an acid; $i_{61}$ is an integer of 0 to 4; $j_{61}$ is an integer of 1 to 5; $k_{61}$ is an integer of 0 to 5; $m_{61}$ and $n_{61}$ are respectively an integer of 0 to 4; and a total of $j_{61}$, $k_{61}$, $m_{61}$ and $n_{61}$ is 2 or more;

(LCA2), a nitrogen-containing heterocyclic compound represented by the following general formula (13);

(13)

wherein $Ar^{62}$ is a substituted or unsubstituted nitrogen-containing aromatic heterocyclic group having a pyridine type nucleus nitrogen atom; $R^{62}$s may be the same or different and are individually a protective substituent group which can be eliminated by an acid; $n_{62}$ is an integer of 1 to 5;

(LCA3), a nitrogen-containing hetrocyclic ketone compound having a protective substituent group which can be eliminated by an acid and substitutes for at least one cyclic imino group (>N—H); and (LCA4), a nitrogen-containing hetrocyclic compound having a protective substituent group which can be eliminated by an acid and substitutes for at least one N-hydroxyl group (>N—OH) of an N-hydroxyl nitrogen-containing heterocyclic ketone compound.

12. The negative photosensitive resin composition according to claim 10, wherein said thermosetting polymer precursor which can be cured through cyclodehydration upon heating is a polyamic acid.

13. The negative photosensitive resin composition according to claim 10, wherein said photo-acid generating agent capable of generating an acid upon irradiation of light is at least one kind of compound which is capable of generating a Lewis acid upon irradiation of light and selected from the group consisting of a diazonium salt compound, an iodonium salt compound, a sulfonium salt compound, a phosphonium salt compound, a selenonium salt compound, a sulfonic ester, a sulfone compound, and an organic halogen compound having a polychloroalkyl or polybromoalkyl group.

14. The negative photosensitive resin composition according to claim 10, wherein said photo-acid generating agent which is capable of generating an acid upon irradiation of light is at least one kind of compound selected from the group consisting of the following compounds (PAC1), (PAC2), (PAC3) and (PAC4):

(PAC1), a compound represented by the following general formula (14);

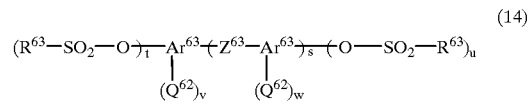

(14)

wherein $Ar^{63}$s may be the same or different and are individually a substituted or unsubstituted aromatic hydrocarbon group or a substituted or unsubstituted aromatic hetrocyclic group; $Z^{63}$s may be the same or different and are individually a bivalent organic group or a single bond; $Q^{62}$s may be the same or different and are individually hydroxyl group, carboxyl group, carboxyalkyl group, sulfo group, sulfoalkyl group, substituted or unsubstituted amino group, substituted or unsubstituted aminoalkyl group or mercapto group; $R^{63}$s may be the same or different and are individually a substituted or unsubstituted aliphatic hydrocarbon group, a substituted or unsubstituted alicyclic hydrocarbon group, a substituted or unsubstituted aromatic hydrocarbon group, or a substituted or unsubstituted heterocyclic group; s is an integer of 0 to 4; t is an integer of 1 to 5; u is an integer of 0 to 5; v and w are an integer of 0 to 4; a total of v and w is 2 or less; and a total of t, u, v and w is 2 or more;

(PAC2), a nitrogen-containing heterocyclic compound represented by the following general formula (15);

(15)

wherein $Ar^{64}$ is a substituted or unsubstituted nitrogen-containing aromatic heterocyclic ring having a pyridine type nucleus nitrogen atom (=N—); $R^{64}$'s may be the same or different and are individually a substituted or unsubstituted aliphatic hydrocarbon group, alicyclic hydrocarbon group, aromatic hydrocarbon group or aromatic hetrocyclic group; and y is an integer of 1 to 5;

(PAC3), a sulfonic amide compound wherein the hydrogen atom of at least one cyclic imino group (>NH) thereof is substituted by sulfonyl group; and (PAC4), a sulfonic ester compound wherein the hydrogen atom of at least one N-hydroxyl group (>N—OH) of an N-hydroxyl nitrogen-containing heterocyclic ketone compound is substituted by sulfonyl group.

15. A method of forming a pattern, which comprises the steps of;

coating a negative photosensitive resin composition comprising a thermosetting polymer precursor which can be cured through cyclodehydration upon heating and a photosensitive heat cure accelerator comprising a compound having a protective substituent group which can be eliminated upon irradiation with light on a surface of a substrate;

forming a resin layer by heat-drying the coated photosensitive resin composition at a temperature of not more than 180° C.;

irradiating light onto a predetermined region of said resin layer;

heat-treating said resin layer during or after the light-irradiating step at a temperature ranging from 50 to 200° C.; and developing the heat-treated resin layer by dissolving and removing portions of said resin layer which are not subjected to the light-irradiation by making use of a developing solution wherein after irradiation with light the photosensitive heat cure accelerator accelerates the cyclodehydration of the thermosetting polymer precursor upon heating the negative photosensitive resin composition.

* * * * *